(12) United States Patent
Finn et al.

(10) Patent No.: US 9,390,364 B2
(45) Date of Patent: Jul. 12, 2016

(54) TRANSPONDER CHIP MODULE WITH COUPLING FRAME ON A COMMON SUBSTRATE FOR SECURE AND NON-SECURE SMARTCARDS AND TAGS

(71) Applicants: David Finn, Tourmakeady (IE); Mustafa Lotya, Celbridge (IE); Darren Molloy, Galway (IE)

(72) Inventors: David Finn, Tourmakeady (IE); Mustafa Lotya, Celbridge (IE); Darren Molloy, Galway (IE)

(73) Assignee: Féinics AmaTech Teoranta, Lower Churchfield, Tourmakeady, Co. Mayo (IE)

( * ) Notice: Subject to any disclaimer, the term of this patent is extended or adjusted under 35 U.S.C. 154(b) by 41 days.

(21) Appl. No.: 14/551,376

(22) Filed: Nov. 24, 2014

(65) Prior Publication Data

US 2015/0136858 A1     May 21, 2015

Related U.S. Application Data

(63) Continuation-in-part of application No. 14/523,993, filed on Oct. 27, 2014, and a continuation-in-part of application No. 14/492,113, filed on Sep. 22, 2014, now abandoned, and a continuation-in-part of (Continued)

(51) Int. Cl.
*G06K 19/077*    (2006.01)
*H01Q 1/22*    (2006.01)
(Continued)

(52) U.S. Cl.
CPC ........ *G06K 19/07754* (2013.01); *B23K 26/362* (2013.01); *B23K 26/40* (2013.01);
(Continued)

(58) Field of Classification Search
CPC .................... G06K 19/07769; G06K 19/07794
USPC ....................................................... 235/492
See application file for complete search history.

(56) References Cited

U.S. PATENT DOCUMENTS

| 5,673,179 A | 9/1997 | Horejs |
| 6,018,299 A | 1/2000 | Eberhardt |

(Continued)

FOREIGN PATENT DOCUMENTS

| CA | 2279176 | 7/1998 |
| DE | 39 35 364 | 8/1990 |

(Continued)

OTHER PUBLICATIONS

S. L. Chen, S. K. Kuo, and C. T. Lin, A metallic RFID tag design for steel-bar and wire-rod management application in the steel industry Prog. Electromag. Research, vol. 91, pp. 195-212, 2009.

(Continued)

*Primary Examiner* — Toan Ly
(74) *Attorney, Agent, or Firm* — Gerald E. Linden

(57) ABSTRACT

A capacitive coupling enhanced (CCE) transponder chip module (TCM) comprises an RFID chip (CM, IC), optionally contact pads (CP), a module antenna (MA), and a coupling frame (CF), all on a common substrate or module tape (MT). The coupling frame (CF, 320A) may be in the form of a ring, having an inner edge (IE), an outer edge IE, 324) and a central opening (OP), disposed closely adjacent to and surrounding the module antenna (MA). A slit (S) may extend from the inner edge (IE) to the outer edge (OE) of the coupling frame (CF) so that the coupling frame (CF) is "open loop". An RFID device may comprise a transponder chip module (TCM) having a module antenna (MA), a device substrate (DS), and an antenna structure (AS) disposed on the device substrate (DS) and connected with the module antenna (MA). A portion of a conductive layer (CL, 904) remaining after etching a module antenna (MA) may be segmented to have several smaller isolated conductive structures.

16 Claims, 20 Drawing Sheets

Related U.S. Application Data application No. 14/465,815, filed on Aug. 21, 2014, and a continuation-in-part of application No. 14/281,876, filed on May 19, 2014, now Pat. No. 9,272,370, and a continuation-in-part of application No. 14/225,570, filed on Mar. 26, 2014, now Pat. No. 9,251,458, and a continuation-in-part of application No. 14/078,527, filed on Nov. 13, 2013, now Pat. No. 9,112,272, and a continuation-in-part of application No. 14/020,884, filed on Sep. 8, 2013, now Pat. No. 9,033,250, and a continuation-in-part of application No. 13/600,140, filed on Aug. 30, 2012, now Pat. No. 8,991,712, and a continuation-in-part of application No. 14/259,187, filed on Apr. 23, 2014, now Pat. No. 9,239,982, which is a continuation of application No. 13/931,828, filed on Jun. 29, 2013, now Pat. No. 8,708,240, which is a continuation of application No. 13/205,600, filed on Aug. 8, 2011, now Pat. No. 8,474,726, application No. 14/551,376, which is a continuation-in-part of application No. 13/730,811, filed on Dec. 28, 2012, now Pat. No. 9,165,240, which is a continuation-in-part of application No. 13/310,718, filed on Dec. 3, 2011, now Pat. No. 8,366,009.

(60) Provisional application No. 62/080,332, filed on Nov. 16, 2014, provisional application No. 62/069,544, filed on Oct. 28, 2014, provisional application No. 62/061,689, filed on Oct. 8, 2014, provisional application No. 62/048,373, filed on Sep. 10, 2014, provisional application No. 62/044,394, filed on Sep. 1, 2014, provisional application No. 62/039,562, filed on Aug. 20, 2014.

(51) Int. Cl.
*H01Q 1/38* (2006.01)
*H01Q 7/00* (2006.01)
*B23K 26/36* (2014.01)
*B23K 26/40* (2014.01)

(52) U.S. Cl.
CPC .... *G06K19/07747* (2013.01); *G06K 19/07794* (2013.01); *H01Q 1/2225* (2013.01); *H01Q 1/38* (2013.01); *H01Q 7/00* (2013.01); *B23K 2201/40* (2013.01); *B23K 2203/50* (2015.10); *G06K 19/07722* (2013.01); *H01L 2224/05554* (2013.01); *H01L 2224/48091* (2013.01); *H01L 2224/48227* (2013.01)

(56) References Cited

U.S. PATENT DOCUMENTS

| | | | |
|---|---|---|---|
| 6,088,230 | A | 7/2000 | Finn et al. |
| 6,107,920 | A | 8/2000 | Eberhardt et al. |
| 6,147,605 | A | 11/2000 | Vega et al. |
| 6,233,818 | B1 | 5/2001 | Finn et al. |
| 6,265,977 | B1 | 7/2001 | Vega et al. |
| 6,378,774 | B1 | 4/2002 | Emori et al. |
| 6,611,199 | B1 | 8/2003 | Geizler et al. |
| 6,698,089 | B2 | 3/2004 | Finn et al. |
| 7,494,057 | B2 | 2/2009 | Lasch et al. |
| 7,530,491 | B2 | 5/2009 | Lasch et al. |
| 7,588,184 | B2 | 9/2009 | Gandel et al. |
| 7,757,957 | B2 | 7/2010 | Cranston et al. |
| 7,819,310 | B2 | 10/2010 | Lasch et al. |
| 7,823,777 | B2 | 11/2010 | Varga et al. |
| 8,033,457 | B2 | 10/2011 | Varga et al. |
| 8,079,514 | B2 | 12/2011 | Lasch et al. |
| 8,100,337 | B2 | 1/2012 | Artigue et al. |
| 8,186,582 | B2 | 5/2012 | Varga et al. |
| 8,261,997 | B2 | 9/2012 | Gebhart |
| 8,366,009 | B2 | 2/2013 | Finn et al. |
| 8,393,547 | B2 | 3/2013 | Kiekhaefer |
| 8,474,726 | B2 | 7/2013 | Finn |
| 8,523,062 | B2 | 9/2013 | Varga et al. |
| 8,608,082 | B2 | 12/2013 | Le Garrec et al. |
| 8,789,762 | B2 | 7/2014 | Finn et al. |
| 8,991,712 | B2 | 3/2015 | Finn et al. |
| 9,033,250 | B2 | 5/2015 | Finn et al. |
| 9,112,272 | B2 | 8/2015 | Finn et al. |
| 2002/0020903 | A1 | 2/2002 | Kreft et al. |
| 2005/0093678 | A1 | 5/2005 | Forster |
| 2008/0283615 | A1 | 11/2008 | Finn |
| 2008/0308641 | A1 | 12/2008 | Finn |
| 2008/0314990 | A1 | 12/2008 | Rietzler |
| 2009/0057414 | A1 | 3/2009 | Brunet et al. |
| 2009/0159657 | A1 | 6/2009 | Chen et al. |
| 2010/0176205 | A1 | 7/2010 | Patrice |
| 2010/0283690 | A1 | 11/2010 | Artigue et al. |
| 2011/0090058 | A1* | 4/2011 | Ikemoto ............ H01Q 5/35 340/10.1 |
| 2011/0163167 | A1 | 7/2011 | Artigue et al. |
| 2011/0181486 | A1* | 7/2011 | Kato ............ H01Q 7/06 343/850 |
| 2011/0186641 | A1 | 8/2011 | Kato et al. |
| 2012/0018522 | A1* | 1/2012 | Le Garrec ........ G06K 19/07749 235/492 |
| 2012/0038445 | A1 | 2/2012 | Finn |
| 2013/0075477 | A1 | 3/2013 | Finn et al. |
| 2013/0140370 | A1 | 6/2013 | Finn et al. |
| 2013/0146670 | A1 | 6/2013 | Grieshofer |
| 2014/0091149 | A1 | 4/2014 | Finn et al. |
| 2014/0284386 | A1 | 9/2014 | Finn et al. |
| 2014/0361086 | A1 | 12/2014 | Finn et al. |

FOREIGN PATENT DOCUMENTS

| | | |
|---|---|---|
| DE | 43 11 493 | 4/2000 |
| EP | 1 158 601 | 11/2001 |
| NL | 9100347 | 3/1992 |
| WO | WO2008081224 | 7/2008 |

OTHER PUBLICATIONS

D. Ciudad, P. C. Arribas, P. Sanchez, and C. Aroca, RFID in metal environments: An overview on low (LF) and ultra-low (ULF) frequency systems, in Radio Frequency Identification Fundamentals and Applications Design Methods and Solutions, Cristina Turcu (Ed.), ch.11, pp. 181-196, InTech, Rijeka, Croatia, 2010.
X. Qing and Z. N. Chen, Proximity Effects of Metallic Environments on High Frequency RFID Reader Antenna: Study and Applications, IEEE Trans. Antennas Propag., vol. 55, No. 11, pp. 3105-3111, Nov. 2007.
S. Mukherjee, Mitigation of proximity to metal for magnetically coupled transponders by use of resonant loop, 2014 IEEE Int. Conf. on RFID, Orlando, FL, 2014, pp. 8-14.
Slot Antennas, © antenna-theory.com 2010.

* cited by examiner

Dual Interface (DI) Smart Card, and Readers

ISO 7816

8-pad contact pattern insertion direction 6-pad contact pattern insertion direction transponder chip module (TCM) with coupling frame (CF)

as shown in FIG. 3A a variation coupling frame (CF) as connection bridge (CBR)

conductive traces (CT) between contact pads (CP)

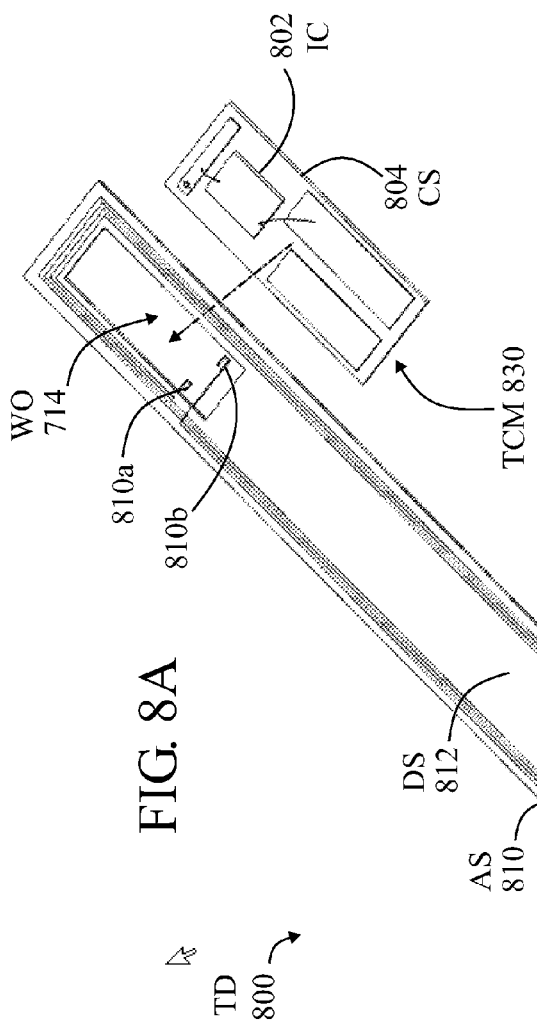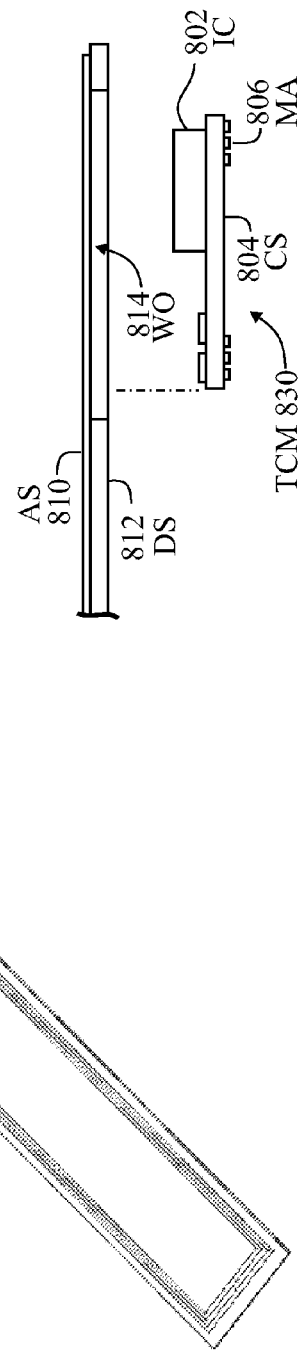
FIG. 8A
FIG. 8B

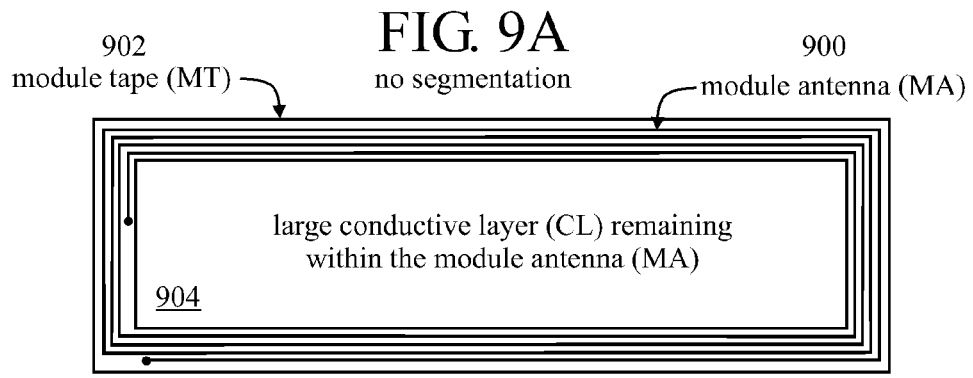
FIG. 9A no segmentation
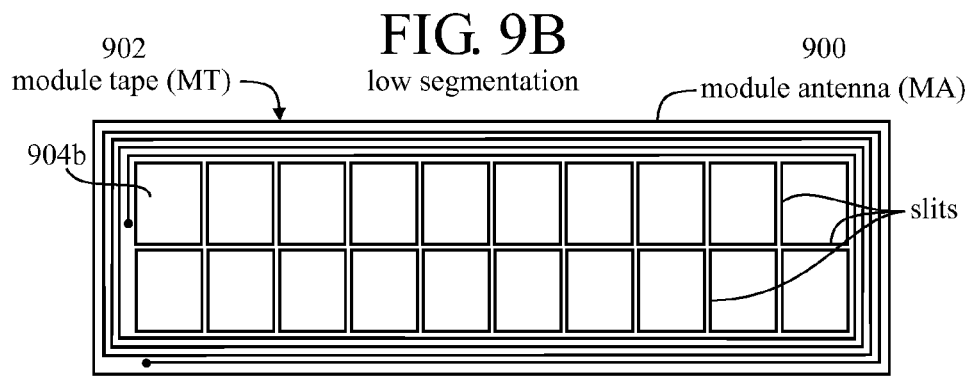
FIG. 9B low segmentation
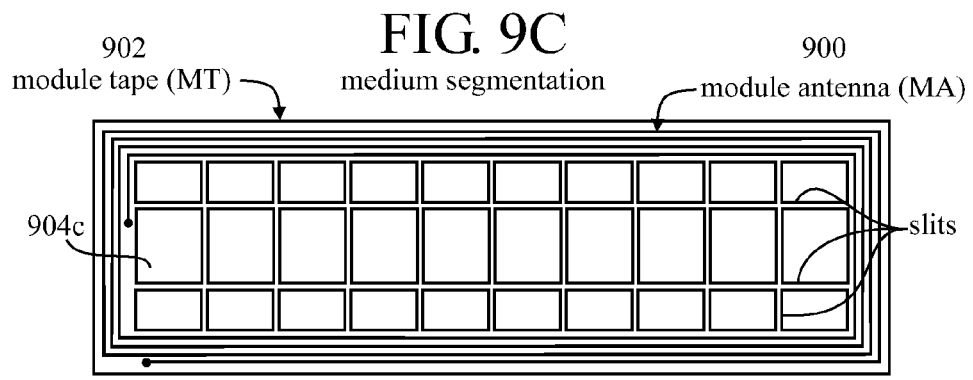
FIG. 9C medium segmentation
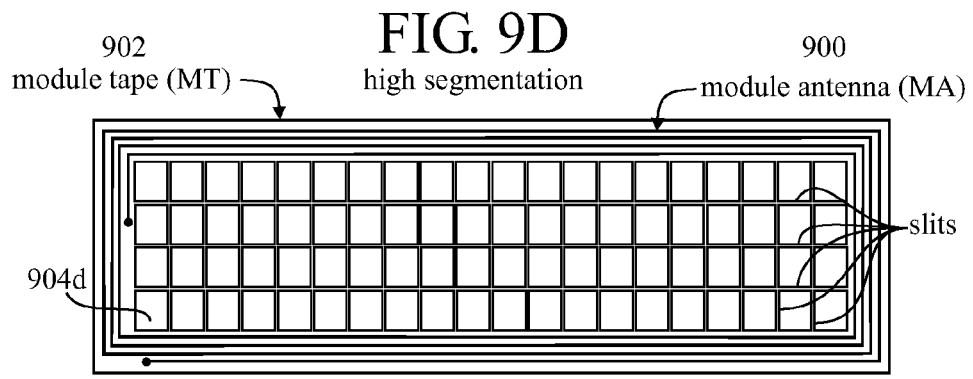
FIG. 9D high segmentation

US 9,390,364 B2

TRANSPONDER CHIP MODULE WITH COUPLING FRAME ON A COMMON SUBSTRATE FOR SECURE AND NON-SECURE SMARTCARDS AND TAGS

CROSS-REFERENCE TO RELATED APPLICATIONS

This application claims priority from and is a continuation-in-part or nonprovisional filing of:
nonprovisional of U.S. 62/080,332 filed 16 Nov. 2014
nonprovisional of U.S. 62/069,544 filed 28 Oct. 2014
continuation-in-part of U.S. Ser. No. 14/523,993 filed 27 Oct. 2014
nonprovisional of U.S. 62/061,689 filed 8 Oct. 2014
continuation-in-part of U.S. Ser. No. 14/492,113 filed 22 Sep. 2014
nonprovisional of U.S. 62/048,373 filed 10 Sep. 2014
nonprovisional of U.S. 62/044,394 filed 1 Sep. 2014
continuation-in-part of U.S. Ser. No. 14/465,815 filed 21 Aug. 2014
nonprovisional of U.S. 62/039,562 filed 20 Aug. 2014
continuation-in-part of U.S. Ser. No. 14/281,876 filed 19 May 2014 (US 20140284386, 25 Sep. 2014)
continuation-in-part of U.S. Ser. No. 14/225,570 filed 26 Mar. 2014 (US 20140209691, 31 Jul. 2014)
continuation-in-part of U.S. Ser. No. 14/078,527 filed 13 Nov. 2013 (US 20140104133, 17 Apr. 2014)
continuation-in-part of U.S. Ser. No. 14/020,884 filed 8 Sep. 2013 (US 20140091149, 3 Apr. 2014)
continuation-in-part of U.S. Ser. No. 13/600,140 filed 30 Aug. 2012 (US 20130075477, 28 Mar. 2013)
continuation-in-part of U.S. Ser. No. 14/259,187 filed 23 Apr. 2014 (US20140284387, 25 Sep. 2014) which is a continuation of
  U.S. Ser. No. 13/931,828 filed 29 Jun. 2013 (U.S. Pat. No. 8,708,240, 29 Apr. 2014) which is a continuation of
  U.S. Ser. No. 13/205,600 filed 8 Aug. 2011 (U.S. Pat. No. 8,474,726, 2 Jul. 2013)
continuation-in-part of U.S. Ser. No. 13/730,811 filed 28 Dec. 2012 (US 20140024732, 16 Jan. 2014), which is a continuation-in-part of U.S. Ser. No. 13/310,718 filed 3 Dec. 2011 (U.S. Pat. No. 8,366,009, 5 Feb. 2013)

TECHNICAL FIELD

The disclosure relates to RFID devices including "secure documents" or "RFID tags" such as electronic passports, electronic ID cards and smartcards (or payment cards, electronic tickets, and the like), or chip cards having RFID (radio frequency identification) chips or chip modules (CM) capable of operating in a "contactless" mode (ISO 14443 or NFC/ISO 15693) and, may also be applicable to dual interface (DI) smartcards and secure documents which can also operate in a contact mode (ISO 7816-2). This may include "non-secure smartcards and tags" such as contactless devices in the form of keycards, building access cards, security badges, access control cards, asset tags, event passes, hotel keycards, wearable devices, tokens, small form factor tags, data carriers and the like operating in close proximity with a contactless reader.

BACKGROUND

A dual interface (DI or DIF) smartcard (or smart card; SC) may generally comprise:
  an antenna module (AM) having a module antenna (MA) for contactless operation and contact pads (CP) for contact operation,
  a card body (CB) having layers of plastic or metal, or combinations thereof, and
  a booster antenna (BA) disposed in the card body (or "inlay"). Some examples of smart cards having booster antennas are disclosed in U.S. Ser. No. 14/020,884 filed 8 Sep. 2013 (US 20140091149, 3 Apr. 2014)

The antenna module (AM), which may be referred to as a transponder chip module (TCM) or RFID module may generally comprise:
  a module tape (MT) or chip carrier tape (CCT), more generally, simply a "substrate";
  a contact pad array (CPA) comprising 6 or 8 contact pads (CP, or "ISO pads") disposed on a "face up side" or "contact side" (or surface) of the module tape (MT), for interfacing with a contact reader in a contact mode (ISO 7816);
  an RFID chip (CM, IC) which may be a bare, unpackaged silicon die or a chip module (a die with leadframe, interposer, carrier or the like) disposed on a "face down side" or "bond side" or "chip side" (or surface) of the module tape (MT);
  a module antenna (MA) or antenna structure (AS) disposed on the face down side of the module tape (MT) for implementing a contactless interface, such as ISO 14443 and NFC/ISO 15693 with a contactless reader or other RFID device.

An antenna modules (AM) which may be able to operate without a booster antenna (BA) in the card body (CB) may be referred to as transponder chip modules (TCM), or as a transponder IC module.

The antenna module (AM) or transponder chip module (TCM) may be generally rectangular, having four sides, and measuring approximately 8.2 mm×10.8 mm for a 6-contact module and 11.8 mm×13.0 mm for an 8-contact module. Alternatively, the transponder chip module (TCM) may be round, elliptical, or other non-rectangular shape. When operating in a contactless mode, the antenna module (AM) or transponder chip module (TCM) may be powered by RF from an external RFID reader, and may also communicate by RF with the external RFID reader.

A module antenna (MA) may be disposed on the module tape (MT) for implementing a contactless interface, such as ISO 14443 and NFC/ISO 15693. Contact pads (CP) may be disposed on the module tape (MT) for implementing a contact interface, such as ISO 7816. The contact pads (CP) may or may not be perforated. The module tape (MT) may comprise a pattern of interconnects (conductive traces and pads) to which the RFID chip (CM, IC) and contact pads (CP) may be connected. The module tape (MT) may be "single-sided", having a conductive layer (or cladding, or foil) on only one side thereof, such as the "face-up" side thereof, such as for the contact pads (CP). The module tape (MT) may be "double-sided", having conductive layers (or claddings, or foils) on both sides thereof. A conductive layer on the "face-down" side of the module tape (MT) may be etched to form a module antenna (MA) having a number of tracks (traces) separated by spaces.

The module antenna (MA) may be wire-wound, or etched, for example:
  The module antenna (MA) may comprise several turns of wire, such as 50 μm diameter insulated wire. Reference may be made to U.S. Pat. No. 6,378,774 (2002, Toppan), for example FIGS. 12A, B thereof.
  The module antenna (MA) may be a chemically-etched planar antenna (PA) structure. Reference may be made to U.S. Pat. No. 8,100,337 (2012, SPS), for example FIG. 3 thereof.
  The module antenna (MA) may comprise a laser-etched planar antenna (PA) structure (LES). Reference may be made to U.S. Ser. No. 14/281,876 filed 19 May 2014 (US 20140284386, 25 Sep. 2014), incorporated by reference herein.

A planar antenna (PA) structure, or simply "planar antenna (PA)", whether chemically-etched (CES) or laser-etched (LES) may comprise a long conductive trace or track having two ends, in the form of a planar spiral encircling the RFID chip on the face-down side of the module tape. This will result in a number of tracks (actually, one long spiraling track), separated by spaces. The track width may be approximately 100 µm. Generally, with laser etching, the track width and the spacing between tracks can be made smaller than with chemical etching, and the tracks themselves can be made narrower than with chemical etching.

The (two) ends of the module antenna (MA) may be connected, either directly or indirectly to corresponding terminals (LA, LB) of the RFID chip (IC, CM). For example, one or both ends of the module antenna (MA) may be connected to bond pads or interconnect traces on the face-down side of the module tape (MT), to which the terminals of the RFID chip (IC, CM) may also be connected.

Alternatively, one or both ends of the module antenna (MA) may be connected via electrically conductive structures, which may be referred to as "contact bridges" or "connection bridges", disposed on the face-up side of the module tape (MT), and which may be formed from the same conductive layer as the contact pads (CP). Some examples of connection bridges may be found in US 20130146670 (2013 Jun. 13, Grieshofer et al; "Infineon")

commonly-owned, copending U.S. Ser. No. 14/523,993 filed 27 Oct. 2014

The antenna (or antenna structure AS) may be laser etched from a copper layer (cladding or foil), which may have a thickness of approximately 18 µm-35 µm, but may be approximately 12 µm, which may be less than the skin depth of copper (18 µm), forming a number of tracks separated by a distance approximately equal to the width of the laser beam, such as approximately 25 µm. Subsequent to laser etching, the antenna structure may be plated, which may reduce the distance between tracks to approximately 20 µm (for example). This may result in increased performance of the antenna structure, and the overall antenna module AM (or transponder chip module (TCM)), and reduce performance constraints on the performance of a booster antenna (BA) in the card body (CB) of the smartcard (SC).

A module antenna (MA) connected to an RFID chip (CM), typically on a substrate or module tape (MT), may be referred to as a "transponder". Generally, such a transponder may be a "passive" transponder which does not have its own power source (e.g., battery), but rather which receives (harvests) its operating power from an external reader (interrogator) rather, for example, from a battery. An "active transponder" may have its own internal power source, such as a battery.

Transponder chip modules (TCM) which are passive transponders may have an "activation distance" which may refer to the distance from an external reader at which the transponder may commence operation (turn on), and may also have a "read/write" distance which may refer to the distance from an external reader at which the transponder may communicate effectively and reliably, in both directions, with the reader.

Activation and read/write distances of at least a few centimeters (cm) are desirable. However, conventional antenna modules (AM) may require a booster antenna (BA) in a card body (CB) to achieve these distances. The transponder chip modules (TCM) disclosed herein may be capable of greater activation and read/write distances, without requiring a booster antenna (BA).

Some terms which may be used herein may include:

"skin depth" relates to the "skin effect" which is the tendency of an alternating electric current (AC) to become distributed within a conductor such that the current density is largest near the surface of the conductor. A "skin depth", or minimum thickness for conducting current may be defined, for a given material at a given frequency. For example, at 13.56 MHz, the skin depth for copper may be approximately 18 µm (17.7047 µm).

"transparency" refers to the ability of electromagnetic radiation to pass through a material. A threshold for non-transparency (or the ability to interact with RF) may be a fraction of the skin depth for the metal layer in question at a given frequency of interest. For example, the non-transparency threshold for copper at 13.56 MHz, may be one-tenth of the skin depth, or approximately 1.7 µm.

SUMMARY

It is a general object of the invention to provide improved techniques for improving coupling of smartcards (as an example of secure documents, and the like) with a contactless reader. This may be of particular interest in the milieu of metallized (or metal) smartcards.

According to the invention, generally, a coupling frame (CF) may be incorporated into an antenna module (AM) or transponder chip module (TCM) on one or both sides of the module tape (MT) or chip carrier tape (CCT) of the transponder chip module (TCM). One or more module antennas (MA) or planar antennas (PA) may be incorporated into the transponder chip module (TCM). The module tape (MT) with module antenna (MA) and coupling frame (CF) may be considered to be an interim product. An RFID chip (CM, IC) may be mounted to an area on a surface of the module tape (MT), and connected to the module antenna (MA).

The coupling frame (CF) may be formed from a conductive metal layer (ML) on a surface of the module tape (MT), which may be the selfsame metal layer (ML) used to form the contact pads (CP) on the face-up surface of the module tape (MT), or which is used to form bond pads and interconnect traces on the face-down side of the module tape (MT).

The coupling frame (CF) may be in the form of a ring (such as a rectangular ring) having an opening (OP) defined by an inner edge (IE) thereof. A slit (S) may extend from the opening (OP) of the coupling frame (CF) to an outer edge (OE) thereof. The coupling fame (CF) may be disposed on a module tape (MT) so that its opening (OP) is disposed "closely adjacent" to and "partially surrounding" a module antenna (MA) of a transponder chip module (TCM).

As used herein, "closely adjacent" may typically mean that the inner edge (IE) of the coupling frame (CF) is separated by only a small gap (such as less than 100 µm) from an outer turn of the module antenna (MA), which may generally be true when the coupling frame (CF) is on the same side of the module tape (MT) as the module antenna (MA), and "substantially coplanar" therewith. However, in some embodiments, the coupling frame (CF) may be on an opposite side of the module tape (MT) from the module antenna (MA), and an inner portion of the coupling frame (CF) may overlap (be above) an outer portion of the module antenna (MA). This latter situation (overlapping) is intended to be included in the definition of "closely adjacent", and in a definition of "substantially coplanar" therewith.

As used herein, "partially surrounding" may typically mean that the inner edge (IE) of the coupling frame (CF)

almost nearly encircles (except for the slit S) the module antenna (MA), which may generally be true when the coupling frame (CF) is on the same side of the module tape (MT) as the module antenna (MA), and substantially coplanar therewith. However, in some embodiments, the coupling frame (CF) may be on an opposite side of the module tape (MT) from the module antenna (MA), with an inner portion of the coupling frame (CF) overlapping (disposed above) an outer portion of the module antenna (MA), or even the entire module antenna (MA). This latter situation (overlapping) is intended to be included in the definition of "partially surrounding".

The module antenna (MA) which may be a planar antenna (PA), such as a metal layer etched to have tracks (traces) separated by spaces. The coupling frame (CF) ring may have an inner edge (IE) and an outer edge (OE). Both of the inner and outer edges may have the same geometric form (shape), such as rectangular. The inner edge may have a geometric form (such as rectangular) corresponding to the geometric form of the module antenna (MA), and an outer edge with another geometric form (such as round or elliptical). The coupling frame (CF) may be surround at least two sides of the module antenna (MA), such as three sides thereof, or all four sides. In the case of the coupling frame (CF) surrounding substantially the entire planar module antenna (MA), a slit (S, or slot, or gap) may be provided, extending from the inner edge (IE) to the outer edge (OE) of the coupling frame (CF) so that it is an open-loop conductor, having two ends and a gap therebetween. When the term "partially surrounding" is used herein, it generally may refer to such a coupling frame (CF) which substantially surrounds (except for the slit, slot or gap) the planar antenna (PA) structure. In some instances, the coupling frame (CF) may be described simply as "surrounding" the module antenna (MA), it being understood that there is a slit (S) extending from the outer edge (OE) of the coupling frame (CF) to the inner edge (IE) thereof.

According to some embodiments (examples) of the invention, generally a conductive layer (CL) may be formed as coupling frame (CF) having an outer edge (OE) and an inner edge (IE defining an opening (OP) and may be disposed with its opening (OP) surrounding and closely adjacent a transponder chip module (TCM), particularly the module antenna (MA) thereof, and may be substantially coplanar with the module antenna (MA). The coupling frame (CF) may have a discontinuity, comprising a slit (S) or a non-conductive stripe (NCS), in the metal layer (ML), extending from its inner edge (IE) (which defines the opening (OP)) to an outer edge (OE) thereof, whereby the metal layer (ML) comprises an open-loop coupling frame (CF) having two ends. For example, the coupling frame (CF) may be "C-shaped".

Some embodiments of the invention(s) disclosed herein may relate to transponder chip modules (TCMs) with integrated coupling frame (CF) for implanting, insertion or placement in secure documents, such as in or on inlay substrates or smartcard stack-ups.

Some embodiments of the invention(s) disclosed herein may relate to the arrangement of contact pads or isolated metal features such as a logo on one side of a chip carrier tape (CCT) and a planar antenna (PA) structure (laser etched antenna structure (LES) or chemical-etched antenna structure (CES)) on an opposite side of the chip carrier tape (CCT) which forms a transponder chip module (TCM) when connected to an RFID chip, and the arrangement of a coupling frame (CF) on one or both sides of the chip carrier tape (CCT) and partially surrounding the planar antenna (PA) to enhance the read/write distance when communicating at close proximity with a contactless reader.

Some embodiments of the invention(s) disclosed herein may relate to a chip carrier tape (CCT) having a single metal layer (ML) disposed on a suitable substrate such as glass-reinforced epoxy, Kapton, PET or the like with said metal layer (ML) prepared with isolated metal features (such as, but not limited to, contact pads (CP), connection bridges (CBR) and decorative features, logos and the like), a planar antenna (PA) structure, connection pads (CP), and a coupling frame (CF) on substantially the same plane, to accept an RFID chip for die and wire bonding or flip chip assembly.

Some embodiments of the invention(s) disclosed herein may relate to a chip carrier tape (CCT) having at least two metal layers, one disposed on top (face-up side) and the other on bottom (face-down side) of a suitable substrate such as double-sided glass epoxy tape or the like, with the face-up side prepared with isolated metal features, connection bridge(s) with or without a coupling frame (CF), and a planar antenna structure with connection pads and coupling frame (CF) prepared on the face-down side of the chip carrier tape (CCT), to accept an RFID chip for die and wire bonding or flip chip assembly.

Some embodiments of the invention(s) disclosed herein may relate to a coupling frame (CF) partially surrounding a planar antenna (PA) structure on a chip carrier tape (CCT) with a slit (or slot, or gap) extending from an inner edge of the coupling frame (CF) to an outer edge thereof to create an open-circuit conductive ring around the area of the planar antenna (PA) structure. The slit may be straight extending radially from the inner edge to the outer edge, or extending at an angle from the inner to the outer edge, or may have an artist characteristic (such as a zig-zag slit or a slit which is becomes wider or narrow along its length). Multiple slits may be provided in a single coupling frame (CF). Multiple coupling frames, each having slits may be provided.

Some embodiments of the invention(s) disclosed herein may relate to a flexible chip carrier tape (CCT), having a single or double-sided metallization layer in standard super 35 mm format or any suitable format. The metallization layer or layers can be electrodeposited copper, rolled annealed copper, plated copper, selectively plated copper or any suitable conductive medium. The planar antenna (PA) may be arranged slightly smaller than the footprint of a six or eight contact module or the planar antenna may be arranged substantially larger, taking advantage of the space on a 35 mm tape or any suitable substrate.

Some embodiments of the invention(s) disclosed herein may relate to a transponder chip module (TCM) partially surrounded by a coupling frame (CF) on one or both sides of a double-sided chip carrier tape (CCT), with design features (artwork) on one side (face-up side) and a planar antenna (PA) with connection pads on the opposite side (face-down side), with a gap between the planar antenna (PA) and coupling frame (CF) ranging from the width of a laser beam (such as 25 μm), or less, to the conventional feature size in a chemical etch process, e.g. 100 μm, or more.

Some embodiments of the invention(s) disclosed herein may relate to a transponder chip module (TCM) partially surrounded by a coupling frame (CF) on a common chip carrier tape whereby the read/write performance of the device is primarily determined by: the dimensions and thickness of the isolated metal features (such as contact pads CP) on the face-up side of the chip carrier tape (CCT), in particular the gap between said features, typically 200 μm; the surface area of the planar antenna (PA) on the face-down side of the chip carrier tape (size and shape of the antenna, thickness of the metal layer (ML), spacing between tracks, width of the tracks, number of turns); the surface area of the coupling frame (CF) partially surrounding the planar antenna (PA) of the transponder chip module (TCM); the dimensional gap between the planar antenna (PA) and the coupling frame (CF); the dimensional slit or slot in the coupling frame (CF); and RFID chip, in particular the input capacitance, typically 17 pF or 69 pF.

Some embodiments of the invention(s) disclosed herein may relate to a transponder chip module (TCM) partially surrounded by a coupling frame (CF) on a common chip carrier tape and mounted to an inlay substrate which may be laminated or attached to additional substrate layer or layers to create a data-page or an e-cover in an electronic passport booklet.

Some embodiments of the invention(s) disclosed herein may relate to a transponder chip module (TCM) partially surrounded by a coupling frame (CF) on a common chip carrier tape and mounted to an inlay substrate which may be laminated to additional substrate layers to create a contactless card. A transparent window in the substrate layers may allow for the isolated metal features on the top side of the transponder chip module to be visible.

Some embodiments of the invention(s) disclosed herein may relate to a transponder chip module (TCM) partially surrounded by a coupling frame (CF) on a common chip carrier tape, punched from a super 35 mm tape and implanted in a card body to create a dual interface smartcard.

In some of the embodiments described herein, the substrate for supporting the coupling frame (CF) could be a rigid insulated substrate in which a conductive metal layer (ML) is deposited on the surface. The metal layer (ML) could be laser etched to expose the slit (S). The module antenna (MA) could be formed on the same substrate or on a separate substrate.

An antenna module (AM) or transponder chip module (TCM) may comprise an open loop coupling frame (CF) surrounding, disposed on the module tape (MT) or chip carrier tape (CCT) closely adjacent to, and substantially coplanar with (including overlapping, including on the same or another side of the module tape (MT)) from a module antenna (MA) or planar antenna (PA), or simply antenna structure (AS), connected to an RFID chip (IC, CM).

A capacitive coupling enhanced (CCE) transponder chip module (TCM) may comprise an RFID chip (CM, IC), optionally contact pads (CP), a module antenna (MA), and a coupling frame (CF), all on a common substrate or module tape (MT). The coupling frame (CF) may be in the form of a ring, having a central opening (OP) defined by an inner edge (IE) thereof, an outer edge IE, and a slit (S) extending from the inner edge (IE) to the outer edge (OE) of the coupling frame (CF) so that the coupling frame (CF) is "open loop". The coupling frame may be disposed with its inner edge (IE) closely adjacent to and surrounding a module antenna (MA) structure of the transponder chip module (TCM). An RFID device may comprise a transponder chip module (TCM) having a module antenna (MA), a device substrate (DS), and an antenna structure (AS) disposed on the device substrate (DS) and connected with the module antenna (MA). A portion of a conductive layer (CL, 904) remaining after etching a module antenna (MA, 900) may be segmented to have several smaller isolated conductive structures (904b,c,d).

According to some embodiments (examples) of the invention, a capacitive coupling enhanced (CCE) transponder chip module (TCM) may comprise: a module tape (MT); an area for mounting an RFID chip (IC) on the module tape (MT); and a module antenna (MA, PA) disposed on the module tape (MT); and may be characterized by: a conductive coupling frame (CF) disposed on the module tape (MT) having an opening (OP) defined by an inner edge (IE), an outer edge (OE) and a discontinuity comprising a slit (S) or a non-conductive stripe (NCS) extending from the opening (OP) to the outer edge (OE); wherein the opening (OP) is disposed surrounding and closely adjacent to the module antenna (MA).

The coupling frame (CF) may be disposed on the same side of the module tape (MT) as the module antenna (MA, PA). The coupling frame (CF) may be disposed on an opposite side of the module tape (MT) from the module antenna (MA, PA). The coupling frame (CF) may be formed from a conductive layer (CL) on the module tape (MT) which is one of the (i) conductive layer used to form contact pads (CP) on the face-up side of the module tape (MT) and (ii) the conductive layer used to form the module antenna on the face-down side of the module tape (MT). The coupling frame (CF) may comprise wire (EW) embedded in the module tape (MT).

The module antenna (MA) may comprise an etched planar antenna (PA) having a number of tracks (traces) separated by spaces; wherein: a track width is less than 100 µm; and a spacing between adjacent tracks is less than 75 µm. The module antenna (MA) may comprise two antenna structures (PA-1, PA-2). A capacitor (CAP) may be connected with the module antenna (MA).

Two coupling frames (CF-1, CF-2) may be disposed on the module tape (MT)—one disposed on a face-up side of the module tape (MT) the other disposed on a face-down side of the module tape (MT). The coupling frame (CF) may be disposed around the module antenna (MA) with its opening (OP) surrounding the module antenna (MA) and closely adjacent thereto. The coupling frame (CF) may overlap at least a portion of the module antenna (MA). The coupling frame (CF) may extend a few millimeters beyond the module antenna (MA) on one side thereof, and extends a few centimeters beyond the module antenna (MA) on an opposite side thereof. The coupling frame (CF) may have a geometry defined by a shape of its outer edge (OE) which is different than a geometry of the transponder chip module (TCM).

A plating line (PL) may extend from outside of the coupling frame (CF), through the slit (S) in the coupling frame (CF) to the module antenna (MA). Conductive traces (CT) may extend between at least some contact pads (CP) and connection bridges (CBR) of the contact pad array (CPA).

According to some embodiments (examples) of the invention, a capacitive coupling enhanced transponder chip module (CCE-TCM) may comprise: a module tape (MT); an RFID chip (IC) disposed on the module tape (MT); an etched planar antenna (PA) disposed on the module tape (MT); and a coupling frame (CF) disposed on the module tape (MT), closely adjacent to the module antenna (MA), having an opening (OP) aligned with the module antenna (MA) and a slit (S) extending from the opening (OP) to an outer edge (OE) of the coupling frame (CF) so that the coupling frame (CF) is an open loop.

The capacitive coupling enhanced transponder chip module (CCE-TCM) may further comprise:
contact pads (CP) so that the capacitive coupling enhanced transponder chip module (CCE-TCM) can function with dual interfaces (contactless and contact).

According to some embodiments (examples) of the invention, a method of improving coupling between a transponder chip module (TCM) and an external reader, the transponder chip module (TCM) comprising an RFIC chip (IC, 404) and a module antenna (MA), may be characterized by: incorporating an open-loop coupling frame (CF) in the transponder chip module (TCM).

The coupling frame (CF) may be disposed surrounding and closely adjacent to the module antenna (MA). The coupling frame (CF) may have an opening (OP); and a slit (S) may extend from the opening (OP) to an outer edge (OE) of the coupling frame (CF)

According to some embodiments (examples) of the invention, a transponder device (TD) may comprise: a device substrate (DS); a transponder chip module (TCM) comprising an RFID chip (IC), with a module antenna (MA) disposed on a carrier substrate (CS); and an antenna structure (AS) disposed on the device substrate (DS) and connected with the transponder chip module (TCM).

According to some embodiments (examples) of the invention, a method of forming a module antenna (MA) for a transponder chip module (TCM) may comprise: etching a module antenna (MA) from a conductive layer (CL) on a module tape to have tracks separated by spaces; and segmenting a portion of the conductive layer (CL) remaining in an area inside of the module antenna (MA) to comprise a plurality of small isolated conductive structures rather than a single large conductive structure. The etching step may comprise laser etching.

The contact pads (CP), coupling frame (CF) and antenna structures (AS) described herein may be formed using laser etching (isolation technique) of copper cladded "seed" layers on a module tape MT using a UV nanosecond or picosecond laser.

In the main, the antenna modules (AM) and transponder chip modules (TCM) disclosed herein may be described in the context of RFID applications, especially payment. Some of the concepts disclosed herein may be applicable to memory devices in combination with RFID. For example, rather than having ISO contact pads (ISO 7816), such a module may be provided with USB (Universal Serial Bus) format contact pads. The contact pads could in essence be USB contact pads. Such an RFID device having a contactless interface and a contact interface implemented in USB format may constitute an RFID/USB tag.

In their various embodiments, the invention(s) described herein may relate to industrial and commercial industries, such RFID applications, payment smartcards, electronic passports, identity cards, access control cards, wearable devices the like.

Other objects, features and advantages of the invention(s) disclosed herein may become apparent in light of the following illustrations and descriptions thereof.

BRIEF DESCRIPTION OF THE DRAWINGS

Reference will be made in detail to embodiments of the disclosure, non-limiting examples of which may be illustrated in the accompanying drawing figures (FIGs). The figures may generally be in the form of diagrams. Some elements in the figures may be exaggerated, others may be omitted, for illustrative clarity. Some figures may be in the form of diagrams.

Although the invention is generally described in the context of various exemplary embodiments, it should be understood that it is not intended to limit the invention to these particular embodiments, and individual features of various embodiments may be combined with one another. Any text (legends, notes, reference numerals and the like) appearing on the drawings are incorporated by reference herein.

Some elements may be referred to with letters ("AM", "BA", "CB", "CCM", "CM", "MA", "MT", "PA", "TCM", etc.) rather than or in addition to numerals. Some similar (including substantially identical) elements in various embodiments may be similarly numbered, with a given numeral such as "310", followed by different letters such as "A", "B", "C", etc. (resulting in "310A", "310B", "310C"), and variations thereof, and may collectively (all of them at once) referred to simply by the numeral ("310").

Figure 1:
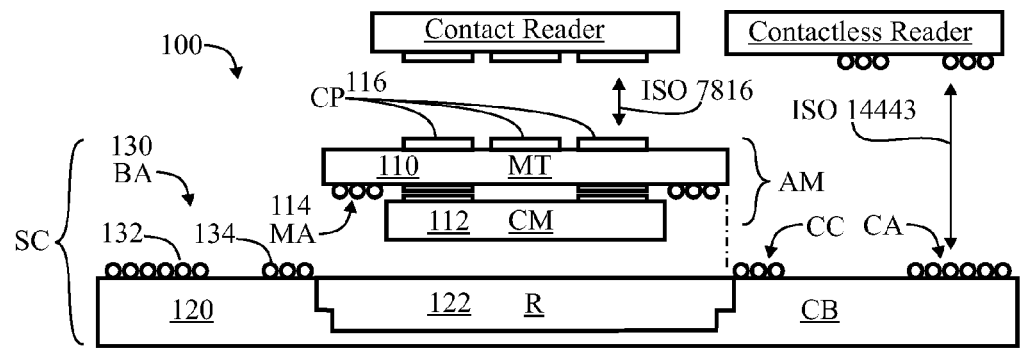

FIG. 1 is a diagram, in cross-section, of a dual-interface smart card (SC) and readers.

Figure 1A:
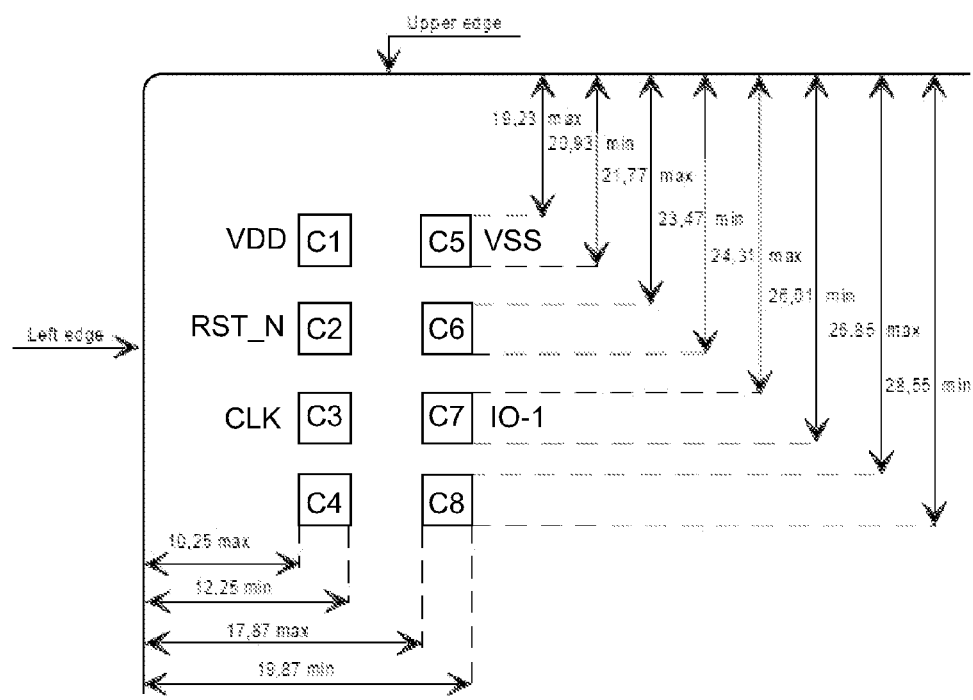

FIG. 1A is a diagram showing the ISO-7816 specification for contact pad layout.

Figure 1B:
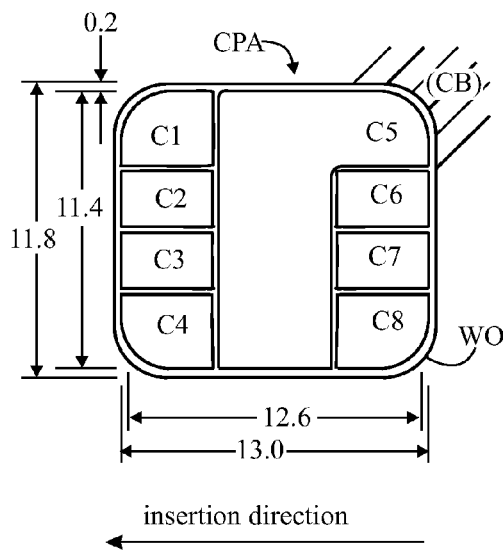

FIG. 1B is a diagram (plan view) of an 8-pad pattern for ISO-7816 contacts.

Figure 1C:
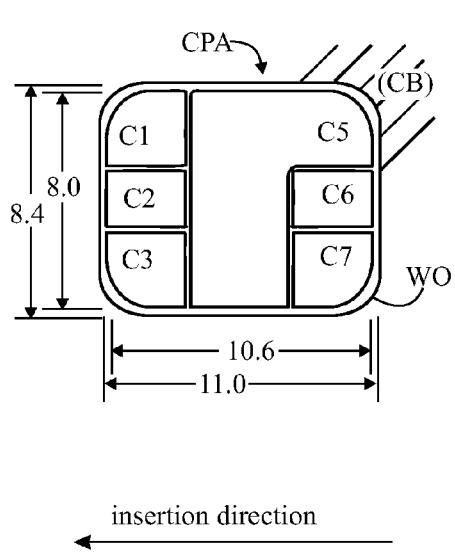

FIG. 1C is a diagram (plan view) of a 6-pad pattern for ISO-7816 contacts.

Figure 1D:
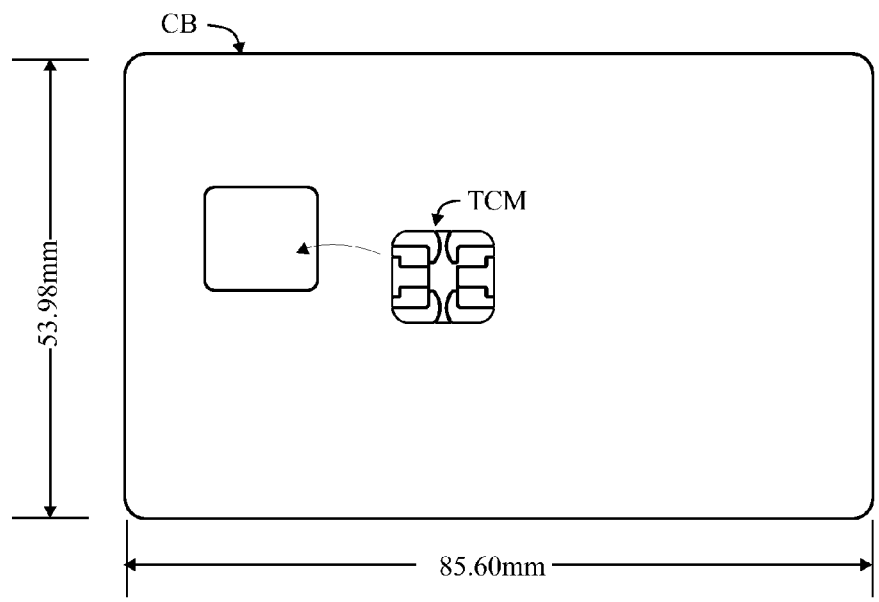

FIG. 1D is a diagram (plan view) of a smart card (SC).

Figure 2A:
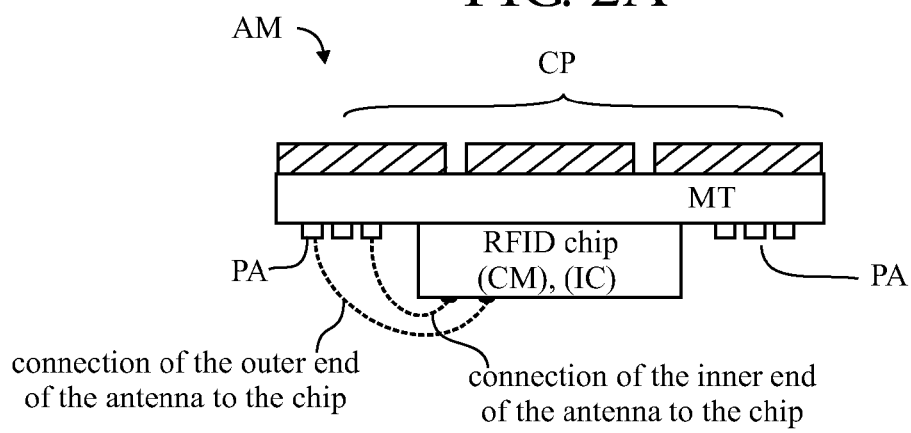

FIG. 2A is a diagram (cross-sectional view) of an antenna module (AM).

Figure 2B:
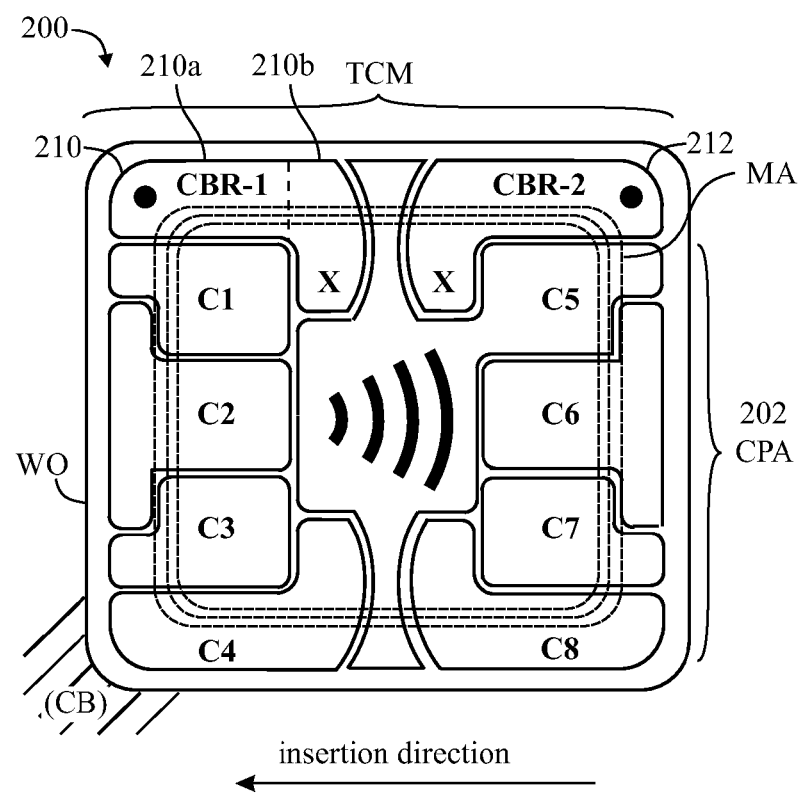

FIG. 2B is a diagram (plan view) of a contact side of a dual-interface antenna module (AM).

Figure 3A:
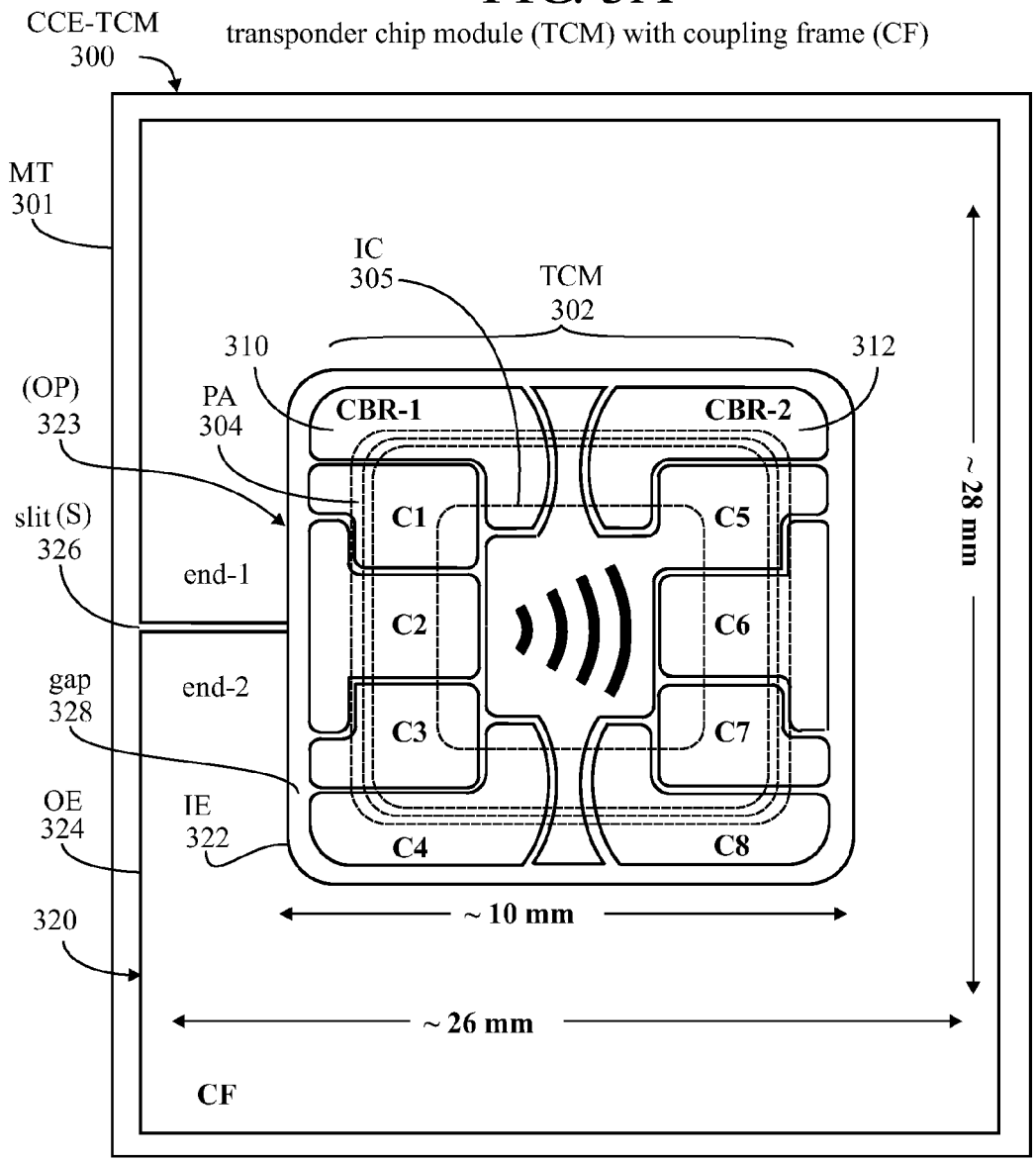
Figures 1, 3A:
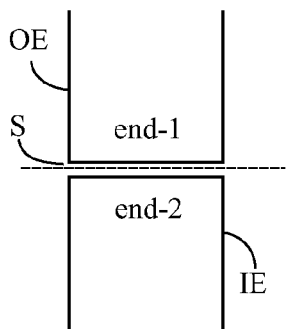

FIG. 3A is a plan view of a capacitive coupling enhanced (CCE) transponder chip module (TCM) which has a coupling frame (CF) incorporated on its module tape (MT).

Figures 2, 3A:
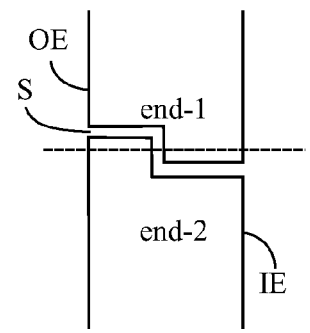

FIGS. 3A-1, 3A-2 are detailed views of the ends the coupling frame (CF) shown in FIG. 3A.

Figure 3B:
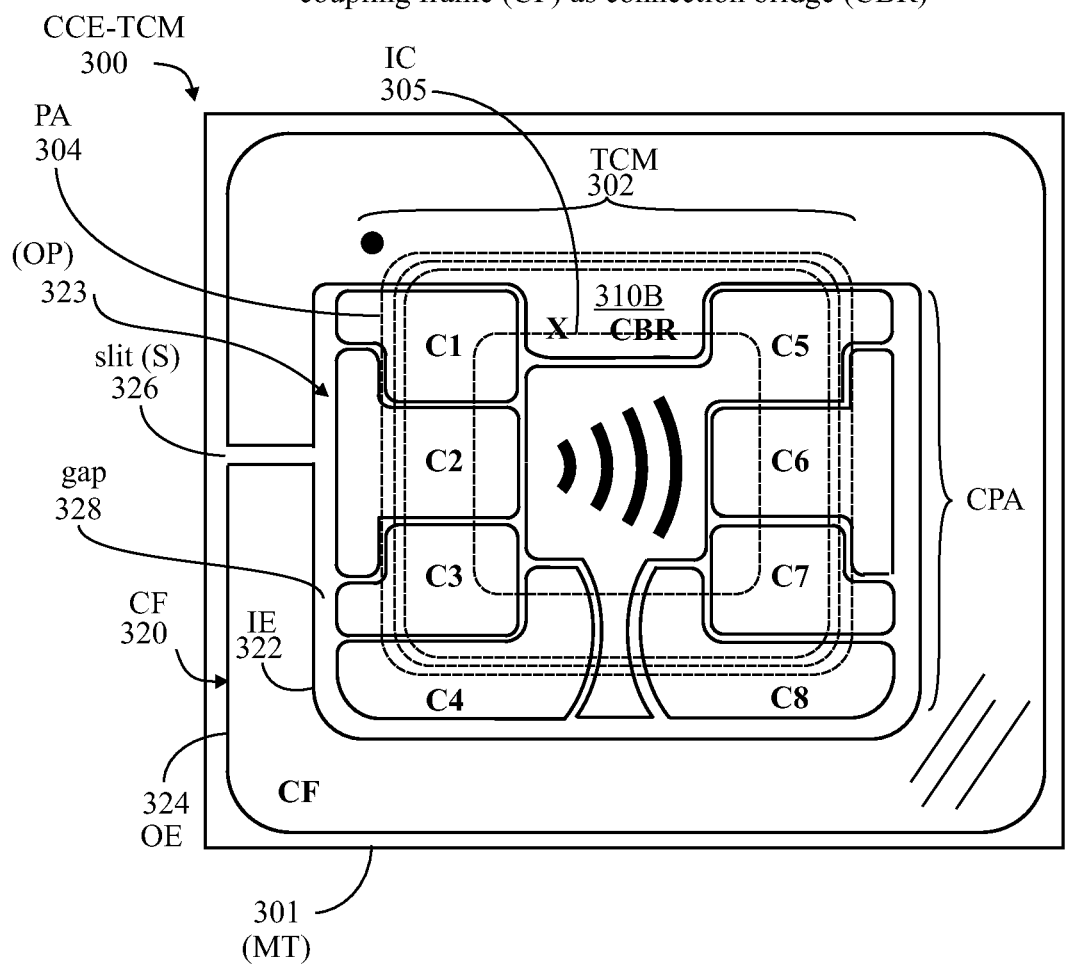

FIG. 3B is a plan view of a capacitive coupling enhanced (CCE) transponder chip module (TCM) which has a coupling frame (CF) incorporated on its module tape (MT).

Figure 3C:
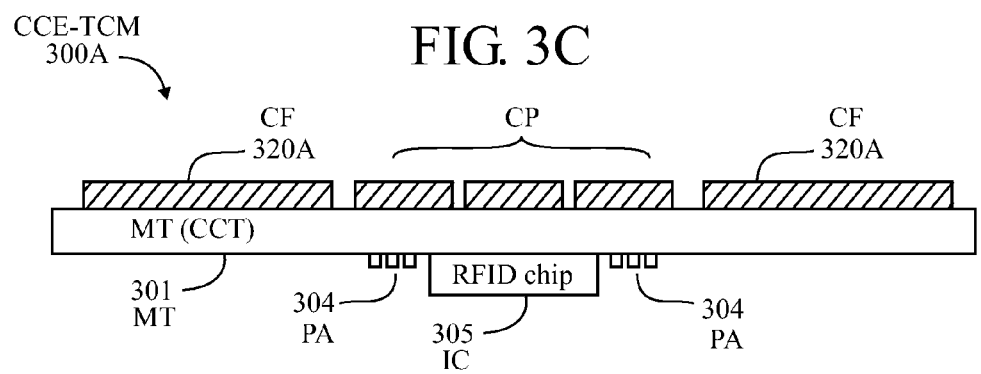

FIG. 3C is a diagram (cross-sectional views) of a capacitive coupling enhanced (CCE) transponder chip module (TCM).

FIGS. 3D-3I are diagram (plan views) of capacitive coupling enhanced (CCE) transponder chip modules (TCM).

Figure 3D:
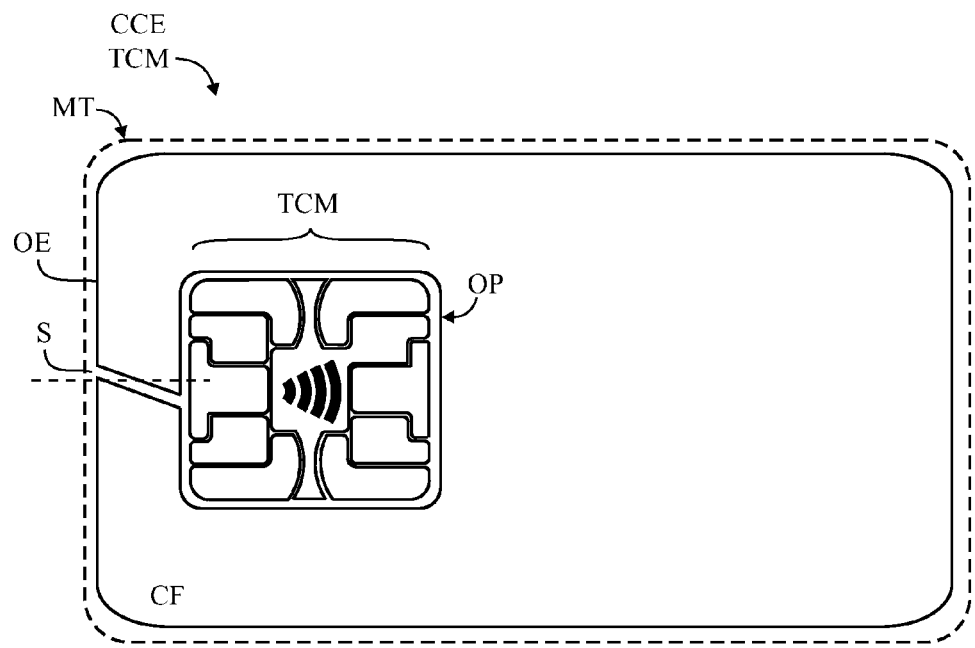
Figure 3E:
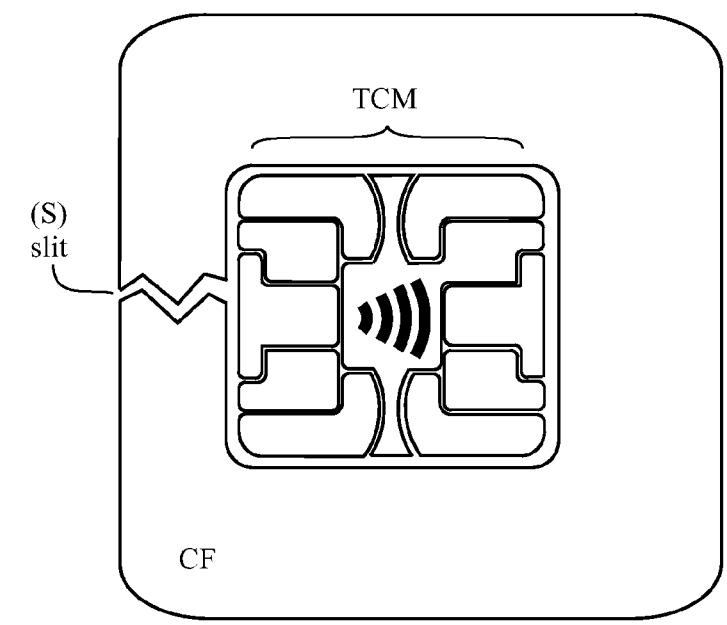
Figure 3F:
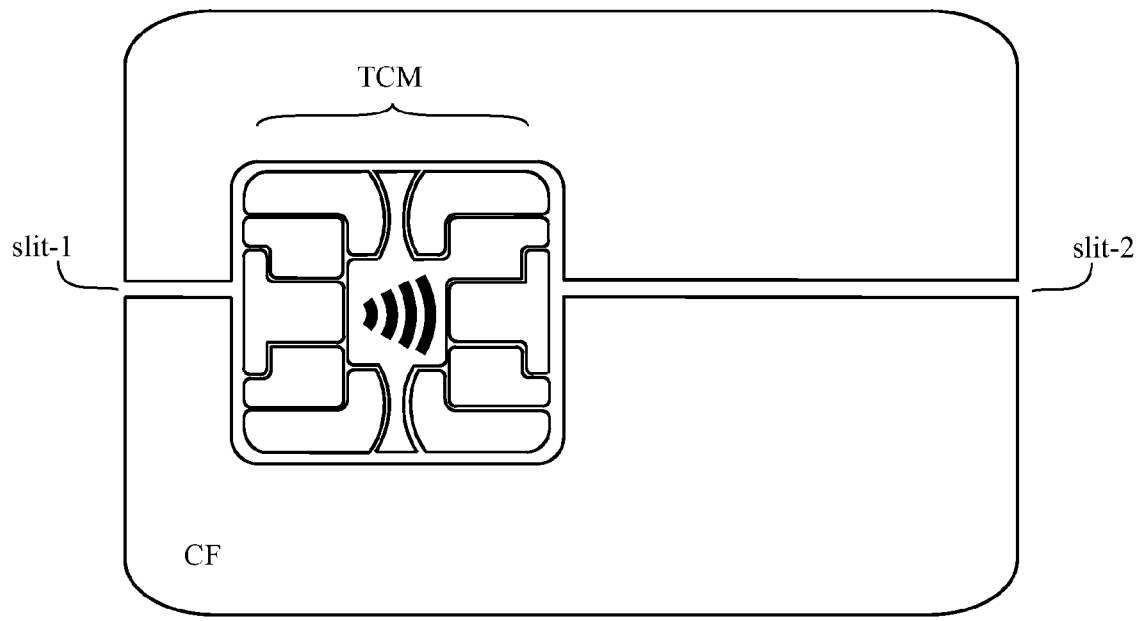
Figure 3G:
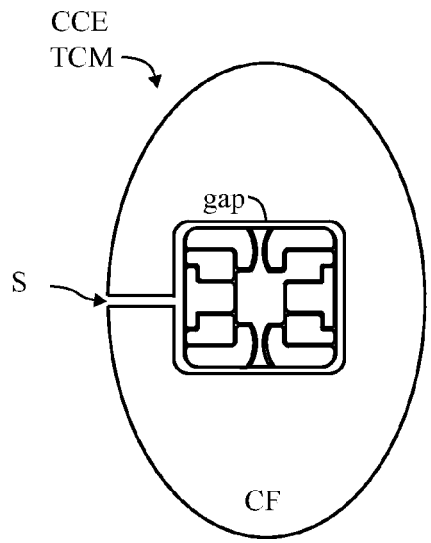
Figure 3H:
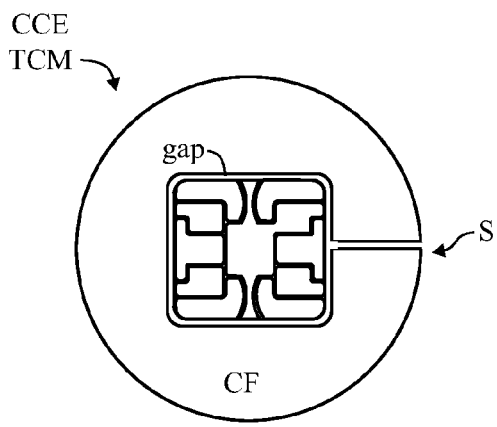
Figure 3I:
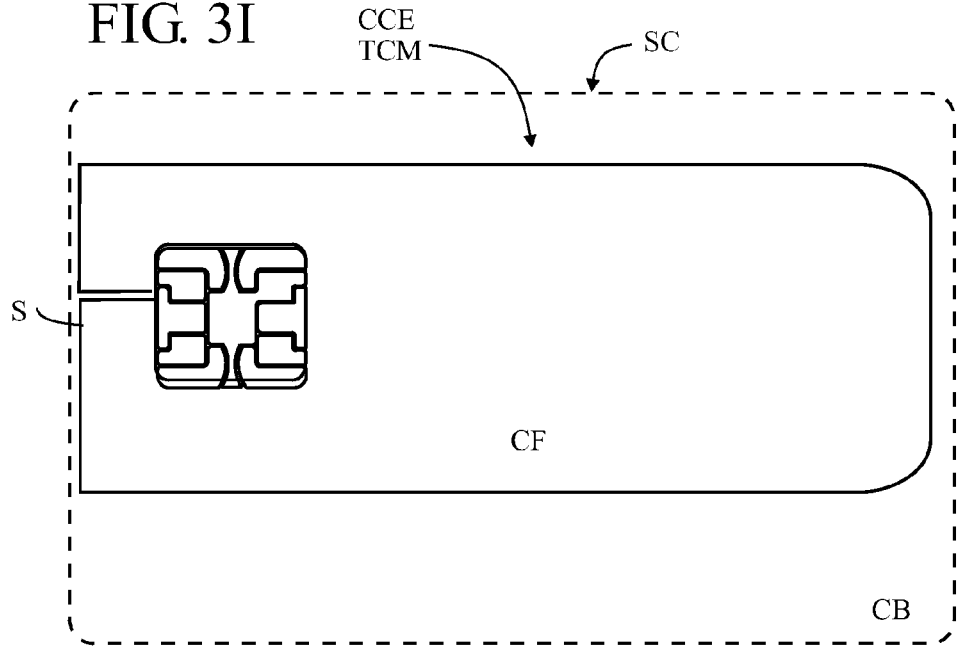

FIG. 3I is a diagram (plan view) of a capacitive coupling enhanced (CCE) transponder chip module (TCM), as it may be positioned in a smart card (SC).

Figure 3J:
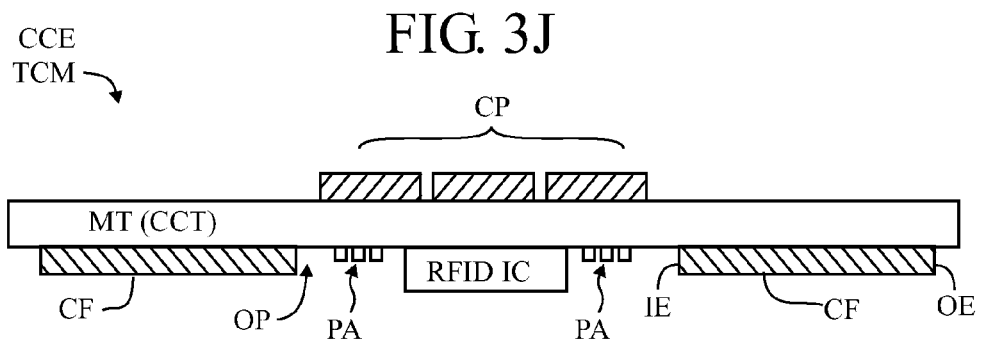

FIGS. 3J,K,L,M are diagrams (cross-sectional views) of capacitive coupling enhanced (CCE) transponder chip modules (TCM).

Figure 3K:
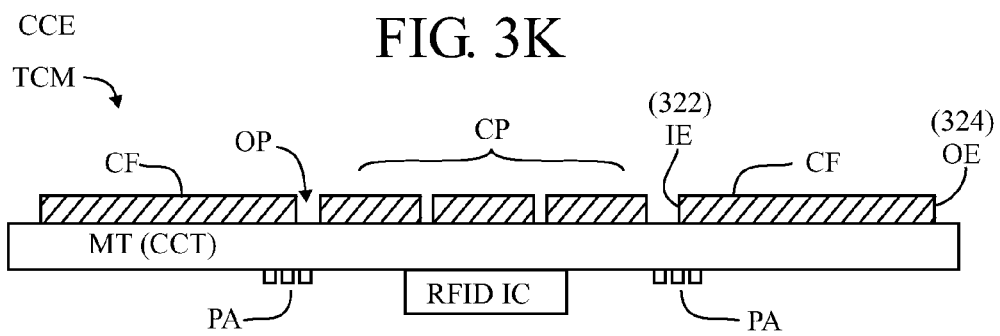
Figure 3L:
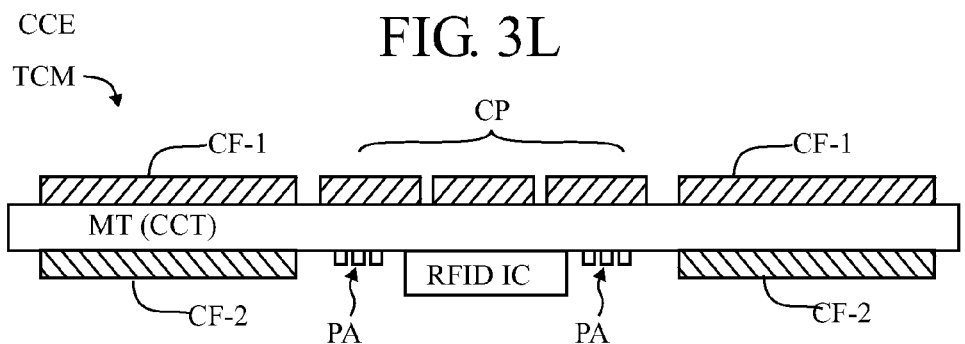
Figure 3M:
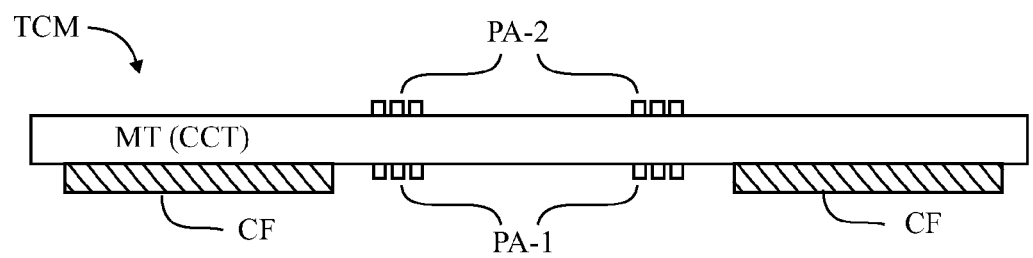
Figure 3N:
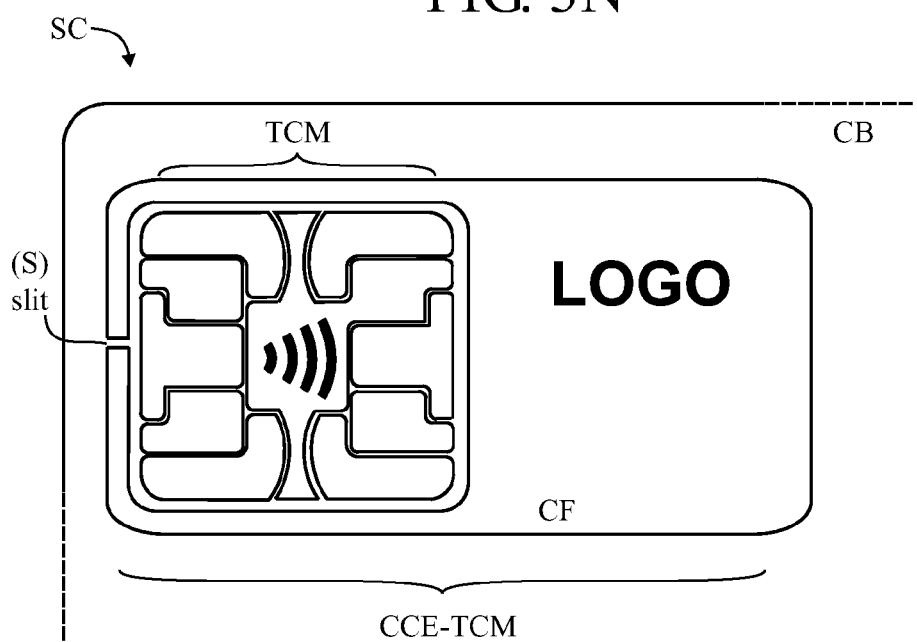

FIG. 3N is a diagram (plan view) of a capacitive coupling enhanced (CCE) transponder chip module (TCM), as it may be positioned in a smart card (SC).

Figure 3O:
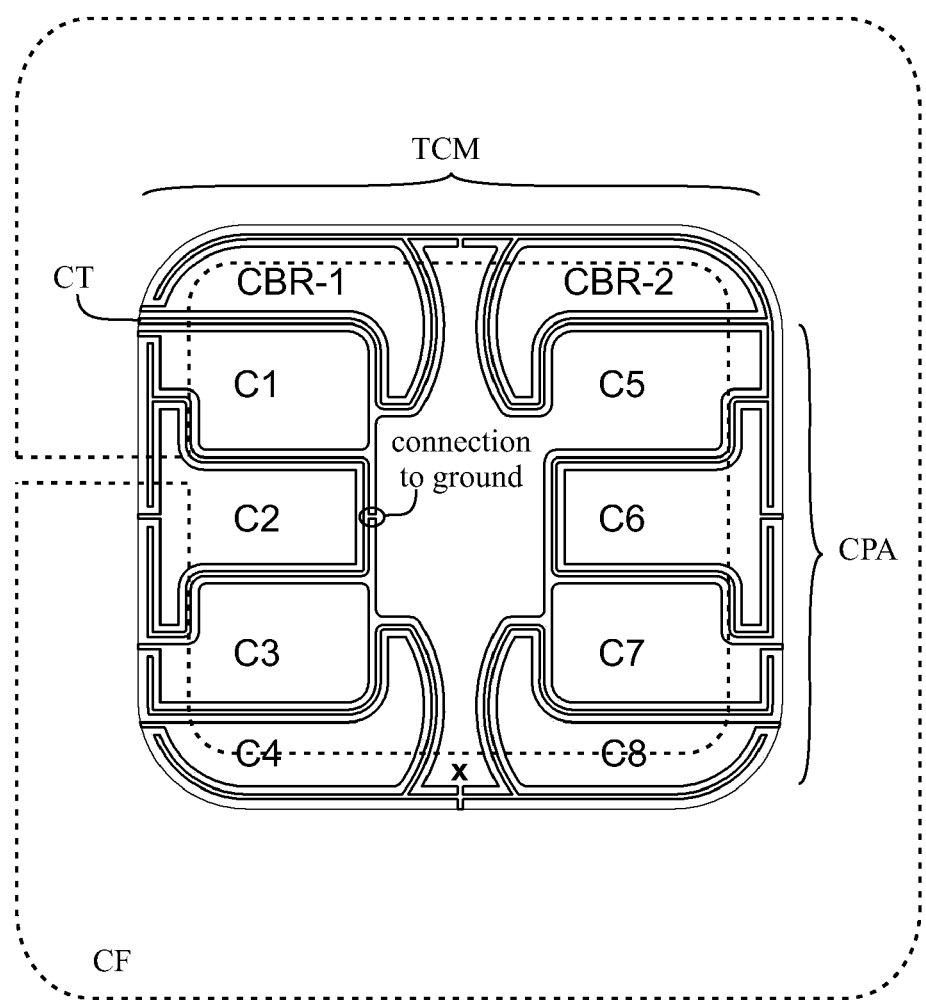

FIG. 3O is a diagram showing a contact pad array (CPA) having a conductive trace extending between the contact pads (CP) thereof.

Figure 4A:
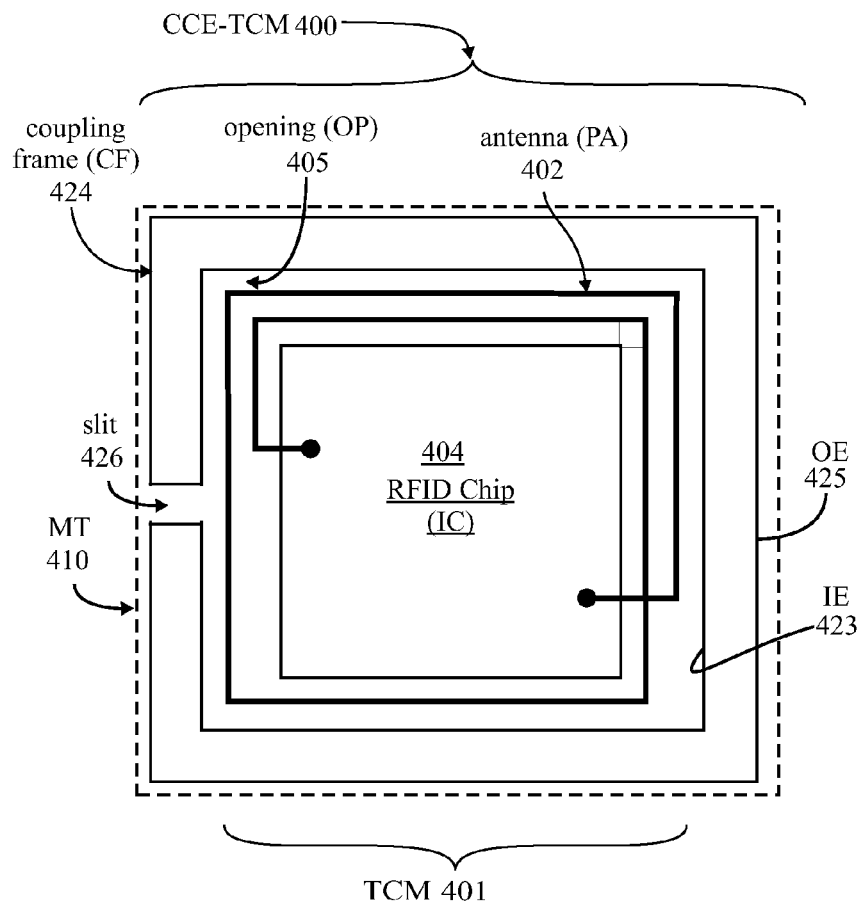

FIG. 4A is a diagram (plan view) of a capacitive coupling enhanced (CCE) transponder chip module (TCM) which has a coupling frame (CF) incorporated on its module tape (MT) or chip carrier tape (CCT).

Figure 4B:
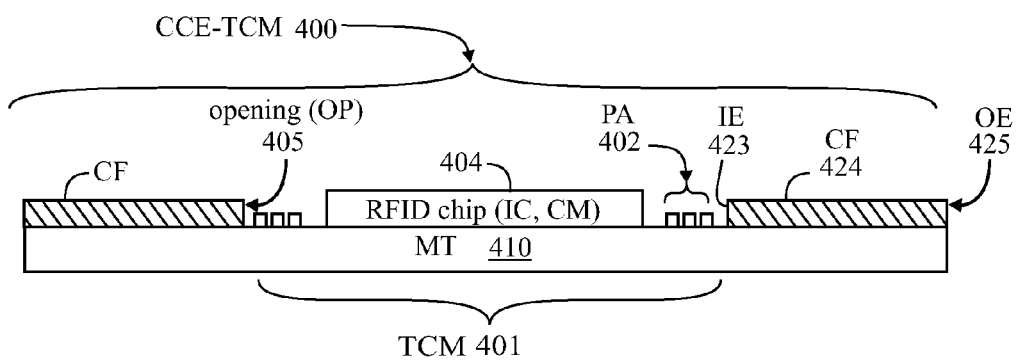

FIG. 4B is a diagram (cross-sectional view) of the capacitive coupling enhanced (CCE) transponder chip module (TCM) of FIG. 4A.

Figure 5A:
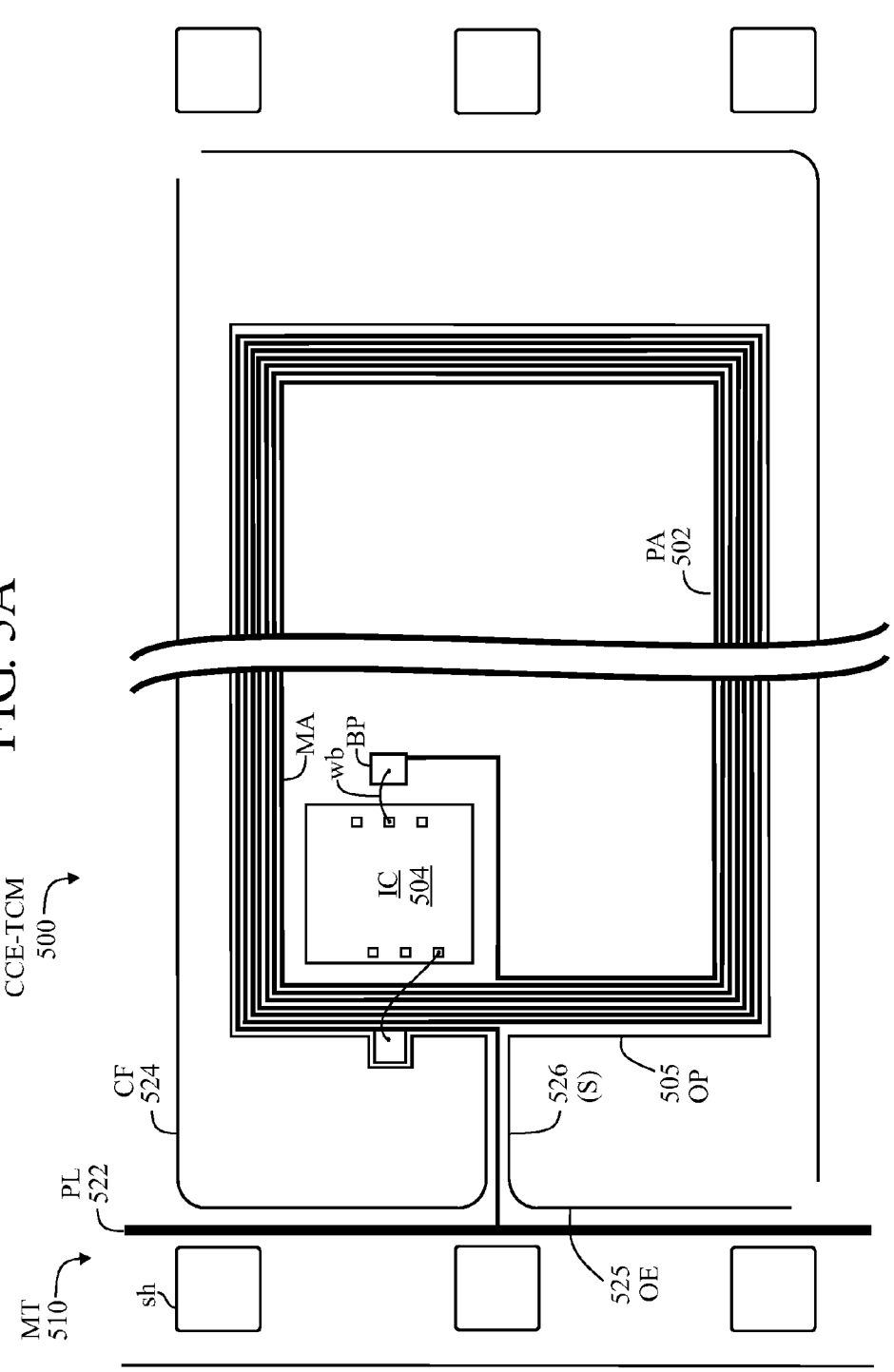

FIG. 5A is a plan view of a capacitive coupling enhanced (CCE) transponder chip module (TCM) which has a coupling frame (CF) incorporated on its module tape (MT) or chip carrier tape (CCT).

Figure 5B:
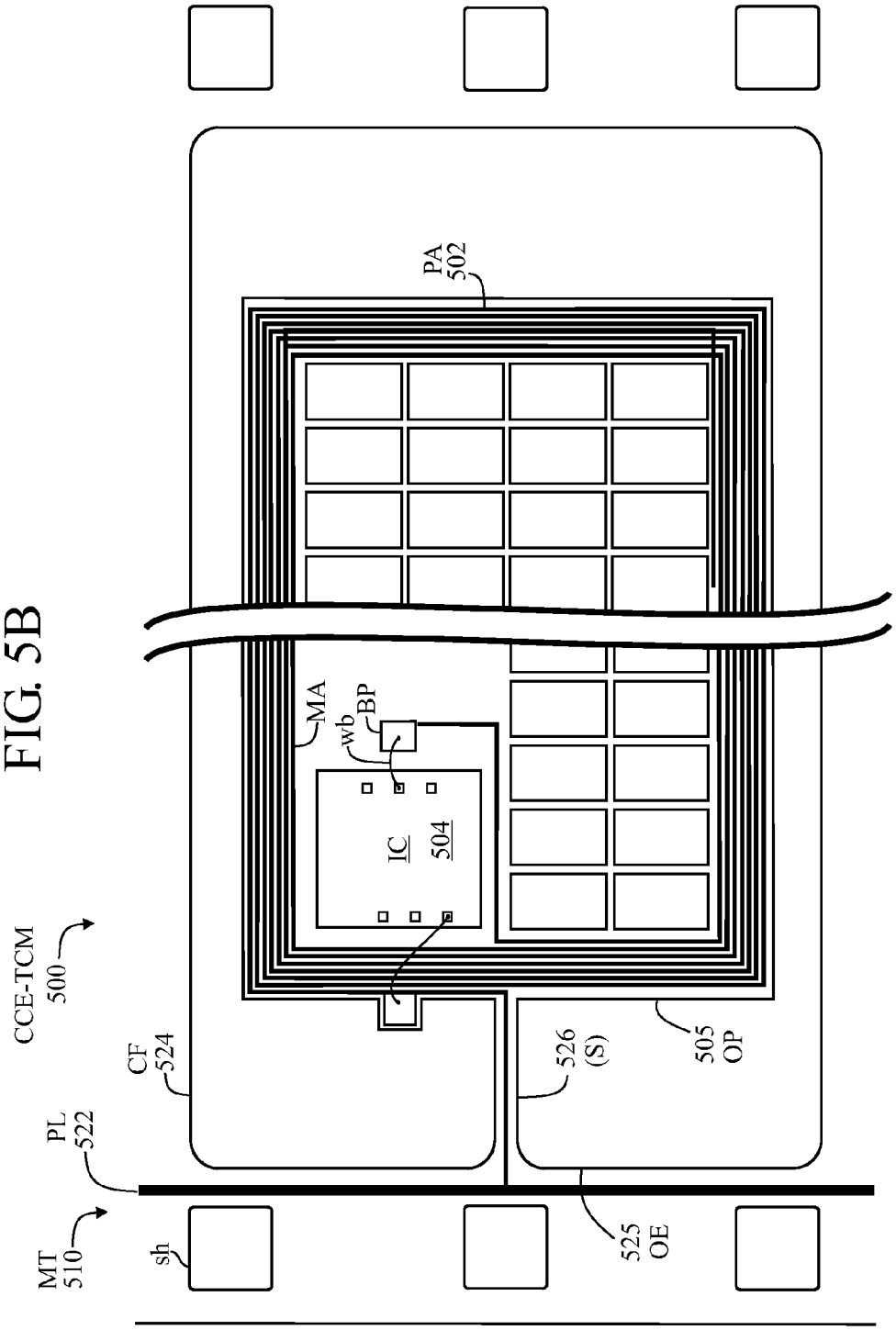

FIG. 5B is a plan view of a capacitive coupling enhanced (CCE) transponder chip module (TCM) which has a coupling frame (CF) incorporated on its module tape (MT) or chip carrier tape (CCT).

Figure 6A:
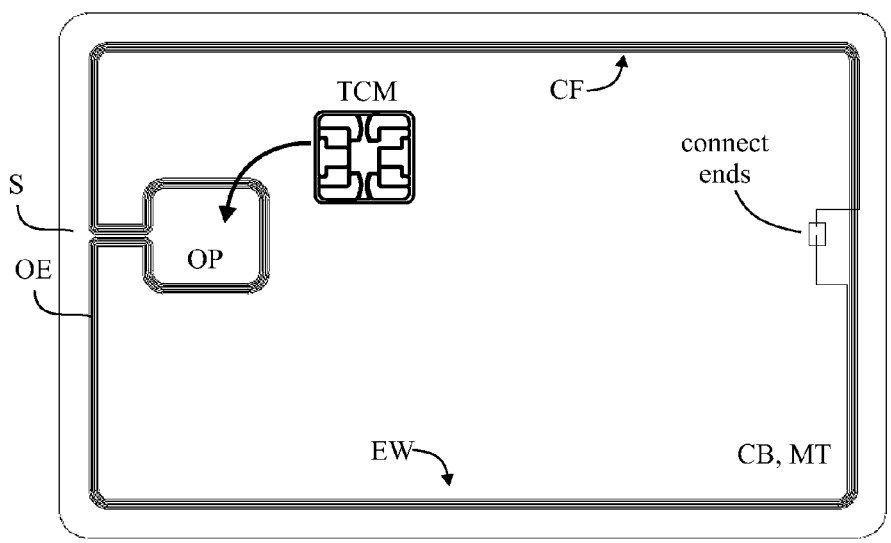

FIG. 6A is a plan view of a smartcard (SC) having a coupling frame (CF) formed by embedding wire (in the manner of a booster antenna BA).

Figure 6B:
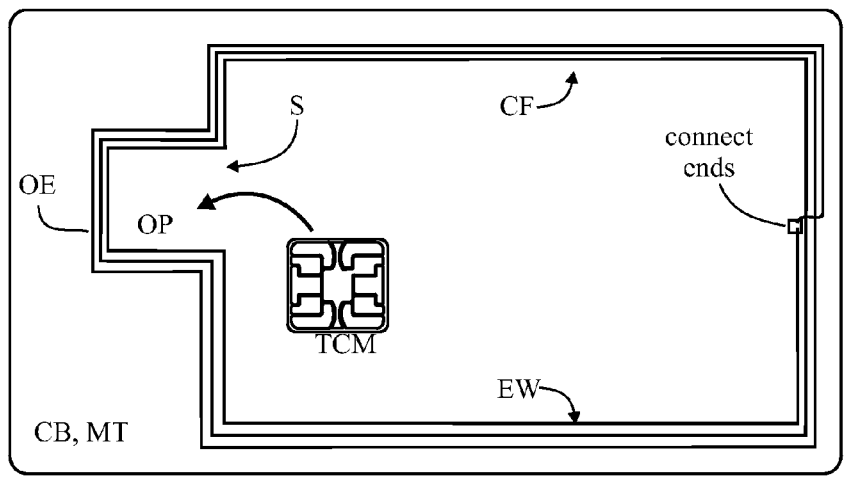

FIG. 6B is a plan view of a smartcard (SC) having a coupling frame (CF) formed by embedding wire (in the manner of a booster antenna BA).

Figure 6C:
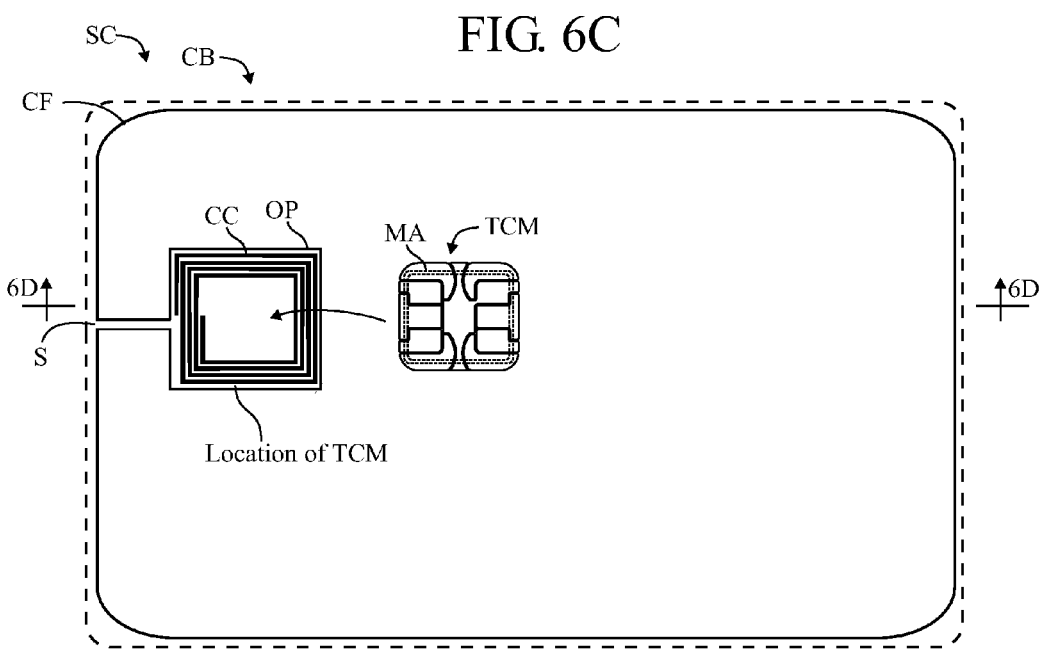

FIG. 6C is a diagram (plan view) of a coupling frame (CF) with coupler coil (CC) disposed in a card body (CB) of a smart card (SC).

Figure 6D:
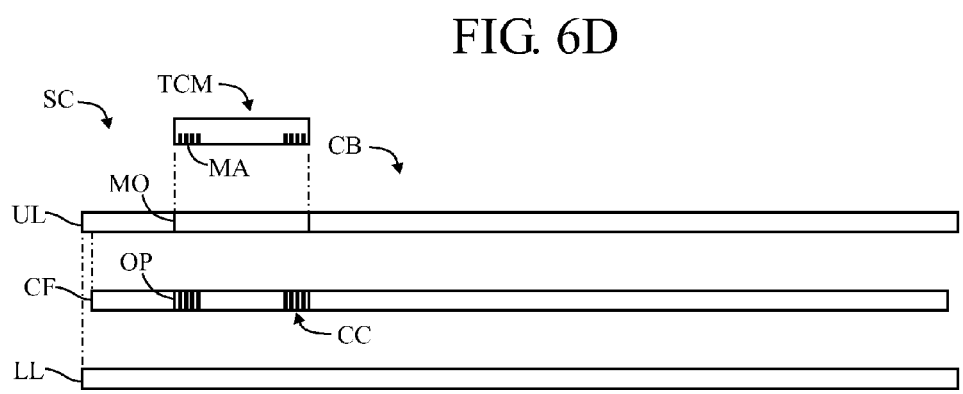

FIG. 6D is a cross-sectional view of the smart card (SC) with coupling frame (CF) of FIG. 6C, taken on a line 6D-6D through FIG. 6C.

Figure 6E:
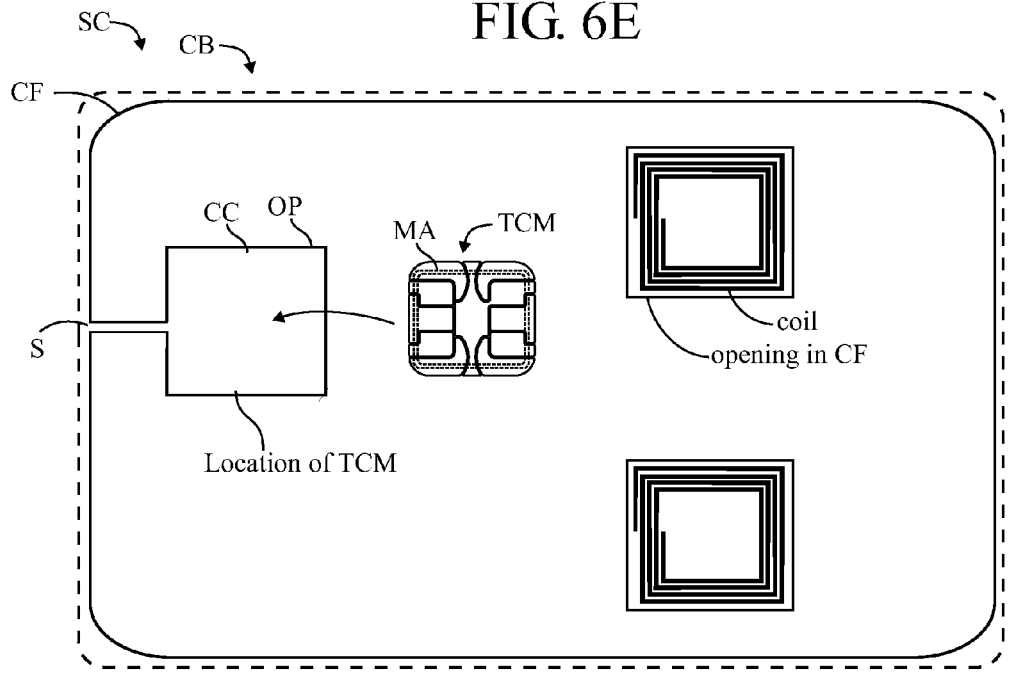

FIG. 6E is a plan view of a card body (CB) of a smart card (SC) comprising a coupling frame (CF) having a slit (S) and also having one or more coupler coils (CC) formed therein.

Figure 6F:
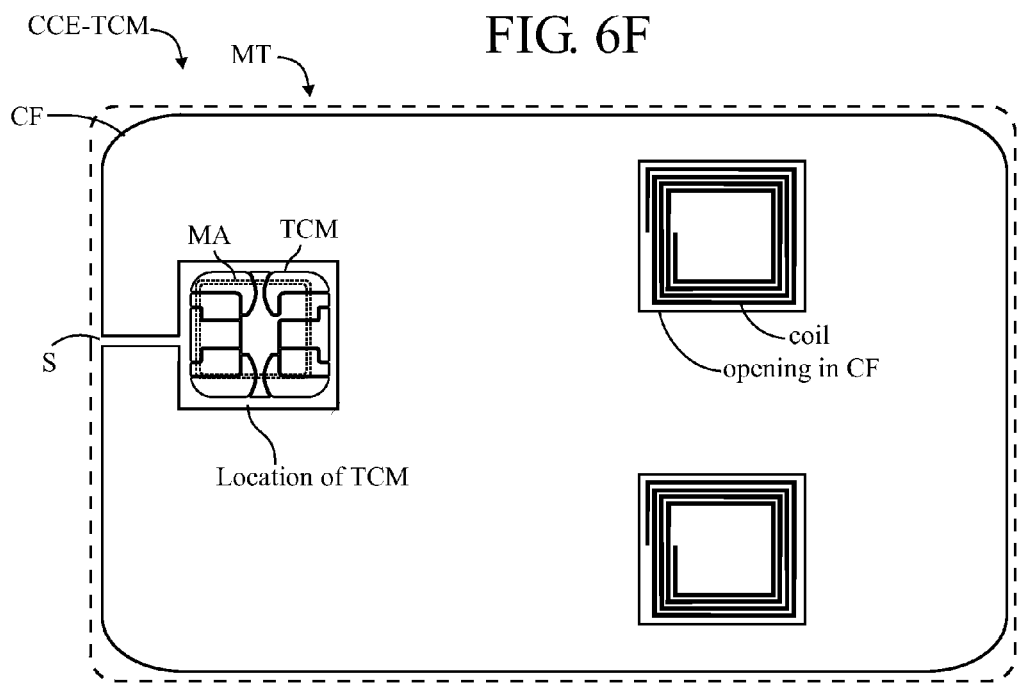

FIG. 6F is a plan view of a module tape (MT) of a capacitive coupling enhanced (CCE) transponder chip module (TCM) comprising a coupling frame (CF) having a slit (S) and also having one or more coupler coils (CC) formed therein.

Figure 7:
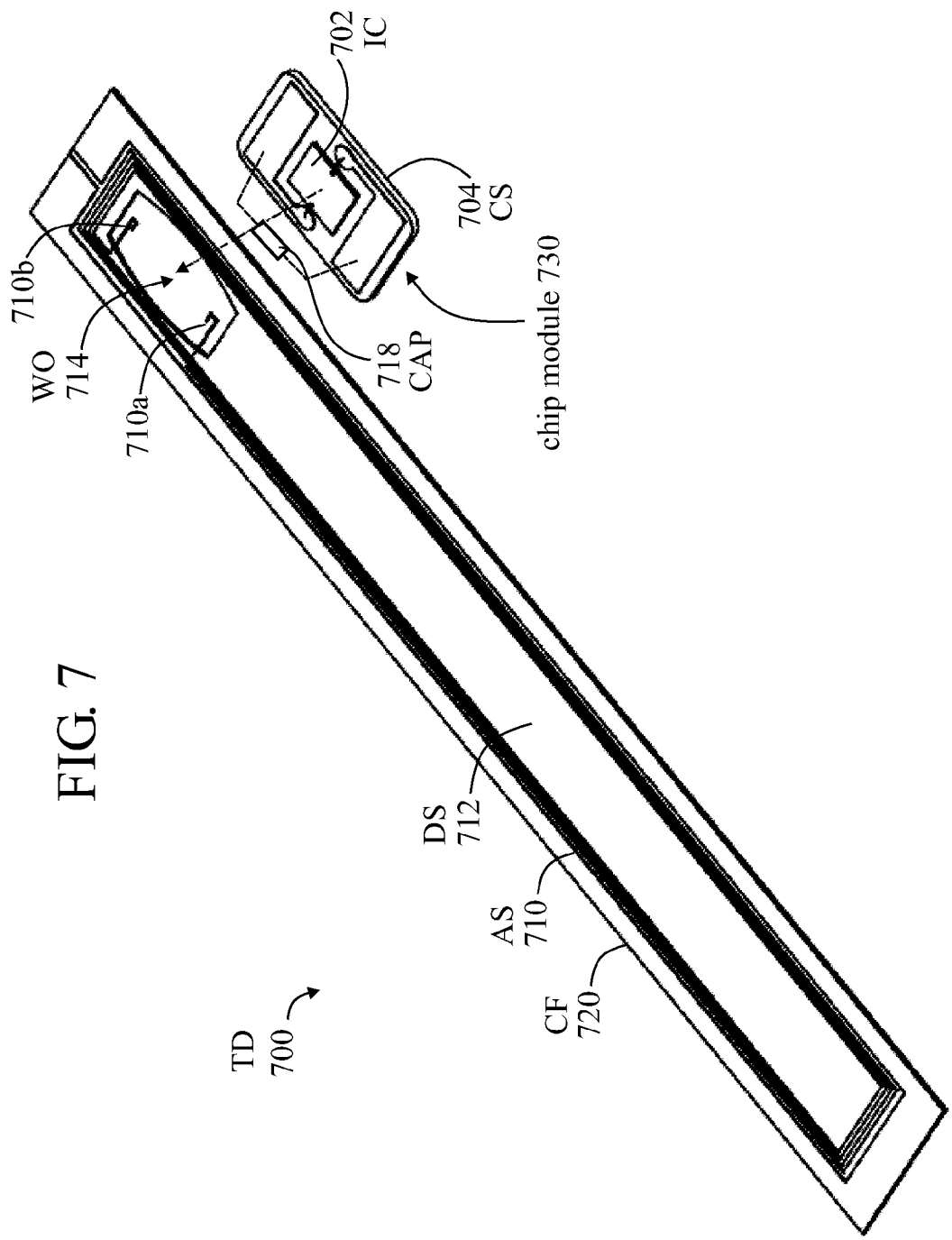

FIG. 7 is a diagram (perspective view) showing a transponder device (TD) having an elongated (long and narrow) form factor, suitable to be incorporated into a wristband product.

FIG. 8A is a diagram (perspective view) and FIG. 8B is a diagram (partial cross-sectional view) of a transponder device (TD) having an elongated (long and narrow) form factor, suitable to be incorporated into a wristband product.

FIG. 9A is a diagram (plan view) of an antenna structure (AS) which may be a module antenna (MA) which has been etched to have tracks (traces) separated by spaces, with a large area of conductive layer (CL) remaining within the antenna structure (AS).

FIGS. 9B, 9C, 9D are diagrams (plan view) of antenna structures (AS) which have been etched to have tracks (traces) separated by spaces, with a smaller, segmented areas of conductive layer (CL) remaining within the antenna structure (AS).

DESCRIPTION

Various embodiments (or examples) may be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment is included in at least one embodiment of the present invention. Some embodiments may not be explicitly designated as such ("an embodiment").

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity. Elements referred to in the singular (e.g., "a widget") may be interpreted to include the possibility of plural instances of the element (e.g., "at least one widget"), unless explicitly otherwise stated (e.g., "one and only one widget").

In the following descriptions, some specific details may be set forth in order to provide an understanding of the invention(s) disclosed herein. It should be apparent to those skilled in the art that these invention(s) may be practiced without these specific details. Any dimensions and materials or processes set forth herein should be considered to be approximate and exemplary, unless otherwise indicated. Headings (typically underlined) may be provided as an aid to the reader, and should not be construed as limiting.

Reference may be made to disclosures of prior patents, publications and applications. Some text and drawings from those sources may be presented herein, but may be modified, edited or commented to blend more smoothly with the disclosure of the present application.

In the main hereinafter, RFID cards, electronic tags and secure documents in the form of pure contactless cards, dual interface cards, phone tags, electronic passports, national identity cards and electronic driver licenses may be discussed as exemplary of various features and embodiments of the invention(s) disclosed herein. As will be evident, many features and embodiments may be applicable to (readily incorporated in) other forms of smart cards, such as EMV payment cards, metal composite cards, metal hybrid cards, metal foil cards, access control cards and secure credential documents. As used herein, any one of the terms "transponder", "tag", "smart card", "data carrier", "wearable device" and the like, may be interpreted to refer to any other of the devices similar thereto which operate under ISO 14443 or similar RFID standard. The following standards are incorporated in their entirety by reference herein:

ISO/IEC 7810 is an ISO standard s an international standard that defines the physical characteristics for identification cards. The characteristics specified include: (i) physical dimensions, (ii) resistance to bending, flame, chemicals, temperature and humidity, and (iii) toxicity. The standard includes test methods for resistance to heat. [2]

ISO/IEC 14443 (Identification cards—Contactless integrated circuit cards—Proximity cards) is an international standard that defines proximity cards used for identification, and the transmission protocols for communicating with it.

ISO/IEC 15693 is an ISO standard for vicinity cards, i.e. cards which can be read from a greater distance as compared to proximity cards.

ISO/IEC 7816 is an international standard related to electronic identification cards with contacts, especially smart cards.

EMV standards define the interaction at the physical, electrical, data and application levels between IC cards and IC card processing devices for financial transactions. There are standards based on ISO/IEC 7816 for contact cards, and standards based on ISO/IEC 14443 for contactless cards.

A typical transponder chip module (TCM) described herein may comprise
  (i) a substrate, such as an epoxy-glass substrate, which may be referred to as a module tape (MT) or a chip carrier tape (CCT) and which may function as an inlay substrate;
  (ii) an RFID chip (CM, IC) disposed on the substrate; and
  (iii) a planar antenna (PA), or simply antenna structure (AS), which may be a laser-etched antenna structure (LES) or a chemically-etched antenna structure (CES) serving as a module antenna (MA) for the transponder chip module (TCM).

A transponder chip module (TCM) may be referred to herein as an antenna module (AM), and may have a wire-wound antenna structure (AS), rather than a planar antenna (PA).

As disclosed herein, a transponder chip module (TCM) may also comprise:
  (iv) a coupling frame (CF) disposed on the substrate (MT) to enhance coupling between the transponder chip module (TCM) and the antenna of an external RFID "reader", and may be referred to as a "capacitive coupling enhanced" (CCE) transponder chip module (TCM).

A capacitive-coupling enhanced (CCE) transponder chip module (TCM) may be referred to herein simply as a transponder chip module (TCM), or sometimes as an antenna module (AM), but it should be evident from the context of the description(s) whether or not the transponder chip module (TCM) has a coupling frame (CF), and is indeed a capacitive-coupling enhanced (CCE) transponder chip module (TCM).

When "chip module" is referred to herein, it should be taken to include "chip", and vice versa, unless explicitly otherwise stated. When "transponder chip module" (TCM) is referred to herein, it should be taken to include "antenna module" (AM), and vice versa, unless explicitly otherwise stated. The transponder chip module (TCM) may also be referred to as a "transponder IC module". Throughout the various embodiments disclosed herein, unless specifically noted otherwise (in other words, unless excluded), the element referred to as "CM" will most appropriately be a bare integrated circuit (IC) die (or RFID chip), rather than a chip module (a die with a carrier). Some figures may present examples that are specifically "chip modules" having IC chips (such as a "CM") mounted and connected to substrates. A "chip module" (die and carrier) with a planar (etched) antenna structure (PA, AS, LES, CES) and connected thereto may be referred to as a transponder chip module (TCM).

When "inlay substrate" is referred to herein, it should be taken to include "card body", and vice versa, as well as any other substrate for a secure document, unless explicitly otherwise stated.

When "module tape" is referred to herein, it generally refers to a module tape (MT) or chip carrier tape (CCT) comprising an epoxy-glass substrate having metallization (typically a copper layer) on one or both sides thereof. The module tape (MT) may comprise insulating (electrically non-conductive) materials other than epoxy-glass, and provides a substrate for supporting (and interconnecting) various components of the transponder chip module (TCM) with one another.

According to an aspect of the invention, generally, a coupling frame (CF) may be incorporated into an antenna module (AM) or transponder chip module (TCM) to enhance its read/write distance, and may be referred to as a capacitive coupling enhanced (CCE) transponder chip module (TCM). A capacitive coupling enhanced (CCE) transponder chip module (TCM) may operate (function adequately) without a card body (CB) and without a booster antenna (BA). Again, throughout the descriptions set forth herein, a capacitive coupling enhanced (CCE) transponder chip module (TCM) may simply be referred to as a transponder chip module (TCM), for sake of brevity, the capacitive coupling enhanced feature being evident by the presence of a coupling frame (CF) in the transponder chip module (TCM).

The transponder chip module (TCM) may comprise non-perforated isolated metal features such as contact pads (CP) on the face-up (contact) side of the module tape (MT) and an RFID chip (CM, IC) and a planar (etched) antenna structure (AS, PA) on the face-down (chip or bond) side of the module tape (MT). Some components and features on either side of the module tape (MT), such as the contact pads (CP), bond pads and antenna structure (AS) may be laser-etched or chemically-etched. An antenna incorporated directly on the RFID chip may inductively couple with the planar antenna structure (PA).

Throughout the various embodiments disclosed herein, unless specifically noted otherwise (in other words, unless excluded), the element referred to as "CM" will most appropriately be a bare integrated circuit (IC) die (or RFID chip), rather than a chip module (a die with a carrier). Some figures may present examples that are specifically "chip modules" having IC chips (such as a "CM") mounted and connected to substrates. A "chip module" (die and carrier) with a planar (etched) antenna structure (PA, AS, LES, CES) and connected thereto may be referred to as a transponder chip module (TCM).

When "inlay substrate" is referred to herein, it should be taken to include "card body", and vice versa, as well as any other substrate for a secure document, unless explicitly otherwise stated.

When "module tape" is referred to herein, it generally refers to a module tape (MT) or chip carrier tape (CCT) comprising an epoxy-glass substrate having metallization (typically a copper layer) on one or both sides thereof.

Some of the descriptions that follow are in the context of dual interface (DI, DIF) smart cards, but may relate mostly to the contactless operation thereof. Many of the teachings set forth herein may be applicable to pure contactless cards, tags, wearables, secure documents (e.g. electronic passports) and the like having only a contactless mode of operation. Some of the teachings set forth herein may be applicable to RFID devices, such as smart cards, which do not have a booster antenna (BA).

Generally, any dimensions set forth herein are approximate, and materials set forth herein are intended to be exemplary. Conventional abbreviations such as "cm" for centimeter, "mm" for millimeter, "µm" for micron, and "nm" for nanometer may be used.

Dual Interface (DI) Smart Card (SC) and Readers

FIG. 1 illustrates a smart card (SC) 100 in cross-section, along with a contact reader and a contactless reader. An antenna module AM (or transponder chip module TCM) 110 may comprise a module tape (MT) 112, an RFID chip (CM, IC) 114 disposed on one side (face-down) of the module tape (MT) along with a module antenna (MA) 116 and contact pads (CP) 118 disposed on the other (face-up) side of the module tape (MT) for interfacing with an external contact reader. The card body (CB) 120 comprises a substrate (inlay substrate) which may have a recess (R) 122 extending into one side thereof for receiving the antenna module (AM). The recess (R) may be stepped—such as wider at the surface of the card body (CB)—to accommodate the profile of the antenna module (AM). The booster antenna (BA) 130 may comprise turns (or traces) of wire (or other conductor) embedded in (or disposed on) the card body (CB), and may comprise a number of components such as (i) a card antenna (CA) component 132 and (ii) a coupler coil (CC) component 134. It may be noted that, as a result of the recess (R) being stepped, a portion of the card body (CB) may extend under a portion of the antenna module (AM), more particularly under the module antenna MA.

FIG. 1A shows the ISO-7816 specification for a contact pad array (CPA). Eight contact pads C1-C8 are shown, The contact pads C1-C8 are located on the front surface of a smartcard. The dimensions are referenced to the left and upper edges of the front surface of the card. For a 6-pad layout, the contact pads C4 and C8 may be omitted. The signal assignments for the contact pads are,

| | |
|---|---|
| C1 | VDD |
| C2 | RST_N |
| C3 | CLK |

-continued

| | |
|---|---|
| C4 | not used |
| C5 | VSS |
| C6 | not used |
| C7 | IO 1 |
| C8 | not used |

The arrow in FIG. 1A ("insertion direction") indicates the direction that a smart card would be inserted into a reader, with contact pads C1, C2, C3 and C4 entering the reader first, followed by contact pads C5, C6, C7 and C8. (A 6 pad module does not have contact pads C4 and C8.) The "insertion direction" (or "card insertion direction"), as used herein, may be defined as a direction parallel to a line drawn from C1 to C5, or from C2 to C6, or from C3 to C7 or from C4 to C8.

FIG. 1B is a diagram of an exemplary contact pad array (CPA) comprising an 8-pad pattern for ISO 7816 contact pads (CP), and illustrates that an 8-pad layout may measure approximately 11.4 mm×12.6 mm. With a 2 mm space around the contact pad array (CPA), the overall size (or the size of a recess R in a card body CB for receiving an antenna module AM) may be 11.8 mm×13.0 mm.

FIG. 1C is a diagram of an exemplary contact pad array (CPA) comprising an exemplary 6-pad pattern for ISO 7816 contact pads (CP), and illustrates that a 6-pad layout may measure approximately 8.0 mm×10.6 mm. With a 2 mm space around the contact pad array (CPA), the overall size (or the size of a recess R in a card body CB for receiving an antenna module AM) may be approximately 8.4 mm×11.0 mm.

FIG. 1D is a diagram showing conventional dimensions of a smart card (SC) having an ID-1 format, according to ISO/IEC 7810. The card body (CB) measures 53.98 mm×85.60 mm. A transponder chip module (TCM) is shown for insertion in the card body (CB). This figure illustrates the usual "form factor" for chip modules (in this case, a transponder chip module TCM), and their location in the smart card (SC).

FIG. 2A shows an antenna module (AM) comprising contact pads (CP) disposed on one side (or surface; top, as viewed) of a module tape (MT, or substrate) and a planar antenna (PA, or module antenna MA) and an RFID chip (CM, IC) disposed on the opposite side (or surface; bottom, as viewed) of the module tape (MT). The planar antenna (PA) is disposed around the RFID chip (CM, IC). The planar antenna (PA) has two ends—an inner end disposed interior to the planar antenna (PA) (towards the RFID chip), and an outer end disposed exterior to the planar antenna (PA). The inner end of the planar antenna (PA) may be connected directly (dashed line "----") to a terminal (such as "LA") of the RFID chip (IC, CM). However, the other, outer end of the planar antenna (PA) must "cross over" the planar antenna (PA) in order to be connected (dashed line "---") with a second terminal (such as "LB") of the RFID chip (IC, CM). This can be done with interconnect traces (not shown) on the face-down (bottom, as viewed) side of the module tape (MT). Alternatively, as indicated in FIG. 2B, the outer end of the planar antenna (PA) structure may connected, through the module tape (MT) to an outer end of a connection bridge (CBR) disposed on the face up (top, as viewed) side of the module tape (MT), the connection bridge (CBR) can extend to a position corresponding to (above) the interior of the planar antenna (PA) structure, and a connection can be made from the inner end of the connection bridge (CBR), through the module tape (MT) to a second terminal (such as "LB") of the RFID chip (IC, CM).

FIG. 2B shows an antenna module (AM) or transponder chip module (TCM) 200 having a contact pad array (CPA) 202 comprising of 8 contact pads (C1-C8). The transponder chip module (TCM) also has two connection bridges (CBR-1, CBR-2) 210, 212 on its contact (face-up) side of the module tape (MT, not shown). An RFID chip (CM, IC, not shown) and a module antenna (MA, shown in dashed lines) may be disposed on the face-down side (not visible) of the module tape (MT). A border is shown around the transponder chip module (TCM), which may represent an opening (WO) in a card body (CB, or inlay substrate) for the transponder chip module (TCM).

The connection bridges (CBR-1, CBR-2) and contact pads (C1-C8) may be formed from a common conductive layer or foil of copper (for example), such as on a single-sided module tape (MT) which may have a conductive layer (or foil) on its face-up side having a thickness of 35 µm. The module tape (MT) may also be double-sided, having conductive layers (foils) on both its face-up and face-down sides. Having two connection bridges (CBR-1, CBR-2) may be useful in circumstances (i) when there are two module antennas (MA-1, MA-2), or (ii) when there is a single module antenna (MA) with a center-tap, or (iii) when there is a single module antenna (MA) with both of its ends oriented outward (and otherwise needing to cross-over the antenna structure AS).

The input capacitance of an RFID chip can vary with different production batches of silicon. To compensate for drifts in the input capacitance, the length of the last turn of the module antenna can be varied by having electrical taps at different positions along its length. By selecting the appropriate length, the loaded resonance frequency of the antenna can be tuned to optimize performance. Alternatively, capacitive stubs can be laser trimmed to accomplish the same objective. These techniques allow for trimming the performance of the module antenna (MA) for different chip batches The module antenna (MA) may be a planar antenna (PA) which may be an etched (chemical or laser) antenna structure (AS). Alternatively, the module antenna (MA) may be a non-planar, wire-wound antenna structure (AS).

The connection bridge (CBR-1) 210 is shown disposed adjacent to and above (as viewed) the C1 contact pad, is generally "L-shaped", and extends from an outer position (indicated by a round dot "•") which corresponds to a position which is without (external to) the module antenna (MA) on the other side of the module tape (M) to an inner position (indicated by an "X") which corresponds to a position which is within (internal to) the module antenna (MA) on the other side of the module tape (MT). Connections of components on the underside (face down side) of the module tape (MT) may be made to the connection bridge (CBR-1) to achieve interconnects (such as illustrated in FIG. 2A) which may otherwise require troublesome cross-overs or additional interconnect layers. Notably, in this illustration, an outer end of the module antenna (MA) on the underside of the module tape (MT) may be connected to the outer position ("•") of the connection bridge CBR-1, and a terminal of the RFID chip (not shown, see FIG. 2A) may be connected to the inner position ("X") of the connection bridge CBR-1.

The second connection bridge (CBR-2) 212 is shown disposed adjacent to and above the C5 contact pad, and may be substantially a mirror image of the connection bridge (CBR-1), may be used to effect other or additional connections (not shown or described), and will not be described further. Having two connection bridges is optional. In cases where only one connection bridge is needed, the connection bridge (CBR-2) may suffice. Connection bridges may alternatively or additionally be positioned below the contact pads (CP) of the contact pad array (CPA), rather than above it. For example, in a 6-pad module which does not have the C4 or C8 contact pads, what may otherwise appear to be the C4 or C8 contact pads may in fact be connection bridges (CBR-3, CBR-4).

Some additional characteristics of the L-shaped connection bridge (CBR-1 or CBR-2) may include at least one of the following (described mainly with respect to CBR-1, but applicable to CBR-2 as may be evident from the context):

- The L-shaped connection bridge may have a first portion which is external to the module antenna (MA) on the other side of the module tape (MT), and may extend horizontally (as viewed) above the C1 pad and parallel to the insertion direction, measuring approximately 4 mm (in the insertion direction)×2 mm (perpendicular to the insertion direction), and is "elongated" (longer than it is wide).
- The L-shaped connection bridge may have a second portion, which is generally perpendicular to the insertion direction, such as extending vertically (as viewed) next to the C1 pad, and extending from an end of the first portion to a position which is within the contact pad array, between the C1 and C5 pads, and may measure approximately 2 mm (in the insertion direction)×4 mm (perpendicular to the insertion direction), and is "elongated" (longer than it is wide).
- In FIG. 2B, there is a vertical dashed line in the connection bridge (CBR-1) 210. To the left of the line is the first portion 210a (parallel to the insertion direction) of the connection bridge, to the right of the line is the second portion 210b (perpendicular to the insertion direction) of the connection bridge.

Laser-Etched Antenna Structures (LES)

U.S. Ser. No. 14/281,876 filed 19 May 2014 (US 20140284386 25 Sep. 2014) discloses LASER ABLATING STRUCTURES FOR ANTENNA MODULES FOR DUAL INTERFACE SMARTCARDS. Laser etching antenna structures for RFID antenna modules (AM) and combining laser etching and chemical etching are disclosed. Limiting the thickness of the contact pads (CP) to less than the skin depth (18 μm) of the conductive material (copper) used for the contact pads (CP). Multiple antenna structures (AS1, AS2) in an antenna module (AM), and incorporating LEDs into the antenna module (AM) or smartcard (SC) are also disclosed.

Generally, the transponder chip modules (TCM) disclosed herein may have a copper layer for forming a planar module antenna (MA, PA) which may have a thickness greater than or almost equal to the skin depth of copper (~18 μm), for example 18 μm-35 μm, but it could also be 12 μm. The module antenna (MA) may be directly underneath the contact pads (CP) or connection bridges (CBR).

Generally, in practice, the thickness of metal cladding (metal layer ML, conductive layer CL) on one or both sides of a single-sided or double-sided module tape (MT), respectively, which may be laser-etched to form contact pads (CP) on the face-up side of the module tape (MT), a planar antenna (PA) on the face-down side of the module tape (MT), and a coupling frame (CP) on either side of the module tape (MT) is not less than 18 μm. A coupling frame (CF), described hereinbelow, should have a thickness greater than the electromagnetic transparency of the metal layer in question. In the case of single- or double-sided copper-clad module tape (MT), the metal layer typically has a thickness of 18 μm or 35 μm.

Laser etching is a form a laser ablation where material may be removed from a typically planar sheet (or foil) of material, and has some advantages over conventional wet etching (chemical etching). A laser etch can proceed more uniformly through the material being etched, and can also be controlled such as by increasing or decreasing the laser power and subsequent etching at various portions of a pattern being etched, in a highly-controllable manner. (With conventional wet/chemical etching, the width of the etch may be tapered, narrowing from the surface of the material being etched to the bottom of the etched feature. In contrast therewith, with laser etching, straight wall etching can be achieved whereby the sides of the feature being etched may be substantially parallel with one another.)

Using laser etching, the spaces between tracks of an antenna structure (AS, MA, PA) may be dimensionally equal to the width of the laser beam, such as approximately 25 μm. The tracks themselves may have a width of 25-100 μm. If a coupling frame (CF) is formed from the same metal layer (ML) as the planar antenna (PA), a gap (space) between the outer track of the planar antenna (PA) and an inner edge (IE) of the coupling frame (CF) may also be equal to the width of the laser beam, such as approximately 25 μm. After plating, the dimension of the spaces/gap may be smaller, by a few microns, such as 20 μm.

The antenna (or antenna structure AS) may be laser etched from a copper layer (cladding or foil), which may have a thickness less than the skin depth of copper (18 μm), forming a number of tracks separated by a distance approximately equal to the width of the laser beam, such as approximately 25 μm. Subsequent to laser etching, the antenna structure may be plated, which may reduce the distance between tracks to approximately 20 μm (for example). This may result in increased performance of the antenna structure, and the overall antenna module AM (or transponder chip module (TCM)), and reduce performance constraints on the performance of a booster antenna (BA) in the card body (CB) of the smartcard (SC). The track width may be less than 100 μm, and the spacing between tracks may be less than 50 μm.

The antenna structure (AS) may be formed by laser etching, having a number of (such as 10 or 12) tracks which are disposed substantially planar with one another on a module tape (MT) or other suitable substrate, in a generally rectangular spiral pattern. The spacing between tracks may be on the order of 25 μm, or less (such as 20 μm, after plating).

As described in U.S. Ser. No. 14/465,815 filed 21 Aug. 2014, the track width on the laser-etched antenna structure (LES) can be varied, from end-to-end, to improve performance, in contrast with an antenna structure having a single (constant) track width. By way of analogy, this could be viewed as more than one antenna, each having a different track width, connected in series with one another. As an example, a first portion of an antenna structure may have a track width of 100 μm, another portion may have a track width of 50 μm. Additional portions may have other track widths. The spacing between tracks may also be varied. For example, the spacing between some tracks may be 25 μm or less, the spacing between some other tracks may be more than 25 μm. The ability to vary track width and spacing may be helpful in fine-tuning the performance of the module, with attendant benefits in activation distance (for example).

Coupling Frames

As mentioned in U.S. Ser. No. 14/465,815 filed 21 Aug. 2014, a smartcard (SC) may comprise an electrically-conductive layer, referred to herein as a "coupling frame" (CF) disposed in the card body (CB) around at least two sides (or 180°) of a transponder chip module (TCM) so as to be in close proximity with the module antenna (MA) in the transponder chip module (TCM). The coupling frame (CF) may nearly completely surround the transponder chip module (TCM), such as all four sides (or 360°) thereof, minus a slit (S). The slit (S) may be very small, such as 50 μm. A coupling frame (CF), at least partially surrounding a transponder chip module (TCM) and residing substantially on the same plane as the laser-etched antenna structure (LES) in a card body, document or tag, without creating a closed circuit around the transponder chip module (TCM) by leaving at least one space or gap as an open circuit such as a cut-out, slit or slot in the coupling frame (CF), may increase the amplitude of the resonance curve of the transponder chip module (TCM) with minimal frequency shift when interrogated by a reader, and may increase the activation distance.

As further described in U.S. Ser. No. 14/465,815, a coupling frame (CF), should be thick enough to conduct electricity and absorb an electromagnetic wave at a frequency of interest and enhance coupling between the transponder chip module (TCM) and an external reader (such as in FIG. 1). The coupling frame (CF) may be closely adjacent to, but not completely encircle (substantially surround), the transponder chip module (TCM), and may extend from adjacent the transponder chip module (TCM) to one or more outer edges of the metal layer (ML), which may be substantially coincident with the outer edges of the card body (CB).

As further described in U.S. Ser. No. 14/465,815, a metal surface or a conductive surface of suitable thickness and dimension acting as a coupling frame (CF) can replace (or obviate the need for) a booster antenna (BA) in a dual interface smartcard (SC). The coupling frame in a card body (CB), tag, document or the like, may act as a capacitive coupling antenna, concentrating the electromagnetic field around the transponder chip module (TCM) which may have a laser-etched antenna structure (LES).

It should be understood that the concepts associated with the coupling frame (and slotted metal layer in a card body), disclosed herein may provide performance benefits with other than laser-etched antenna structures (LES), such as with chemically-etched antenna structures (CES).

Generally, both laser-etched antenna structures (LES) and chemically-etched antenna structures (CES) may be considered to be and referred to herein as planar antenna (PA) structures. A planar antenna (PA) structure may be may be connected with an RFID chip (IC, CM) to form a transponder chip module (TCM) or antenna module (AM), and may also be referred to as a module antenna (MA). The planar antenna (PA) may be referred to as a module antenna (MA) or as an antenna structure (AS).

The performance of a planar antenna (PA) structure in a transponder chip module (TCM) may be enhanced by surrounding the antenna structure (AS) with a metal frame (MF), or coupling frame (CF), in the card body (CB) of the smart card (SC).

The coupling frame, may be smaller than ID-1 format, such as half or quarter ID1 size. The ID-1 format (ISO/IEC 7810) specifies a size for cards of 85.60 mm×53.98 mm (3.370× 2.125 in) and rounded corners with a radius of 2.88-3.48 mm. It is commonly used for banking cards (ATM cards, credit cards, debit cards, etc.). It is also used for driving licenses in many countries. This format is also used for personal identity cards in some countries, automated fare collection system cards for public transport, in retail loyalty cards, and it is a fairly common format for business cards. The United States Passport Card, as well as most EU identity cards also use the ID-1 format.

The ISO/IEC 7810 standard defines four card sizes: ID-1, ID-2, ID-3 and ID-000. [3]

| Format | Dimensions | Usage |
| --- | --- | --- |
| ID-1 | 85.60 × 53.98 mm | Most banking cards and ID cards |
| ID-2 | 105 × 74 mm | German ID cards issued prior to November 2010 |
| ID-3 | 125 × 88 mm | Passports and visas |
| ID-000 | 25 × 15 mm | SIM cards |

All card sizes have a specified thickness of 0.76 mm (0.030 in).

The present invention is not limited to any particular card size format. It is directed to a capacitive coupling enhanced (CCE) transponder chip module (TCM) which can function on its own, and which may be implanted in a smart card (SC) without requiring a booster antenna (BA).

Capacitive Coupling Enhanced (CCE) Transponder Chip Module (TCM)

Generally, a coupling frame (CF) may be incorporated into an antenna module (AM) or transponder chip module (TCM), and may be formed from the same conductive layer (CL) as the contact pads (CP) on the face-up side of the module tape (MT). Alternatively, the coupling frame (CF) (or additionally, a second coupling frame) may be formed from the same conductive layer (CL) as a module antenna (MA), such as an etched planar antenna (PA), on the face-down side of the module tape (MT). Such a transponder chip module (TCM) with a coupling frame (CF) integrated therewith may be referred to herein as a "capacitive coupling enhanced" (CCE) transponder chip module (TCM).

The coupling frame (CF) may be in the form of a ring (such as a rectangular ring) having an opening (OP), an inner edge (IE) which defines the opening, and an outer edge (OE). A discontinuity which may be a slit (S) or a non-conductive stripe (NCS) may extend from the inner edge (IE) or opening (OP) to the outer edge (OE) so that the ring of the coupling frame (CF) is an open loop (discontinuous) conductor having two ends and a gap (which is the slit) therebetween.

The coupling frame (CF) may be disposed with its inner edge (IE) closely adjacent to and partially surrounding the module antenna (MA) of a transponder chip module (TCM), and may be substantially coplanar with the module antenna (MA). The coupling frame (CF) may surround at least two sides of the planar antenna (PA) structure, such as three sides thereof, or all four sides (except for the slit). When the term "partially surrounding" is used herein, it generally may refer to such a coupling frame (CF) which substantially surrounds (except for the slit, slot or gap) the module antenna (MA) of the transponder chip module (TCM). The coupling frame (CF) comprises a suitable electrically-conductive material capable of interacting with RF from the module antenna (MA) and an external RFID reader, enhancing coupling between the transponder chip module (TCM) and the external reader.

Both of the inner edge (IE) and the outer edge (OE) of the coupling frame (CF) may have the same geometric form (shape), such as rectangular. The inner edge may have a geometric form (such as substantially rectangular) corresponding to the geometric form of the module antenna (MA). The outer edge (OE) of the coupling frame (CF) may have a different geometric form (such as round or elliptical).

According to some embodiments of the invention, at least one coupling frame (CF) may be formed or disposed on a common substrate, such as an epoxy—glass module tape (MT) or chip carrier tape (CCT) with at least one of:
- an RFID chip (IC, or CM), and
- an antenna structure (AS) which may be a module antenna (MA) or a planar antenna (PA),
  - a planar antenna (PA) structure may be a laser-etched structure (LES) or a chemically etched structure (CES), A transponder chip module (AM, TCM), which may be incorporated into a smartcard (SC), may comprise an array of typically 6 or 8 contact pads (CPs) for interfacing with an external contact reader (e.g., ISO 7816). One or more connection bridges (CBRs) in the transponder chip module (TCM) may be used for making interconnections between components (such as the module antenna MA and RFID chip IC) within the transponder chip module (TCM). The contact pads (CPs) and connection bridges (CBRs) may be formed from a common conductive layer on the front (face-up) surface of the transponder chip module (TCM). Other isolated features may be formed from the conductive layer, such as decorative strips or areas where logos may be presented. The transponder chip module (TCM) may have both contact (ISO 7816) and contactless (ISO 14443, 15693) interfaces. See, for example, US 20140104133, particularly FIGS. 1, 1A, 21 and 21A-E thereof.

Some of the concepts disclosed with respect to coupling frames (CF) on the module tape (MT) of a capacitive coupling enhanced (CCE) transponder chip module (TCM) may be applied to coupling frames (CF) incorporated into the card body (CB) of a smart card (SC), and vice-versa. Coupling frames CF) in card bodies (CB) may be disclosed in the aforementioned commonly-owned, copending U.S. Ser. No. 14/465,815 filed 21 Aug. 2014. Regarding such coupling frames which are in card bodies (such as in "metal cards"), some may comprise titanium, some others may comprise stainless steel, tungsten or aluminum, and some others may comprise a dielectric layer with a deposited layer of metal.

Generally, in some embodiments of a coupling frame (CF) disclosed in a card body (CB), a planar layer or sheet or foil or cladding of a conductive material may be integrated into the card body (CB) and extend substantially to the periphery of the card body (CB). An ISO card body may have a dimension of 85.60 mm×53.98 mm/s63

An opening (MO, OP) may be formed in the coupling frame (CF), which may be approximately the size of an antenna module (AM) or transponder chip module (TCM) (either of which may simply be referred to as "module") which may be,
- for a 6 pad module 8.0 mm×10.6 mm
- for an 8 pad module, 11.4 mm×12.6 mm The metal of the coupling frame (CF) serves at least two purposes. It may add weight to the smart card (SC), for vanity purposes (a better feel, and sound when tapping on a table). It also may enhance the electrical functionality (such as read/write distance) of the smart card. A typical metal for the coupling frame (CF) may be titanium.

Plating or Depositing Metal on a Dielectric

To achieve the purpose of adding weight to a smart card, some dielectric materials may be used. However, these dielectric materials are not electrically conductive.

To achieve the purpose of enhancing the electrical functionality of the smart card, the conductive coupling frame (CF) may be formed (created, fabricated) on a dielectric substrate, using any suitable means of depositing (sputtering, or growing, or including electroless plating). Alternatively, a conductive layer, such as a metal foil, may be adhesively attached to the dielectric substrate. In either case, a blanket layer of conductive material may be patterned as a coupling frame (CF) either before, during or after being disposed on the dielectric substrate.

Another method to incorporate a coupling frame (CF) into (for example) a smart card (SC) made from a dielectric material is to form the smart card (SC) from more than one layer of material. One or more of the layers may be processed to have a recess (or cavity) in a surface thereof for receiving the coupling frame (CF), so that the coupling frame (CF) may be substantially flush with the surface. The coupling frame (CF) may be disposed in a cavity in the card body (CB). The cavity for the coupling frame (CF) may be sized and shaped to accommodate other components including a screen printed, gravure printed, chemically etched or wire-embedded booster antenna (BA) on a suitable substrate. To complete the card construction the card layers may be laminated together using some form of adhesive or binding agent. The use of a coupling frame (CF) may have advantages over traditional booster antenna (BA) systems in that the coupling frame (CF) can be formed from a foil of solid metal with extremely high thermal resistance. This permits the placement of the coupling frame (CF) inside the card at an early stage of manufacture of the cards.

Another way to incorporate a coupling frame (CF) into a card body (CB may be to start with a coupling frame (CF), and grow or extrude a material such as ABS (Acrylonitrile butadiene styrene) around the coupling frame (CF).

A multi-layer card body (CB) may require subsequent high temperature processing (laminating) to fuse the layers of the card. Since a coupling frame (CF) made from metal foil (for example) may be highly thermally resilient, the laminating process should have no negative effect on the coupling frame (CF).

The concept of a metallized coupling frame (CF) can be applied to cards made from a unibody construction of electrically insulating material (e.g. a, polymer composite). The concept can be extended to cards made from composite materials containing metallic particles or other fillers residing inside an insulating matrix.

A coupling frame (CF) may be formed on such unibody card bodies by electroless deposition of a metal (e.g. copper, aluminum, nickel) followed by subsequent growth of additional metal by electroplating. The metallization can be applied to one or both sides of the card body (CB). The coupling frame (CF) may be then be left as exposed metal, or it may be covered by a conformal dielectric coating or other insulating film to (i) prevent ESD (electrostatic discharge), (ii) obscure the presence of the coupling frame (CF), and (iii) protect the metallization from wear and tear during use of the card. Alternatively a metal foil, or laminate containing a metal foil, may be affixed to one or both surfaces of the card. The metal foil may be patterned in a way to serve as a coupling frame (CF).

Transponder Chip Module (TCM) with a Coupling Frame (CF)

FIG. 3A shows the face-up side of a capacitive coupling enhanced (CCE) transponder chip module (TCM) 300, which may comprise:
- a module tape (MT) 301 or chip carrier tape (CCT),
- a transponder chip module (TCM) 302 having
  - a module antenna (MA) 304 which may be a planar antenna (PA), and an RFID chip (IC) 305 on the face-down side of the module tape (MT), shown in dashed lines, and
  - contact pads (CP) C1-C8) and connection bridges (CBR-1, CBR-2) on the face-up side of the module tape (MT), a coupling frame (CF) 320 disposed on either side of the module tape (MT), surrounding and closely adjacent to the module antenna (MA), so that it may interact with the module antenna (MA) and enhance coupling between the transponder chip module (TCM) and an external contactless reader.

The transponder chip module (TCM) itself corresponds generally to the transponder chip module (TCM) shown in FIG. 2B, but a coupling frame (CF) has been added.

In many embodiments of antenna modules (AM) and transponder chip modules (TCM), the RFID chip (IC) is disposed at an area of the module tape (MT) prepared for mounting the RFID chip (IC), and may be installed on the module tape (MT) and connected with the module antenna (MA) at a later date and at a different location than where the module tape (MT) with its contact pads (CP) and planar module antenna (PA, MA) is initially manufactured. This would apply to the capacitive coupling enhanced transponder chip modules (CCE-TCM) disclosed herein. The module tape (MT) with its contact pads (CP) and planar module antenna (PA, MA) may thus be considered to be an "interim product". In FIG. 3A, the dashed line 305 is representative of this area for mounting the RFID chip (IC). In other figures, wherever an RFID chip (IC) is shown or described, this is also indicative of an area for mounting the RFID chip (IC).

The module tape (MT, CCT) may comprise epoxy-glass, 35 mm wide. Some dimensions for the transponder chip module (TCM) and coupling frame (CF) are shown. FIGS. 5A, 5B show the module tape (MT) better. The module tape (MT) serves as a substrate upon which the transponder chip module (TCM) is constructed. The module tape (MT) may be referred to as a "chip carrier tape" (CCT).

A planar antenna (PA) 304 may be provided on an opposite (face-down) side of the module tape (MT) of the Transponder Chip Module (TCM), and is shown only generally in dashed lines. This corresponds generally to the transponder chip module (TCM) shown in FIG. 2B. The planar antenna (PA) may be laser-etched. Alternatively, the planar antenna (PA) may be chemically etched. Only a few turns (or tracks) of the planar antenna (PA) are shown, for illustrative clarity. There may be 10-12 turns, depending on the input capacitance of the RFID chip. The outer turn of the planar antenna (PA) may extend nearly to a position corresponding to the periphery of the contact pad array on the other side of the module tape (MT).

A coupling frame (CF) 320 may be disposed on a face-up side of the module tape (MT), and is shown surrounding the contact pads (CP) and connection bridges (CBR) 310, 312. In this example, the coupling frame (CF) is disposed on the same face-up side of the module tape (MT) as the contact pads (CP) and connection bridges (CBR), and may be formed from the same conductive layer (CL) or metal layer (ML) that forms the contact pads (CP) and connection bridges (CBR). The conductive metal layer (CL, ML) may be, for example, 18 μm or 35 μm thick copper. The coupling frame (CF) may extends around the contact pad array (CPA), including around the connection bridges (CBR). If the coupling frame (CF) is disposed on the face-down side of the module tape (MT), it may be formed from the same conductive layer (CL) or metal layer (ML) that forms the etched planar module antenna (MA, PA).

The coupling frame (CF) has an inner edge (IE) 322 defining an opening (OP) 323 in the coupling frame (CF) and has an outer edge (OE, or periphery) 324. A slit (S, or slot, or gap) (S) 326 extends from the inner edge (IE) or opening (OP) of the coupling frame (CF) to the outer edge (OE) thereof, so that the coupling frame (CF) forms an open-loop conductive element ("C" shaped) having two ends (end-1, end-2) separated by the slit (S). The slit (S) may measure approximately 50 μm (between the opposing ends of the coupling frame), or smaller, such as 25 μm or 10 μm. The slit (S) results in the two opposing ends of the coupling frame being closely spaced with one another, so that the coupling frame may nearly completely encircle the transponder chip module (TCM) 302A, and its module antenna (MA).

On the other (face-down) side of the module tape (MT), the planar antenna (PA) and connection traces (not shown) to the bond pads (BP), may be formed from a metal layer (e.g., 18 μm or 35 μm thick copper) with a thickness similar to the metal layer (ML) that forms the contact pads (CP) and connection bridges (CBR).

The coupling frame (CF) may be disposed on the face-down side of the module tape (MT), surrounding the module antenna (MA), closely spaced therefrom, and coplanar therewith. When the coupling frame (CF) is disposed on the face-up side of the module tape (MT), surrounding the contact pads (CP), it is offset from the module antenna (MA) only by the thickness of the module tape (MT), and may be considered to be substantially coplanar with the module antenna (MA). And, being on the opposite side of the module tape (MT) from the module antenna (MA), an inner portion of the coupling frame (CF) can overlap at least some outer turns of the module antenna (MA). The module tape (MT) may have a thickness of approximately 75 μm-100 μm. (The thickness of the glass epoxy layer may be in the range from 70 to 100 μm, before the copper layer(s) are added.)

The outer periphery of the contact pad array (CPA) is shown as being rectangular. An inner edge of the coupling frame (CF) is shown as being rectangular. A gap 328 separates the inner edge of the coupling frame (CF) from the outer periphery of the contact pad array (CPA) and connection bridges (CBR-1, CBR-2). The gap may be approximately 100 μm, or less. An outer edge of the coupling frame (CF) may also be rectangular. Some exemplary dimensions (approximate) may be:

- contact pad array (CPA), 10.6 mm×8.0 mm (for a 6 pad array)
  - area of contact pad array (CPA), approximately 85 mm$^2$
  - area of the planar antenna (PA) structure, somewhat less than that of the CPA
- inner edge of coupling frame, 10.7 mm×8.1 mm
  - opening in the coupling frame (CF) for the contact pad array (CPA), 87 mm$^2$
- outer edge of coupling frame, 26 mm×28 mm (728 mm$^2$)
  - area of coupling frame (CF), 728 mm$^2$-87 mm$^2$=641 mm$^2$ When the coupling frame (CF) is disposed on the same face-down side of the module tape (MT) as the planar antenna (PA), a gap between the inner edge of the coupling frame and an outer turn (or track) of the planar antenna (PA) may similarly be approximately 100 μm, or less.

In this example, the coupling frame (CF) has an area which is approximately 7 times larger than the area of the planar antenna (PA) structure. For an 8 pad array, this ratio may be less.

- all dimensions approximate (exemplary)
  - the coupling frame (CF) may be disposed on either side of chip carrier tape (CCT)—i.e., on the "face-up" contact side or on the "face-down" chip (or bond) side.
  - the coupling frame (CF) may be much larger than shown
  - a second coupling frame (CF-2, not shown) may be disposed on the tape, and may be connected with the illustrated coupling frame (CF-1)

The slit (S) in FIG. 3A is shown extending from the opening (OP), which is defined by the inside edge of the coupling frame (CF), to the outside edge thereof, at a position to the left of the transponder chip module (TCM) 304. The slit (S) makes the coupling frame (CF) an open loop—"C" shaped, having two ends. It should be understood that the slit (S) may be located elsewhere, such above the transponder chip module (TCM), to the right of the transponder chip module (TCM), or below the transponder chip module (TCM). It is important that the slit (S) extends anywhere from the inner edge of the coupling frame (CF) to the outer edge thereof, thereby making the coupling frame (CF) a conductive open loop, having two ends. In other words, the coupling frame is a "C", not an "O".

FIG. 3A-1 shows a detail of the two ends of the coupling frame (CF) shown in FIG. 3A. Here, the ends (end-1, end-2) are square and parallel with one another, the coupling frame (CF) having been intersected at a right angle by a straight slit (S). The slit (S) results in two opposing ends of the coupling frame being closely spaced with one another, so that the coupling frame may nearly completely encircle the transponder chip module (TCM) 302A (or 302B, below). The coupling frame (CF) extends nearly entirely around the transponder chip module (TCM)—such as "359°" around it (360° minus the slit S).

FIG. 3A-2 shows a variation of the two ends of the coupling frame (CF) shown in FIG. 3A. Here, the ends (end-1, end-2) are each stepped, the coupling frame (CF) having been intersected by a non-straight slit (S). In this example, the slit (S) is stepped. The coupling frame (CF) extends nearly entirely around the transponder chip module (TCM)—such as "359°" around it (360° minus the slit S). A similar result may accrue with the slit (S) is other than perpendicular to the outer edge (OE) of the coupling frame (CF), for example, extending through the coupling frame (CF) from the outer edge to the inner edge thereof, at a 45° angle. Compare FIG. 3D. The dashed line passing through the ends of the coupling frame indicates that any line perpendicular to an outer edge of the transponder chip module (TCM), or perpendicular to the inner edge (IE) of the coupling frame (CF), will always intersect at least a portion of the coupling frame (CF)—in which case the coupling frame (CF) may be said to completely surround the transponder chip module (TCM) and its module antenna (MA). Compare FIG. 3A wherein the dashed line passes through the slit (S).

An alternative to forming a slit (S) is to render a comparable area of the conductive metal layer (ML) of the coupling frame (CF) non-conductive, providing an electrical discontinuity (rather than a physical slit) to ensure that the coupling frame is open-loop. Such a non-conductive discontinuity may be referred to as a "non-conductive stripe" (NCS).

FIG. 3B illustrates a capacitive coupling enhanced (CCE) transponder chip module (TCM) 300B comprising a transponder chip module (TCM) 302 and a coupling frame (CF) 324 disposed on a module tape (MT) 301 such as (similar to the one) shown in FIG. 3A, and similar elements may be similarly numbered (suffix "B" rather than "A"). The coupling frame (CF) extends around the contact pad array (CPA), including around connection bridge 310, with a gap 328 therebetween, and has a slit (S) 326 making it an open loop, having an outer edge (OE), and an inner edge (IE) defining an opening (OP). The slit (S) extending from the opening (OP) to the outer edge (OE) results in two opposing ends of the coupling frame (CF) being closely spaced with one another, so that the coupling frame may nearly completely encircle the transponder chip module (TCM) 302. An etched planar antenna (PA) 304 and RFID chip (IC) 305 may be disposed on an opposite side of the module tape (MT).

As described above, the coupling frame (CF) may be disposed on the face-up side of the module tape (MT), surrounding the contact pads (CP) and overlapping (or being above) the module antenna (MA) on the face-down side of the module tape (MT). The module antenna (MA) may be a planar antenna (PA) which may be laser etched.

A connection bridge (CBR) may be an isolated metal structure on the face-up (contact) side of the module tape (MT) for effecting connections between components such as the module antenna (MA, PA) and RFID chip (CM, IC) on the other, face-down side of the module tape (MT), more particularly to avoid the necessity for interconnect structures or cross-overs on the face-down (chip) side of the module tape (MT). An example of a connection bridge (CBR) is shown in US 20130146670, wherein it may be referred to as a connecting structure or contact bridge.

The coupling frame (CF) 320 may be extended to the interior of the contact pad array (CPA), on the top (as viewed) of the contact pad array (CPA) between the C1 and C5 contact pads, and may serve as a connection bridge (CBR) 310B effecting a connection between a first position (indicated by the dot "•") which corresponds to a position which is without (external to) the module antenna (MA, PA) on the other side of the module tape (MT) and a second position (indicated by the "X") which is within (interior to) the module antenna (MA, PA) on the other side of the module tape (MT). Or, in other words, a connection bridge (CBR) may be enlarged to nearly encircle the transponder chip module (TCM) to serve "double duty" as a coupling frame (CF). The coupling frame (CF) may be considered to be integral with the connection bridge (CBR), and vice-versa (a connection bridge may be extended around the contact pad array to serve as a coupling frame). The resulting "hybrid" connection bridge (CBR)/coupling frame (CF) may have a surface area much much (>>) greater than the surface area of a normal contact pad (CP).

The coupling frame (CF) may be somewhat effective if it extends around at least two (of the four) sides of the contact pad array (CPA) may be more effective if it extends around at least three sides of the contact pad array (CPA), and may be most effective if it extends around nearly all four sides of the contact pad array (CPA), as shown. In the examples set forth above, the coupling frame (CF) is formed in the same layer as the connection bridge(s) and contact pads (CP), on the same side of the module tape (MT), and extends substantially all around the contact pad array (except for the slit S). A coupling frame (CF) may be disposed on an opposite side of the module tape (MT), surrounding and closely adjacent to the module antenna (MA), and may be most effective if it extends completely around the module antenna (MA), except for the slit (S).

The coupling frame (CF) may be integral with (FIG. 3B) or connected in any suitable manner with the connection bridge, if desired. When the connection bridge is connected with an end of a module antenna (MA), the connection bridge (including, in some embodiments, the hybrid connection bridge/coupling frame) may function as a capacitive extension of the module antenna (MA). In a double-sided tape, a conductive layer on a side of the module tape opposite from the coupling frame may contribute to the capacitance of the coupling frame. The coupling frame/connection bridge may be patterned with holes, slits and the like.

FIG. 3C shows that the coupling frame (CF) may be disposed on the same side of the module tape (MT) or chip carrier tape (CCT) as the contact pads (CP), and indicates (by the cross-hatching) that it may be formed from the same conductive layer (CL) as the contact pads CP (and connection bridges CBR). The slit (S) is not visible in this cross-sectional view, which may be a cross-sectional view of the capacitive coupling enhanced (CCE) transponder chip module (TCM) 300 shown in FIG. 3A.

An RFID chip (CM, IC) may be disposed on the bottom (as viewed) side of the module tape (MT). In some subsequent views of other embodiments, the RFID chip may be omitted, for illustrative clarity. In some of the descriptions presented herein, a capacitive coupling enhanced (CCE) transponder chip module (TCM) may be referred to simply as a transponder chip module (TCM), or in some cases as an antenna module (AM). And, typically, the module antenna (MA) may be a planar antenna (PA).

FIG. 3D shows that the coupling frame (CF) may be much wider than the transponder chip module (TCM), such as nearly the entire width of a card body (CB) of a smart card (SC), such as approximately 80 mm wide. The transponder chip module (TCM) is disposed in the opening (OP) of the coupling frame (CF). The module tape (MT) is shown in dashed lines. This figure shows that the slit (S) may extend at an angle other than perpendicular to the outer edge (OE). The dashed line (---) passing through the slit (S) illustrates that any line perpendicular to the outer edge (OE) of the coupling frame (CF) will always intersect the coupling frame (CF)—in which case the coupling frame (CF) may be said to completely surround the transponder chip module (TCM) and its module antenna (MA). The module antenna (MA) and RFID chip (IC) are not visible in this view. As mentioned previously, some concepts relating to incorporating a coupling frame (CF) on a module tape (MT) of a capacitive coupling enhanced (CCE) transponder chip module (TCM) may be applied to incorporating a coupling frame (CF) into the card body (CB) of a smart card (SC), generally by substituting "module tape (MT)" for "card body (CB)", and vice-versa.

FIGS. 3D-3I, 3N are views of the face-up side of the module tape (MT) and omit a showing of the module antenna (MA) on the other side of the module tape (MT), for illustrative clarity. The module antenna (MA) is shown clearly in FIG. 3B (also a view of the face-up side), as well as in some cross-sectional views (for example, in FIGS. 3J,K,L).

FIG. 3E shows that the slit in the coupling frame (CF) may be other than straight, such as a zigzag slit or a slit which is becomes wider or narrow along its length.

FIG. 3F shows that a coupling frame (CF) may have two slits (slit-1, slit-2), each extending from its inner edge to its outer edge, and disposed (for example) on opposite sides of the transponder chip module (TCM). (This may be considered to be two C-shaped coupling frames, each surrounding only one side and portions of two adjacent sides of the transponder chip module TCM, with their ends facing each other.) A logo may be printed on or etched into the coupling frame (CF) (see FIG. 3N).

FIGS. 3G and 3H illustrate transponder chip modules (TCM) having coupling frames (CF) integrated therewith, and show that the transponder chip module (TCM) may have other than a rectangular shape (profile). In FIG. 3G, the overall shape of the transponder chip module (TCM) is elliptical, and the slit (S) is oriented towards the left. In FIG. 3H, the overall shape of the transponder chip module (TCM) is round, and the slit (S) is oriented towards the right.

FIG. 3I illustrates that the coupling frame (CF) of a transponder chip module (TCM) may extend asymmetrically from the contact pad array (CPA). For example, the coupling frame may extend approximately 10 mm to the left of the contact pad array (CPA), and approximately 50 mm to the right of the contact pad array (CPA), corresponding to the left and right edges of a smart card (SC, shown in dashed lines), respectively.

FIG. 3J shows that the coupling frame (CF) may be disposed on a side of the module tape (MT) or chip carrier tape (CCT) opposite to that of the contact pads (CP) and connection bridges (CBR)—in other words, on the same (face-down) side as the planar antenna (PA) structure. In this case, the coupling frame (CF) may be substantially coplanar with the planar antenna (PA) structure. An RFID chip (IC) may be disposed on the bottom (as viewed) side of the module tape (MT).

Generally, the RFID chip (CM, IC) is traditionally disposed on the face-down side of the module tape (MT), although it could alternatively be disposed on the face-up side of the module tape (MT). In the example of FIG. 3J, with the coupling frame (CF) on the face-down side of the module tape (MT), the RFID chip (CM, IC) may be disposed on the coupling frame (CF), including outside of (external) to the planar antenna (PA), rather than its "traditional" location centered under the contact pads (CP). Generally, what is important is the location of the coupling frame (CF), more particularly its opening (OP) and slit (S), with respect to the module antenna (MA, PA), and the RFID chip (IC) can be anywhere—all of these components (CF, MA, IC) (and the contact pads CP in the case of a dual-interface transponder chip module TCM) being disposed on the module tape (MT).

FIG. 3K shows that when the coupling frame (CF) is disposed on the same side of the module tape (MT) or chip carrier tape (CCT) as that of the contact pads (CP) and connection bridges (CBR), on an opposite side of the module tape (MT) from the planar antenna (PA). The planar antenna (PA) may be made larger, extending for example beyond the periphery of the contact pad array (CPA), and the coupling frame (CF) may overlap (albeit on an opposite side of the module tape MT) at least an outer portion of the planar antenna (PA) structure. An RFID chip (IC) may be disposed on the bottom (as viewed) side of the module tape (MT).

In this example, the coupling frame (CF) has an opening (OP) which may be smaller than the outer portion (outer turns) of the module antenna (MA) including, if the module antenna (MA) were larger, the opening (OP) may be smaller than the entire module antenna (MA). Nevertheless, the opening (OP) of the coupling frame (CF) may be generally concentric with the module antenna (MA), its inner edge (IC) may be considered to be within the definition of "closely adjacent" to the module antenna (MA), and the coupling frame CF) may considered to be within the definition of "partially surrounding" the module antenna (MA).

It may be noted that the coupling frame (CF) shown in FIG. 3K is on an opposite side of the chip carrier tape (CCT) from the planar antenna (PA) structure, and therefore is not 100% coplanar with the planar antenna (PA) structure. However, given the small thickness (approximately 100 μm) of the chip carrier tape (CCT), the coupling frame (CF) may nevertheless be considered to be "substantially coplanar" with the planar antenna (PA) structure. The plane of the coupling frame (CF) is substantially (if not perfectly) parallel with the plane of the planar antenna (PA) structure (since the two sides of the chip carrier tape (CCT) are substantially parallel with one another). It may be noted that the coupling frame (CF) shown in FIG. 3K overlaps at least a portion of the planar antenna (PA) structure. An inner portion of the coupling frame (CF) may overlap some outer turns (tracks) of the planar antenna (PA) structure. (The chip carrier tape (CCT) or module tape (MT) may typically have a thickness of 70 μm or 110 μm, with copper cladding on one or both sides having a thickness of typically 12 μm, 18 μm or 35 μm.

It may be noted that the inner edge (IE) of the coupling frame (CF) shown in FIG. 3K defines a central opening (OP) in the coupling frame (CF), and the contact pads (CP) may be formed in that opening. The contact pads (CP) are isolated metal structures, with gaps therebetween. A given contact pad (e.g., C5, which is ground) may be connected to, contiguous with, the coupling frame (CF). The opening (OP) in the coupling frame (CF) may be aligned with (over, atop) the module antenna (MA) on the other side of the module tape (MT), and an inner portion (near the opening OP) of the coupling frame (CF) may overlap an outer portion (the outer tracks/turns) of the module antenna (MA). The cross-dimension (e.g., inner diameter) of the opening (OP) may be smaller than the cross-dimension (e.g., outer diameter) of the module antenna (MA). This is facilitated by the coupling frame (CF) and module antenna (MA) being on opposite sides of the module tape (MT).

In FIG. 3J, with the coupling frame (CF) and module antenna (MA) on the same side of the module tape (MT), achieving an overlap may require an additional layer, and may require a coupling frame which is formed from a separate metal foil which is disposed on the module tape. Nevertheless, "as is", with the coupling frame (CF) formed from the same metal layer (ML) as the module antenna (MA), or planar antenna (PA), a very small gap (such as 25 μm) may be maintained between the inner edge (IE) of the coupling frame (CF) and an outer track of the module antenna (MA).

U.S. Ser. No. 14/465,815 filed 21 Aug. 2014 discloses a coupling frame in a card body of a smart card, and positioned so that its inner edge is as close as possible to the module antenna. However, due to mechanical considerations (such as allowing for milling the card body to accept the antenna module), it is difficult to maintain a very small gap between the coupling frame and the module antenna, when they are strictly coplanar with one another. FIG. 2C therein shows that an inner portion of the coupling frame can overlap some outer tracks of the module antenna (LES 212), but to allow for milling, the underlying coupling frame may be spaced by approximately 100 μm from the module antenna.

Maintaining a very narrow gap between the inner edge (IE) of the coupling frame (CF) and the module antenna (MA) may be easier to achieve when the coupling frame (CF) is integral with the module tape (MT), particularly when it is formed from the same metal layer (ML) as the module antenna or the contact pads.

FIG. 3L shows that one coupling frame (CF-1) may be disposed on one side of the module tape (MT) or chip carrier tape (CCT), and another coupling frame (CF-2) may be disposed on another side of the module tape (MT) or chip carrier tape (CCT). An RFID chip (not shown, compare FIG. 2A) may be disposed on the bottom (as viewed) side of the module tape (MT).

FIG. 3L bears some resemblance to FIG. 4A of U.S. Ser. No. 14/465,815 filed 21 Aug. 2014, which discloses SMART-CARD WITH COUPLING FRAME AND METHOD OF INCREASING ACTIVATION DISTANCE OF A TRANSPONDER CHIP MODULE. FIG. 4A therein illustrates an embodiment of a smartcard 400A having a multiple coupling frame stack-up. Here, there are two coupling frames (CF-1, CF-2) 421, 422 in different layers of the card body (CB), separated by a layer 423 of non-conductive material (such as PVC). The stack-up comprises a front face card layer 424, a first coupling frame (CF-1) 421, an internal card dielectric layer 423, a second coupling frame (CF-2) 422 and a rear face card layer 426. The first coupling frame (CF-1) surrounds the top, left and bottom edges of the transponder chip module (TCM) 410, and extends to the top, left and bottom edges of the card body (CB), and has a module opening (MO-1). The second coupling frame (CF-2) surrounds the top, right and bottom edges transponder chip module (TCM), and extends to the top, right and bottom edges of the card, and has a module opening (MO-2). In aggregate, the first and second coupling frames (which may be referred to as "420") cover nearly the entire surface of the card body 402 (less the area of the transponder chip module TCM). An activation distance of 40 mm was achieved. A similar concept of having two "partial" coupling frames may be applied to a capacitive coupling enhanced (CCE) transponder chip module (TCM) such as shown (for example) in FIG. 3L herein, with one coupling frame (CF-1) surrounding the transponder chip module (TCM) from the left, the other coupling frame (CF-2) surrounding the transponder chip module (TCM) from the right, in aggregate the two coupling frames surrounding the transponder chip module (TCM)

An overall coupling frame may comprise two or more substantially concentric, substantially coplanar open loops (each loop is an open circuit), formed on the same side of a single substrate. As used herein, "concentric" may refer to the openings in each of the loops being substantially aligned with one another, and substantially aligned with the module antenna (MA).

An overall coupling frame may comprise two or more substantially concentric, open loops (each loop is an open circuit) formed on opposite sides of a single substrate, or on two substrates which will be stacked one atop the other. As used herein, "concentric" may refer to the openings in each of the loops being substantially aligned with one another, and substantially aligned with the module antenna (MA).

FIG. 3M shows a purely contactless embodiment of the invention wherein there are two planar module antennas (PA, MA) or antenna structures (AS)—a first planar antenna structure (PA-1) on one side of the chip carrier tape (CCT) and a second planar antenna structure (PA-1) on an opposite side of the chip carrier tape (CCT). A single coupling frame CF is shown, on the bottom (as viewed) side of the chip carrier tape (CCT), but there may be two coupling frames CF-1 and CF-2 as shown in FIG. 3L, on each of the two sides of the chip carrier tape (CCT). An RFID chip (not shown, compare FIG. 2A) may be disposed on the bottom (as viewed) side of the module tape (MT).

FIGS. 3J,K,L,M are illustrative of an interim product for a transponder chip module (TCM)—namely a module tape (MT), prepared with contact pads (CP), one or more planar antennas (PA), and one or more coupling frames (CF). subsequently, an RFID chip can be mounted to the module tape (MT), and connected with the contact pads (CP) and planar antenna(s) (PA). The resulting transponder chip module (TCM) would be a capacitive coupling enhanced (CCE) transponder chip module (TCM) by virtue of it having a coupling frame (CF) integrated therewith.

FIG. 3N shows a capacitive coupling enhanced transponder chip module (CCE-TCM) comprising a transponder chip module (TCM) and a coupling frame (CF), wherein the coupling frame (CF) measures approximately 14 mm×25 mm, disposed in a card body (CB) of a smart card (SC). The 8-pad contact pad array (CPA) may measure approximately 11.4 mm×12.6 mm. With a 2 mm space around the contact pad array (CPA), the overall size may be 11.8 mm×13.0 mm. A logo ("LOGO") or design may be printed on or etched into the coupling frame (CF).

Some Exemplary Dimensions may be (vertical×horizontal):
for a 6-contact TCM: 8.2 mm×10.8 mm
for an 8-contact TCM: 11.8 mm×13.0 mm
for the coupling frame (CF): 14.0 mm×25.0 mm
for the card body (CB): 53.98 mm×85.60 mm As mentioned previously, the coupling frame concept may be implemented in the card body (CB) of the smart card (SC), rather than on the module tape (MT) of the transponder chip module (TCM). However, generally, the coupling frame (CF) may be more closely spaced adjacent to the module antenna (MA) when it is on the same module tape (MT) as the module antenna (MA).

FIG. 3O shows the contact pad array (CPA) of a transponder chip module (TCM) comprising eight contact pads (C1-C8). Two connection bridges (CBR-1, CBR-2) are shown above contact pads C1 and C5 of the contact pad array (CPA), respectively. The dark lines between the contact pads and connection bridges represent conductive traces (CT) which may be formed from the same conductive layer (CL), or metal layer (ML) from which the contact pads (CP) may be formed, such as by laser etching. The conductive traces (CT) may extend between contact pads (CP) of the contact pad array (CPA). The conductive traces (CT) may also extend around the exterior of the contact pads (CP) and connection bridges (CBR).

One or more of the conductive traces (CT) may be connected with the central area of the contact pad array (CPA) protect against electrostatic discharge (ESD). This is indicated by the oval labeled "connection to ground". Often, the central area of the contact pad array (CPA) is contiguous with the C5 contact pad, which is ground (VSS), For electrostatic discharge (ESD) protection, discussed in greater detail hereinbelow the coupling frame (CF) may be connected with (linked to, contiguous with) the C5 contact pad which is ground (earth). ESD may occur from someone touching the contact pads (CP) of the transponder chip module (TCM) and causing the RFID chip to fail. By grounding the coupling frame with the chip, the discharge can be avoided.

The C5 pad on the face-up side of the module tape (MT) may be connected, in any suitable manner (as indicated by the "x") with a coupling frame (CF shown in dashed lines) which may be disposed on the opposite, face-down side of the module tape (MT).

Multiple Module Antennas

The publication *RFID Handbook: Fundamentals and Applications in Contactless Smart Cards and Identification*, Second Edition, Klaus Finkenzeller, © 2003, John Wiley & Sons, incorporated by reference herein, discloses (see, e.g., page 45) that load modulation creates two sidebands at a distance of a subcarrier frequency fs around the transmission frequency of the reader. The actual information is carried in the sidebands of the two subcarrier sidebands, which are themselves created by the modulation of the subcarrier.

In the transponder chip modules (TCM) disclosed herein, the side bands may be plus and minus 848 kHz on each side of the carrier (13.56 MHz). The sub-carrier of the side bands is modulated with the data signal.

Two coils (antenna 1, antenna 2) may be used in the transponder chip modules (TCM) (connected to a high input capacitance chip, such as approximately 60 to 90 pF), with each coil having a different resonant frequency, for example 13 MHz and 14 MHz. When the two coils (antenna 1, antenna 2) are connected in series, the resonant frequency will be around 13.5 MHz. Moreover, the Gaussian curve may not be a bell shape, but may have two humps (like a camel). In this manner, both sidebands may be covered, and there may be no loss of data.

Some of the embodiments disclosed herein show two separate module antennas (MA), which may be planar antennas (PA), and which may generally be referred to as antenna structures (AS). Other embodiments may be suggestive of having two antenna structures, or may be adaptable to having two antenna structures. When there are two (or more) antenna structures, or segments, they may interconnected in various ways, and may be referred to in aggregate as the module antenna (MA).

Two antenna structures (PA-1, PA-2, or AS-1, AS-2), such as shown in FIG. 3M, whether on the same side or on opposite sides of the module tape (MT) may be considered to be one overall module antenna (MA). The two antenna structures (AS-1, AS-2) may be connected in any suitable manner with one another, such as in series with one another, or in parallel with one another, or in "reverse phase" with one another (see US 20130075477), and a capacitor may be connected with the module antenna (MA). The two antenna structures (AS-1, AS-2) may be coplanar and concentric with one another. A connection between two antenna structures may be considered to be a "tap". If there is one antenna structure (AS), it may have a center tap, or a tap which is not at the center.

A coupling frame (CD) may also be incorporated into a transponder chip module (TCM) having two antenna structures (S). As shown in FIG. 3M, two antenna structures (PA-1, PA-2) may be disposed on opposite sides of the module tape (MT), which may be compatible with double-sided module tape (epoxy glass substrate having copper cladding on both sides thereof).

FIG. 3M shows two planar antennas (PA-1, PA-2) on a single module tape (MT) for a single transponder chip module (TCM). This is representative of a number of possible ways to have two antenna structures (AS), or module antennas (MA) in a transponder chip module (TCM), or antenna module (AM). A number of other examples of having two antenna structures or module antennas are disclosed in commonly-owned, copending U.S. Ser. No. 14/281,876 filed 19 May 2014 (US 20140284386, 25 Sep. 2014), for example (referencing drawings therein):

- FIGS. 2A,B show an antenna module (AM) having three antenna structures (A,B,C). One antenna structures (A) is the main antenna structure, the other antenna structures (B,C) may be considered to be capacitive stubs.
- FIG. 2C shows two module antenna segments (MA1, MA2) which are arranged concentric with one another.
- FIG. 2D is a diagram showing one possible way how the two antenna segments may be connected with one another.
- FIGS. 2E, 2F illustrate that the antenna MA may be formed on an antenna substrate AST which may be substantially the same size as and separate from a module substrate (or tape) MT, and subsequently joined together.
- FIG. 2G shows an antenna module AM comprising two module tape layers MT1 and MT2, each layer having an antenna coil MA1 and MA2, respectively.
- FIG. 2J shows schematically that the two coils C1 and C2 may be connected in parallel with one another. Coil C2 is shown in dashed lines.
- FIG. 2N shows that an etched module antenna (MA2) may be formed on the contact side of the module tape MT underneath the contact pads CP, in addition to a module antenna (MA) on the opposite side of the module tape.

U.S. Ser. No. 14/281,876 also discloses techniques for forming a planar antenna (PA) using laser etching, including one or both (if there are two) of the module antennas. For example, FIG. 3A illustrates an antenna module (AM) comprising a single-sided module tape having an electrically-conductive cladding layer (CL) on one side (the face-down side) thereof. The cladding layer CL may be etched in any suitable manner, such as laser ablated, to create an antenna structure AS comprising a number of electrically-conductive tracks separated by spaces, result in a planar (flat) spiral antenna structure AS having at least one long, continuous track comprising several turns, separated by spaces, and having two ends for connecting to an RFID chip CM. An electrically-conductive foil layer (FL, or CFL), such as a layer comprising copper, may be laminated with an adhesive (insulation) layer to the top surface of the module tape MT. The copper foil layer CFL may be processed (etched or otherwise patterned) to form an array of 6 or 8 contact pads (CP) for the antenna module AM, on the face-up side of the antenna module AM.

FIG. 3B illustrates an antenna module comprising a single-sided module tape MT 302 having a copper cladding layer CCL on one side (the face-up side). The copper cladding layer CCL may be used to form contact pads (CP) of a contact pad array. A copper foil layer CFL having a thickness of approximately 35 μm may patterned in any suitable manner, such as by etching, more particularly by laser etching, to have tracks (separated by spaces) of an antenna structure AS, and may subsequently be laminated (joined) to the bottom (as viewed) surface of the module tape MT.

other examples of forming antenna structures, as well as techniques and materials associated therewith, are disclosed therein.

Chip Carrier Tape (CCT) with Module Antenna (MA) and Coupling Frame (CF)

Some examples of module tapes (MT, also referred to as chip carrier tapes CCT) having module antennas (MA) (also referred to as antenna structures AS or planar antennas PA) and coupling frames (CF) will now be described. RFID chips (IC, CM) may be mounted to the chip carrier tapes (CCT) and connected with the module antennas (MA) or antenna structures (AS). The products described herein may operate in a purely contactless mode (ISO 14443 or NFC/ISO 15693), without requiring contact pads (CP) for operating in a contact mode (ISO 7816). The module antenna (MA) may be a planar antenna (PA) which is a laser-etched structure (LES) or a chemically-etched structure (CES) having tracks (actually, one long track) separated by spaces, as described above, and may have (for example) 7 turns (or tracks).

Generally, a capacitive coupling enhanced (CCE) transponder chip module (TCM) may comprise:
- a module tape (MT) or chip carrier tape (CCT) having a face-up side and a face-down side;
- an area for mounting an RFID chip (IC, CM) on the face-down side of the module tape (MT); and
- a module antenna (MA) disposed on the face-down side of the module tape (MT);

and may be characterized in that:
- a metal layer (ML) is disposed on at least one side of the module tape (MT) and is formed as an open loop coupling frame (CF) having two ends, an inner edge (IE) and an outer edge (OE), and a slit (S) extending from an opening (OP) for the transponder chip module (TCM), which may be defined by an inner edge (IE) of the coupling frame (CF), to the outer edge (OE) thereof.

The module antenna (MA) may be a planar antenna (PA) which may be a chemically-etched structure (CES) or a laser-etched structure (LES) having a number of turns (tracks) separated by spaces, and two ends connected with terminals (LA, LB) of the RFID chip (IC, CM). There may be two module antennas (MA-1, MA-2), one of which may be disposed on the face-up side of the module tape (MT). A given single module antenna (MA) may have a tap (such as a center tap), and may be considered to be (and function as) two antenna structures (AS) connected in series with one another. A capacitor (cap) may be connected with the module antenna (MA) and/or with the RFID chip (CM, IC). The capacitor may be mounted adjacent to the RFID chip, IC or wired into the circuit somewhere else.

The coupling frame (CF) may be disposed on either the face-up side or face-down side of the module tape (MT). There may be two coupling frames, one disposed on the face-up side of the module tape (MT) the other disposed on the face-down side of the module tape (MT).

The coupling frame (CF) may be disposed around the module antenna (MA) on the same side of the module tape (MT), with its opening surrounding the module antenna (MA) and closely adjacent thereto.

The coupling frame (CF) may be disposed on the opposite side of the module tape (MT) from the module antenna (MA), with its opening aligned with the module antenna (MA) on the other side of the module tape (MT). If the opening is smaller than the module antenna (MA), the coupling frame (CF) may overlap the module antenna (MA).

The coupling frame (CF) may be asymmetric, may extend only a few millimeters beyond the module antenna (MA) on one side thereof, and may extend a few centimeters beyond the module antenna (MA) on an opposite side thereof.

The coupling frame (CF) may have a geometry, as determined (or defined) by the shape of its outer edge (OE), such as elliptical, which is different that the geometry of the transponder chip module (TCM, typically rectangular) in the capacitive coupling enhanced (CCE) transponder chip module (TCM). The geometry of the inner edge (IE) of the coupling frame (CF) may be substantially the same as the geometry of the transponder chip module (TCM, typically rectangular).

The transponder chip module (TCM) may comprise a conductive plating line (PL) extending through the slit (S) and connecting with the planar antenna (PA) and bond pads (BP) for facilitating selectively plating the planar antenna (PA) and bond pads (BP). The planar antenna (PA) and bond pads (BP) can be plated with nickel and gold, while the coupling frame (CF) remains blank copper or brass (not plated). This is an example of selective plating, such as may have been described in U.S. 62/039,562 filed 20 Aug. 2014 and U.S. 62/048,373 filed 10 Sep. 2014.

The chip carrier tape (CCT) may be a 35 mm tape, either single- or double-sided (having a metal layer (ML) on either one or both sides). The antenna structure(s) can be on one side or on both sides. The RFID chip can be mounted and bonded on the coupling frame or on an area beside the antenna. The chip can have an input capacitance of 17 or 69 pF which may influence the number of turns in the planar antenna. Wire bonds between the RFID chip (CM, IC) and the bond pads (BP) may pass over the antenna tracks (in the manner of a connection bridge (CBR)), for example to connect an outer end of the planar antenna (PA) with a terminal (LA or LB) on the RFID chip.

The planar antenna (PA) (or antenna structure AS) and coupling frame (CF) may be formed by etching (either laser or chemical) the metal layer (ML). An area of the metal layer (ML) which is interior to (inside the inner edge IE of) the planar antenna (PA) may be completely removed (bulk removal), left in place, or etched to have a number of isolated structures, or to have another coupling frame. See FIG. 5A (bulk removal) and FIG. 5B (isolated structures, segmenting remaining metal inside of the antenna structure/module antenna).

The planar antenna (PA) (or antenna structure AS) may comprise an elongated track having an overall length of approximately 494 mm (11 turns), in the form of a rectangular spiral having tracks (traces) separated by spaces. The track width may approximately 100 µm or less, including less than 75 µm and approximately 50 µm, and may be varied along the length of the antenna structure (AS). The spacing (or gap) between adjacent tracks (traces) may be less than 100 µm, including less than 75 µm, less than 50 µm, and approximately 25 µm, or less (such as after plating) and may be varied along the length of the antenna structure (AS). The planar antenna (PA) (may comprise 10-18 turns, such as 11 turns, and the resulting transponder chip module (TCM) may be readable over a distance of at least 35 mm (3.5 cm), resonating typically at 14.2 MHz. A capacitor may be disposed in the transponder chip module (TCM) and connected with the planar antenna (PA).

Some Embodiments

Some embodiments of capacitive-coupling enhanced (CCE) transponder chip modules (TCM) will now be described, and may utilize any of the concepts described above. These transponder chip modules (TCM) may operate solely in a contactless mode, rather than being dual interface modules having contact pads.

FIGS. 4A and 4B are diagrams showing a capacitive coupling enhanced transponder chip module (CCE-TCM, 400) comprising:
- a module tape (MT, 410);
- an RFID chip (IC, 404) disposed on the module tape (MT);
- an etched planar antenna (PA, 402) disposed on the module tape (MT); and
- a coupling frame (CF, 424) disposed on the module tape (MT), closely adjacent to the module antenna (MA), having an opening (OP, 405) aligned (such as concentric) with the module antenna (MA) and a slit (S, 426) extending from the opening (OP) to an outer edge (OE) 425 of the coupling frame (CF) so that the coupling frame (CF) is an open loop. There may be a small gap between the inner edge (IE) of the coupling frame (CF) and an outer turn of the module antenna (MA).

The RFID chip (IC) and module antenna (MA, PA) constitute a transponder chip module (TCM) 401. The transponder chip module (TCM) 401 may also comprise a substrate for supporting the RFIC chip (IC) and the module antenna (MA), which may be an epoxy-glass module tape (MT). The opening (OP) of the coupling frame (CF) may be defined by an inner edge (IE) 423 thereof, and the slit (S) may be considered to extend from the inner edge (IE) to the outer edge (OE) of the coupling frame (CF).

The RFID chip (IC) is shown on the same side of the module tape (MT) as the planar antenna (PA) which, may be either the face-up or face-down side of the module tape (MT).

In this contactless-only, single interface embodiment, it is ambiguous which side is face-up and which side is face-down, since there are no contact pads (CP) defining which is the face-up side. Nevertheless, the concept of an electrically "open loop" coupling frame (CF) disposed closely adjacent to and surrounding the module antenna (MA)—whether the coupling frame (CF) is on the same or on an opposite side of the module tape (MT) as/from the module antenna (MA)—may be applied to dual-interface (DI) transponder chip modules (TCM) also having contact pads (CP) for a contact interface, as shown in many of the examples presented herein.

By incorporating in or adding an open-loop coupling frame (CF) to the transponder chip module (TCM), coupling between the resulting capacitive coupling enhanced—transponder chip module (CCE-TCM) and an external reader (FIG. 1; "contactless reader") may be improved, including increasing activation distance and read/write distance. The improvement may be sufficient that the capacitive coupling enhanced—transponder chip module (CCE-TCM) may operate independently, without requiring a booster antenna (BA) or the like which are found in smart cards. The capacitive coupling enhanced—transponder chip module (CCE-TCM) may have a larger form factor than a conventional transponder chip module (TCM), and may be incorporated into RFID devices other than smart cards, such as wristband devices (discussed hereinbelow), key fobs, devices with USB (universal serial bus) interfaces, and the like, having various form factors.

U.S. Ser. No. 14/465,815 filed 21 Aug. 2014 discloses (FIG. 7B therein) incorporating a secondary coupling frame (SCF) in the transponder chip module (TCM) to enhance coupling between the laser-etched antenna structure (LES) of the transponder chip module (TCM) with the coupling frame (CF) in the card body (CB). To further improve the proximity of the laser-etched antenna (LES) to the coupling frame (CF), a metal rim ("rim") surrounding the laser etched antenna (LES) on the transponder chip module (TCM) may be electrically connected to the coupling frame (CF) using conductive glue, solder, welding, etc. The separation distance from the rim to the antenna can be the width of the laser width, less than 25 µm. The metal rim may be considered to be a secondary coupling frame (SCF), and should be open loop having a slit (S) between its two ends.

FIG. 5A is a plan view of an implementation of a transponder chip module (TCM) 500 having the planar antenna (PA) 502 disposed around the RFID chip (IC) 504 and the coupling frame (CF) 524 disposed around the planar antenna (PA), showing the various components (elements) in greater detail than in the diagrams of FIGS. 4 and 4A. The planar antenna (PA) is disposed in an opening (OP) 505 in the coupling frame (CF). A slit (S) 526 extends from the opening (OP) to an outer edge (OE) 525 of the coupling frame (CF).

The coupling frame (CF) may be formed from a conductive metal layer (ML) on the module tape (MT) or chip carrier tape (CCT) 510. The module tape (MT) may be a standard 35 mm tape, with sprocket holes (sh), as shown. A conductive plating line (PL) 522 may extend from external to (outside of) the coupling frame (CF), through the slit (S) to the planar antenna (PA) for purposes of plating the etched planar antenna (PA). The portion of the module tape (MT) having the sprocket holes (sh) and the portion of the plating line (PL) which is external to the coupling frame (CF) will eventually be excised—they are for manufacturing purposes—and may not appear in the final transponder chip module (TCM) or interim product (TCM without IC).

In FIG. 5A, much (or all) of the metal layer (ML) on the module tape (MT) which is inside of the planar antenna (PA)

may be removed, by bulk removal. This, however, is time consuming FIG. 5B shows that the portion of the metal layer (ML) 506 which is inside of the planar antenna (PA) may be segmented to have several isolated conductive features, such as the several rectangular features shown.

Coupling Frame by Embedding Wire

US 20140091149 discloses that a booster antenna BA may generally comprise a relatively large winding which may be referred to as a card antenna CA component (or portion) having a number of turns disposed in a peripheral area of the card body CB, and a relatively small coupler coil (or coupler antenna) CC component (or portion) having a number of turns disposed at a coupling area of the card body CB corresponding to the antenna module AM. The card antenna CA and coupler coil CC may comprise wire mounted to (embedded in) the card body CB using an ultrasonic tool comprising a sonotrode and a capillary. See, for example U.S. Pat. No. 6,698,089 and U.S. Pat. No. 6,233,818. The wire may be non-insulated, insulated, or self-bonding wire, having an exemplary diameter in the range of approximately 50-112 µm.

The coupling frames (CF) disclosed herein may be formed by embedding wire in a substrate or layer thereof, whether it is a layer of a card body (CB), or the module tape (MT) itself. Any process (deposition, printing, etc.) resulting in an electrically-conductive layer may be used to form the coupling frame (CF). The embedded wire may meander around the surface of the substrate.

FIGS. 6A and 6B are diagrams (plan view) of a smartcard (SC) having a transponder chip module (TCM) and a coupling frame (CF) formed by embedding wire (EW) in a card body (CB). It may be noted that,

- a portion of the wire-embedded coupling frame (CF) extends around the periphery of the card body (CB), to provide maximum coverage when the smart card (SC) is being scanned by a reader.
- unlike a booster antenna (BA) which may have two free ends, the ends of the wire-embedded coupling frame (CF) are connected with one another ("connect ends")
- unlike the coupler coil (CC) of a booster antenna (BA), which has a number of windings completely encircling (surrounding) an area corresponding to the antenna module (AM), the wire-embedded coupling frame (CF) only partially encircles (surrounds) the transponder chip module (TCM). Each have an opening (OP) for the transponder chip module (TCM).
- In both examples, the coupling frame (CF) has a slit (S), and may be considered to be "open loop", with respect to the transponder chip module (TCM), in that the coupling frame (CF) does not completely surround the transponder chip module (TCM) at the opening (OP).
- In both examples, the transponder chip module (TCM) is shown ready to be disposed in the opening (OP). A card body (CB) with a coupling frame (CF), and a recess for receiving a transponder chip module (TCM) may be considered to be an "interim" product.
- In FIG. 6A, a small slit (S) is shown, as has been described for other, "solid" coupling frames (CF) disclosed herein. The slit (S) extends from the opening (OP), which may be considered to be the inner edge (IE) of the coupling frame (CF) to an outer edge (OE) of the coupling frame (CF).
- In FIG. 6B, a larger slit (S) is shown, and the opening portion of the coupling frame (CF) is adjacent only three of the four sides of the transponder chip module (TCM). The large slit (S) extends from the opening to an inner edge (IE) of the coupling frame (CF).

The technique of wire-embedding a coupling frame (CF) may include the wire meandering, including back and forth, across the surface of the card body (CB), rather than only around the periphery thereof. Nevertheless, it should substantially encircle (except for the slit S), and be closely adjacent to the transponder chip module (TCM).

The technique of wire-embedding a coupling frame (CF) may be applied to a module tape (MT) of a transponder chip module (TCM) rather than to the card body (CB) of a smart card (SC) to provide a capacitive coupling enhanced transponder chip module (CCE-TCM). In a transponder chip module (TCM), this technique of having a "skeletal" (non-continuous, across its overall surface) coupling frame (CF) may be implemented by etching a conductive layer (CL), rather than be embedding wire. Some embodiments of transponder devices (TD) are disclosed hereinbelow (FIGS. 7, 8) which may utilize embedded wire antenna structures (AS).

FIG. 6C shows a transponder chip module (TCM) positioned to be inserted in a module opening (MO) of an upper layer (UL) of a card body (CB), a coupling frame (CF) with coupler coil (CC) disposed below the upper layer (UL), and a lower layer (LL) disposed below the coupling frame (CF) with coupler coil (CC).

The coupler coil (CC) may be in the form of a flat, rectangular spiral, having two ends. Some variations may include:
- the coupler coil (CC) may be left unconnected, or floating (both of its ends being "free ends")
- the two ends of the coupler coil (CC) may be connected with one another, such as via a resistive load (or a jumper)
- one of the two ends of the coupler coil (CC) may be connected with the coupling frame (CF) in the card body (CB)

As best viewed in FIG. 6D, when the coupling frame (CF) is disposed in a layer of the card body (CB), it may be not be substantially coplanar with the transponder chip module (TCM), but rather may be offset therefrom by intervening layers (including, for example, adhesive) and there may be a space of approximately 100-200 µm between the bottom of the transponder chip module (TCM), particularly its planar antenna (PA), and the plane of the coupling frame (CF). However, the coupler coil (CC) and planar antenna (PA) of the transponder chip module (TCM) may couple very well.

In some embodiments of a coupling frame (CF) having a module opening (MO) for receiving the transponder chip module (TC) in the coupling frame (CF), the coupling frame (CF) may be substantially coplanar with the planar antenna (PA) of the transponder chip module (TCM), however a gap between the module antenna (MA) may be a few hundred microns. In some embodiments of a coupling frame (CF) with coupler coil (CC), although there may be a space of approximately 100-200 µm between the bottom of the transponder chip module (TCM), there may be a dielectric insulation gap of only approximately only 25-50 µm between the inner edge of the opening (OP) in the coupling frame (CF) and the outer track (turn) of the coupler coil (CC). A coupling frame (CF) with a coupler coil (CC) may exhibit better performance than a coupling frame (CF) without a coupler coil (CC).

The coupling frame (CF) with coupler coil (CC) may be etched from a foil while it is supported on a dielectric backing layer. The coupler coil (CC) can be approximately the same size and shape as the module antenna (MA) in the transponder chip module (TCM). The coupler coil (CC) can be elongated, such as starting at the position of the transponder chip module (TCM) and extending across the top half of the card body (CB).

FIG. 6E shows a card body (CB) of a smart card (SC) comprising a coupling frame (CF) having a slit (S) and also having one or more coupler coils (CC) formed therein.

FIG. 6F shows a module tape (MT) of a capacitive coupling enhanced (CCE) transponder chip module (TCM) comprising a coupling frame (CF) having a slit (S) and also having one or more coupler coils (CC) formed therein.

Wearable Devices

Wearable devices are activity trackers, wireless-enabled devices that measure data such as the number of steps walked, quality of sleep, and other personal metrics. They are usually in the form of wristbands, similar in size to a watch. A transponder for micropayment or access control can be integrated into the wristband. The transponder can be in the form of an ID-000 (GSM SIM card) having dimensions of 15×25 mm. A mini-UICC SIM (12 mm×15 mm) has a dimension similar to that of an 8 contact transponder chip module. Some of the techniques disclosed herein may be applicable to wearable devices.

FIG. 7 illustrates, generally an embodiment of a transponder device (TD), which may be referred to as an RFID device, and which may be incorporated into wearable items, such as wristbands. The transponder device (TD) may operate solely with a contactless interface, without a contact interface (and without contact pads CP). The transponder device (TD) may generally comprise (i) an RFID chip (IC) on a carrier substrate (CS), and (ii) an antenna structure (AS) functioning as a module antenna (MA) disposed on a separate (from the carrier substrate CS) device substrate (DS). The carrier substrate (CS) with the RFID chip (IC) may be joined to the device substrate (DS) with the antenna structure (AS) to form the overall transponder device (TD). Optionally, a coupling frame (CF) may be included, on the device substrate (DS), disposed around and closely adjacent the antenna structure (AS) on the same device substrate (DS), in the manner of coupling frames (CF) for capacitive coupling enhanced transponder chip modules (CCE-TCM) discussed hereinabove. The antenna structure (AS) may be an etched planar antenna (PA) or it may be a wire-embedded antenna, either of which may have two ends connecting with terminals (such as LA, LB) of the RFID chip (IC). Optionally, a capacitor (CAP) may be incorporated into the transponder device (TD), connected with the antenna structure (AS) or with the terminals (such as LA, LB) of the RFID chip. The resulting transponder device (TD) may perform the function of a transponder chip module (TCM), but with a much larger, elongated form factor.

The transponder device (TD) 700 may comprise:
- an RFID chip (IC) 702 disposed on a carrier substrate (CS) 704 which may be a leadframe carrier or any other suitable carrier;
  - the RFID chip (IC) may operate solely in a contactless mode;
- an antenna structure (AS) 710 disposed on a device substrate (DS) 712 and having two ends for connecting with the RFID chip (IC) either directly, or via the carrier substrate (CS);
  - the device substrate (DS) may comprise a synthetic material suitable for embedding wire to form the antenna structure (AS). This is shown in FIG. 7. The wire-embedded antenna structure may extend around the periphery of the device substrate (DS) for a number of turns, and may have two ends 710*a* and 710*b* for connecting with terminals of the RFID chip (IC) or associated contact pads on the carrier substrate (CS);
  - alternatively, the device substrate (DS) may comprise a single-sided epoxy-glass tape having a conductive metal layer (ML) on a surface thereof which may be etched to form the antenna structure (AS). The etched antenna structure (AS) may be similar to the planar antennas (PA) described hereinabove, having a number of tracks (traces) separated by spaces, and may be chemically-etched or laser-etched. Separate wire bridges (not shown) may connect ends of an etched antenna structure (AS) on the device substrate (DS) with terminals of the RFID chip (IC) or associated contact pads on the carrier substrate (CS);
  - the device substrate (DS) may be provided with a window opening (WO) 714 for accepting the carrier substrate (CS) with RFID chip (IC);
- optionally, a coupling frame (CF) 720 may be disposed on the device substrate (DS), closely adjacent to and surrounding the antenna structure (AS), except for a slit (S) 726 extending from an opening (for the antenna structure) in the coupling frame (CF) to an outer edge thereof, in the manner described hereinabove for coupling frames (CF) in transponder chip modules (TCM);
- in the case of an etched antenna structure (AS), the coupling frame (CF) may be etched from the same conductive metal layer (CL, ML) as the antenna structure (AS);
- optionally, a capacitor (CAP) 718 may be incorporated into the transponder device (TD), such as by connecting it across the antenna terminals (LA, LB) of the RFID chip (IC), or by connecting it in series with the antenna structure (AS) on the device substrate (DS).

The device substrate (DS) may be elongated, and may measure approximately 7 mm wide by 48 mm long, or 8 mm wide by 40 mm long, for example.

The device substrate (DS) may comprise a soft, embeddable material such as PVC (polyvinyl chloride). Alternatively, other materials may be used, and the device substrate (DS) may have a coating (such as a glue coating) to accept wire-embedding.

The antenna structure (AS), which may be referred to as a substrate antenna (SA), may be embedded into the device substrate (DS) using ultrasonic embedding techniques such as are disclosed in U.S. Pat. No. 6,698,089 and U.S. Pat. No. 6,233,818 and U.S. Pat. No. 6,088,230. The substrate antenna (SA) may comprise 4 or 5 turns around the periphery of the device substrate (DS). Track spacing of the module antenna (MA) may be varied to control capacitance.

The carrier substrate (CS), which may be a leadframe carrier (LC), with RFID chip (IC) mounted thereon, may be referred to as a "chip module" 730. The chip module does not have its own antenna (module antenna MA), and therefore does not function as a transponder (it has no contact pads for a contact interface, and no module antenna for a contactless) and may therefore not be referred a transponder chip module (TCM). With the antenna structure (AS) connected to the RFID chip (IC), the overall transponder device (TD) may function as a transponder chip module (TCM).

The figure shows the chip module (carrier substrate CS and RFID chip IC) being mounted from behind to the back or bottom surface of the device substrate (DS) so that its contact pads are exposed for being connected to by the ends of the antenna structure (AS) (or intermediate wire bridges). To this end, the device substrate (DS) may be provided with an opening (WO) 714 for receiving the carrier substrate (CS) and RFID chip (IC). The size of the opening (OP) may be greater than the size of the chip module (CS and IC) so that the chip module may "float" when the device substrate (DS) is flexed.

Alternatively, the carrier substrate (CS) may be disposed on the front side of the device substrate (DS) and connected in a suitable manner with the antenna structure (AS). The antenna structure (AS) connected with an RFID chip (IC) constitutes a transponder chip module (TCM), the antenna structure functioning as a module antenna (MA) for the transponder chip module (TCM).

If etched, the antenna structure (AS) may comprise 4 or 5 turns (tracks, traces) separated by spaces, in the manner of various module antenna (MA) described above. An embedded wire antenna structure (AS) may comprise 7-10 turns around the periphery of the device substrate (DS). These numbers (of turns) are intended to be exemplary.

The coupling frame (CF), having a slit (S), and two opposed ends, may be disposed around the periphery of the device substrate (DS), on either side of the device substrate (DS), such as
  (i) disposed on the same side of the device substrate (DS) around and closely adjacent to an antenna structure (AS), such as shown in FIG. 3M (with regard to PA-1 and CF), or
  (ii) disposed on the opposite side of the device substrate (DS) so that it an inner portion of the coupling frame (CF) may overlap (or underlie) an outer portion of the antenna structure (AS), such as shown in FIG. 3K (with respect to CF and PA).

With the optional coupling frame (CF), the transponder device (TD) constitutes a capacitive coupling enhanced (CCE) transponder chip module (TCM) capable of contactless communication (with an external reader).

Transponder Chip Modules (TCM) Connected with an External Antenna (ANT)

FIGS. 8A, 8B illustrate, generally an embodiment of a transponder device (TD), which may be referred to as an RFID device, and which may be incorporated into wearable items, such as wristbands. The transponder device (TD) may operate solely with a contactless interface, without a contact interface (and without contact pads CP). The transponder device (TD) may generally comprise (i) an RFID chip (IC) on a carrier substrate (CS) with a module antenna (MA), and (ii) an additional antenna structure (AS) disposed on a separate (from the carrier substrate CS) device substrate (DS). The carrier substrate (CS) with the RFID chip (IC) and module antenna (MA) may be joined to the device substrate (DS) with the additional antenna structure (AS) to form the overall transponder device (TD). Optionally, a coupling frame (CF) may be included, on the device substrate (DS), disposed around and closely adjacent the additional antenna structure (AS) on the same device substrate (DS), in the manner of coupling frames (CF) for capacitive coupling enhanced transponder chip modules (CCE-TCM) discussed hereinabove. The additional antenna structure (AS) may be an etched planar antenna (PA) or it may be a wire-embedded antenna, either of which may have two ends connecting with terminals (such as LA, LB) of the RFID chip (IC). Optionally, a capacitor (CAP) may be incorporated into the transponder device (TD), In this embodiment, the RFID chip (IC) on a carrier substrate (CS) with a module antenna (MA) constitutes a transponder chip module (TCM), in and of itself. With the additional device substrate (DS) and antenna structure (AS), it may be considered to be an "inductively enhanced" (by virtue of the additional antenna structure AS) transponder chip module (IE-TCM) and, with a coupling frame (CF) on the device substrate it may be considered to be an inductively-enhanced, capacitive coupling enhanced transponder chip module (E-CCE-TCM), The resulting transponder device (TD) may perform the function of a transponder chip module (TCM), but with a much larger, elongated form factor.

The transponder device (TD) 800 may comprise:
an RFID chip (IC) 802 and a module antenna 806 disposed on a carrier substrate (CS) 804 which may be a lead-frame carrier or any other suitable carrier. Together, these elements (an IC connected with a MA) may be considered to be a transponder chip module (TCM) 830 capable of functioning on its own;
the RFID chip (IC) may operate solely in a contactless mode;
an antenna structure (AS) 810 disposed on a device substrate (DS) 812 and having two ends for connecting with the RFID chip (IC) either directly, or via the carrier substrate (CS), or with the module antenna (MA);
the device substrate (DS) may comprise a synthetic material suitable for embedding wire to form the antenna structure (AS). This is shown in FIG. 8. The wire-embedded antenna structure may extend around the periphery of the device substrate (DS) for a number of turns, and may have two ends 810*a* and 810*b* for connecting with terminals of the RFID chip (IC) or associated contact pads on the carrier substrate (CS);
alternatively, the device substrate (DS) may comprise a single-sided or double-sided epoxy-glass tape having a conductive metal layer (ML) on a surface thereof which may be etched to form the additional antenna structure (AS). The etched additional antenna structure (AS) may be similar to the planar antennas (PA) described hereinabove, having a number of tracks (traces) separated by spaces, and may be chemically-etched or laser-etched. Separate wire bridges (not shown) may connect ends of an etched additional antenna structure (AS) on the device substrate (DS) with terminals of the RFID chip (IC) or associated contact pads on the carrier substrate (CS);
the device substrate (DS) may be provided with a window opening (WO) 814 for accepting the carrier substrate (CS) with RFID chip (IC) and module antenna (MA);
optionally, a coupling frame (CF, not shown, compare 720) may be disposed on the device substrate (DS), closely adjacent to and surrounding the additional antenna structure (AS), except for a slit (S, not shown, compare 726) extending from an opening (for the additional antenna structure) in the coupling frame (CF) to an outer edge thereof, in the manner described hereinabove for coupling frames (CF) in transponder chip modules (TCM);
in the case of an etched additional antenna structure (AS), the coupling frame (CF) may be etched from the same conductive metal layer (CL, ML) as the additional antenna structure (AS);
optionally, a capacitor (CAP, not shown, compare 718) may be incorporated into the transponder device (TD), such as by connecting it across the antenna terminals (LA, LB) of the RFID chip (IC), or by connecting it in series with the additional antenna structure on the device substrate (DS).

The device substrate (DS) may be elongated, and may measure approximately 7 mm wide by 48 mm long, or 8 mm wide by 40 mm long, for example.

The device substrate (DS) may comprise a soft, embeddable material such as PVC (polyvinyl chloride). Alternatively, other materials may be used, and the device substrate (DS) may have a coating (such as a glue coating) to accept wire-embedding.

The additional antenna structure (AS), which may be referred to as a substrate antenna (SA), may be embedded into the device substrate (DS) using ultrasonic embedding techniques such as are disclosed in U.S. Pat. No. 6,698,089 and U.S. Pat. No. 6,233,818 and U.S. Pat. No. 6,088,230. The substrate antenna (SA) may comprise 4 or 5 turns around the periphery of the device substrate (DS), and may be connected in series or parallel with the module antenna (MA) 806 on the transponder chip module (TCM) 830. The module antenna (MA) may be a etched planar antenna (PA) such as described for other embodiments of transponder chip modules (TCM). Track spacing of the module antenna (MA) may be varied to control capacitance. The figure shows the substrate antenna (SA) 810 disposed on the front surface of the device substrate (DS) 812, and ends of the substrate antenna (SA) 810 connected to two rectangular connection pads on the carrier substrate (CS) 804 of the transponder chip module (TCM) 830.

The device substrate (DS) 812 with antenna structure (AS) or substrate antenna (SA) 810 may be considered to be an "interim product" ready to receive, at a later date, a transponder chip module 830, at which time the antenna structure (AS) may be connected with the transponder chip module (TCM).

The carrier substrate (CS), which may be a leadframe carrier (LC), with RFID chip (IC) and module antenna (MA) mounted thereon, may be referred to as a "chip module". The chip module has its own antenna (module antenna MA), and therefore may function as a transponder and may therefore be referred a "transponder chip module" 830. The transponder chip module (TCM) 830 may function alone as an RFID transponder, it has an RFID chip (IC) and an antenna (module antenna MA). Its capability is enhanced by the external additional antenna structure (AS) on the device substrate (DS).

The figure shows the transponder chip module (carrier substrate CS, RFID chip IC and module antenna MA) being mounted from behind to the back or bottom surface of the device substrate (DS) so that its contact pads are exposed for being connected to by the ends of the additional antenna structure (AS) (or intermediate wire bridges). To this end, the device substrate (DS) may be provided with an opening (WO) 714 for receiving the transponder chip module (TCM, or carrier substrate (CS) with RFID chip (IC and module antenna (MA)). The size of the opening (OP) may be greater than the size of the chip module (CS and IC) so that the chip module may "float" when the device substrate (DS) is flexed.

Alternatively, the transponder chip module 830 may be disposed on the front side of the device substrate (DS) and connected in a suitable manner with the additional antenna structure (AS). The additional antenna structure (AS) connected with the transponder chip module 830 constitutes an enhanced transponder chip module (E-TCM), the additional antenna structure functioning in a manner similar to an antenna embedded in the card body (CB) of a smart card (SC) and connected with an RFID chip. See, e.g., U.S. Pat. No. 7,980,477 (Dual Interface Inlays). Except in this example, the additional antenna structure is connected with a fully-contactlessly-functional transponder chip module, rather than with merely an RFID chip.

If etched, the additional antenna structure (AS) may comprise 4 or 5 turns (tracks, traces) separated by spaces, in the manner of various module antenna (MA) described above. An embedded wire a additional antenna structure (AS) may comprise 7-10 turns around the periphery of the device substrate (DS). These numbers (of turns) are intended to be exemplary.

A coupling frame (CF), if any (none shown) may be disposed on the device substrate (DS) in the manner described with respect to the transponder device 700 of FIG. 7. The coupling frame (CF) may be disposed around the periphery of the device substrate (DS), on either side of the device substrate (DS), such as
   (i) disposed on the same side of the device substrate (DS) around and closely adjacent to the additional antenna structure (AS), or
   (ii) disposed on the opposite side of the device substrate (DS) so that it an inner portion of the coupling frame (CF) may overlap (or underlie) an outer portion of the additional antenna structure (AS).

With the optional coupling frame (CF), the transponder device (TD) constitutes an capacitive coupling enhanced (CCE) inductively enhanced (by virtue of the additional antenna structure) transponder chip module (TCM) capable of contactless communication (with an external reader).

In summary, a wire antenna (SA) is embedded on an elongated device substrate (DS) and connected to the transponder chip module (TCM) which has an RFID chip (IC) and its own module antenna (MA). A coupling frame (CF) may be disposed around the exterior of or within the interior of the substrate antenna (SA), and closely spaced therefrom. A coupling frame (CF) may be substituted for the substrate antenna (SA), if close spacing with the module antenna (MA) can be maintained.

A capacitor (not shown) may be incorporated into the transponder chip module (TCM) and connected with the module antenna (MA). The capacitor, which may be a silicon capacitor, may be connected in parallel with the module antenna (MA), or it may be inserted between the module antenna (MA) and the substrate antenna (SA). One end of the capacitor may be connected to the RFID chip (IC), and the other may be connected to a tap of a dual antenna.

An Etched, Planar Module Antenna (MA, PA)

Planar antennas (PA) which are etched, particularly laser-etched, from a conductive layer (CL) on a module tape (MT) or other substrate (such as the device substrates DS), and functioning as a module antenna (MA) or other antenna structure (AS) have been mentioned hereinabove. Also, with regard to FIGS. 5A and 5B, the issue of "bulk removal" of metal inside of the module antenna (MA) versus segmenting the remaining metal inside of the module antenna (MA) to have many isolated conductive structures instead of one large metal area was briefly introduced. Attention will now be directed to segmenting the conductive metal layer (ML, CL) remaining inside a laser-etched module antenna (MA), as an example of any laser-etched antenna structure (AS). A conductive layer (CL) comprising copper will be described, as exemplary of etching any conductive material for a module antenna (MA).

In laser ablating single- or double-sided glass epoxy tape to expose an antenna structure (AS), there is inevitably a bulk area of copper which needs to be removed. This bulk removal of copper from the surface of the glass epoxy tape takes up valuable laser time. Inasmuch as the remaining copper is a conductive surface in the middle of the antenna, such as in (but not limited to) the case of the wristband antenna (FIGS. 7, 8), the remaining copper may significantly affect the resonance frequency and power delivery to the RFID chip (IC). In the case of a dual interface transponder chip module the same applies, there is an area in the middle of the laser etched module antenna (the position of the die) which needs to be removed. On the face-up (contact pad) side of the module tape (MT) there is also a large conductive (copper) area in the middle of the contact pad array (CPA), which is usually left in place and contiguous with the C5 contact pad.

It may be advantageous not to bulk remove the copper from the center of the module antenna (MA) (or, from the center of the contact pad array CPA), but rather to segment the remaining copper surface by creating slits or tracks in the copper by laser-etching, resulting in several smaller isolated conductive areas rather than one large conductive area. This may also be characterized as rendering the entire large area less conductive overall, and may be referred to as "profiling" the copper surface. Some examples will be presented.

In the examples that follow, an antenna structure (AS) 900 is shown, on a module tape (MT) 902 or other suitable substrate. The antenna structure (AS) may be an etched planar antenna (PA), particularly a laser-etched antenna structure (AS), etched from a conductive layer (CL) 904 on the module tape (MT), suitable to be incorporated into a transponder chip module (TCM) as an example of any transponder device or RFID device as the module antenna (MA) or other antenna structure (AS) thereof. Such an antenna structure (AS) may comprise a plurality of tracks (traces, as mentioned before, actually one long spiraling track) separated by spaces, disposed in a rectangular spiral pattern around a periphery of the module tape (MT). Examples of segmenting a portion of the metal conductive layer (CL) 904 remaining in an area inside of (interior to) the module antenna (MA) are shown.

FIG. 9A shows an antenna structure (AS) 900 on a module tape (MT) 902 wherein the conductive layer 904 remaining at the interior area of the antenna structure (within the turns of the antenna structure) is a single large, conductive structure. This constitutes a "no segmentation" baseline.

FIG. 9B shows an antenna structure (AS) 900 on a module tape (MT) 902 wherein the conductive layer 904 remaining at the interior area of the antenna structure (AS) has been segmented with "low" segmentation—in this example, one slit (SL) 906 extending in a first direction (horizontal, as viewed) across the remaining conductive layer, and nine slits (SL) 906 extending in another (such as perpendicular) direction (vertical, as viewed) across the remaining conductive layer, resulting in twenty (2×10, a plurality of) smaller isolated (from one another) conductive structures 904b. The slits (SL) may be evenly or unevenly spaced, and the resulting smaller isolated conductive structures may be the same size as one another, or different sizes than one another.

The slits (SL) described herein may be formed by laser etching, in a manner similar to how the slit (S) in the coupling frame (CF) may be made, but serve a different purpose (these figures are directed to the module antenna, not the coupling frame).

FIG. 9C shows an antenna structure (AS) 900 on a module tape (MT) 902 wherein the conductive layer 904 remaining at the interior area of the antenna structure (AS) has been segmented with "medium" segmentation—in this example, two slits (SL) 906 extending in a first direction (horizontal, as viewed) across the remaining conductive layer, and ten slits 906 extending in another (such as perpendicular) direction (vertical, as viewed) across the remaining conductive layer, resulting in thirty-three (3×11, a plurality of) smaller isolated (from one another) conductive structures 904c. The slits may be evenly or unevenly spaced, and the resulting smaller isolated conductive structures may be the same size as one another, or different sizes than one another.

FIG. 9D shows an antenna structure (AS) 900 on a module tape (MT) 902 wherein the conductive layer 904 remaining at the interior area of the antenna structure (AS) has been segmented with "high" segmentation—in this example, three slits 906 extending in a first direction (horizontal, as viewed) across the remaining conductive layer, and nineteen slits 906 extending in another (such as perpendicular) direction (vertical, as viewed) across the remaining conductive layer, resulting in eighty (4×20, a plurality of) smaller isolated (from one another) conductive structures 904d. The slits may be evenly or unevenly spaced, and the resulting smaller isolated conductive structures may be the same size as one another, or different sizes than one another.

Although the actual amount of copper removed may be quite small (the slits may be less than 100 μm wide), several benefits may accrue to segmenting the conductive layer material within a module antenna (MA), or other comparable antenna structure (AS). This may include beneficial effects on the associated module's resonance frequency (it can be shifted), less signal attenuation due to smaller eddy currents in the segmented embodiments, and the like. Some benefits accruing to profiling the copper surface may include the ability to tune the resonance frequency of the antenna circuit (the module antenna and whatever it is connected to, such as the RFID chip, which has a characteristic input capacitance) by the number of slits, and resulting isolated conductive areas which are created. This may make it possible to tune an antenna structure (AS, MA) to a specific RFID chip having a given input capacitance. As the input capacitance of RFID chips stemming from wafers produced by a semiconductor foundry may vary from batch-to-batch, segmenting a conductive area remaining interior to (inside of) a module antenna (MA) may make it possible to tune the module antenna precisely for a given wafer batch or for a given chip set. Antenna structures (AS) may be tuned, without changing the antenna geometry itself.

Chip Input Capacitance

The RFID chip (IC, CM) has a characteristic input capacitance, such as at the terminals (LA, LB) connecting to the module antenna (MA). Low capacitance chips (input 17 pF) can be made to work with our transponder chip module and coupling frame, by increasing the number of turns from 10 to 18 turns. High capacitance chips (input 69 pF) operate with the same performance as the low capacitance chips, but with a lower number of (such as 6-9) turns.

Pure Contactless Embodiments

As mentioned above, some of the techniques disclosed herein may be applicable to transponder chip modules (TCM) operating solely in a contactless mode, in which case there may not be any contact pads (CP). In the absence of (and in lieu of) contact pads (CP), the transponder chip module (TCM) may be provided with isolated metal features to pull the resonance to the frequency of interest. These isolated metal features may for example be a logo or design.

Electrostatic Discharge (ESD)

ESD is a miniature lightning bolt of charge that moves between a person handling a metal object, such as a metal card or a plastic card with a metallization layer and the contact pads of a module connected to an RFID chip, both surfaces having different potentials. It can occur only when the voltage differential between the surface of the metal and the contact pads on a chip module is sufficiently high to break down the dielectric strength of the air medium separating the two surfaces. When a static charge moves, it becomes a current that may damage or destroy gate oxide, metallization, and junctions in the RFID chip. ESD can occur in any one of many different ways: a charged person can touch (come into contact with) or rub the chip module, a charged chip module can touch a grounded surface, a charged point of sale terminal can touch a chip module, or an electrostatic field can induce a voltage across a dielectric sufficient to break it down.

Normally RFID chips are protected against any ESD events that might occur to any bond pad that is exposed to its environment. However, handling of metal cards with a contact chip module or a dual interface chip module are subject to very high discharge voltages which can cause thermal damage to the RFID chip.

Because ESD can occur only when different potentials are involved, the best way to avoid ESD damage is to keep the RFID chip at the same potential as its surroundings. The logical reference potential is ESD ground. Therefore, in order to intercept Electrostatic Discharge (ESD) arcs from a person handling a metal card with a chip module, the following measures can be undertaken:

Clamping the ground contact pad (C5) on the chip module to the metal card body surface or to a metallization layer in a plastic card body to protect it against ESD surges (discharges)

Clamping an ESD protection device such as a suppressor diode or capacitor between the ground contact pad (C5) of the chip module and the metal card body or to a metallization layer in a plastic card body Applying anti-static foam or static dissipative material between the chip module and the metal card body or a metallization layer in a plastic card body Connecting (attaching) a suppressor diode or capacitor across the slit (S) of the coupling frame (CF)

The metal frame of a card body may be connected with the ground pin (pad) C5 of the module (of course on the opposite side, and not on the contact side), using any suitable connection technique. Alternatively, a direct connection of the metal card body and the ground pin of the chip module could be considered.

It is also possible to use a capacitor e.g. 100 nF instead of a suppressor diode. These ESD protection devices are very standard, and readily available. These devices are intended to clamp all voltages above a certain voltage level. An anti-ESC patch (foam) may also be used, such as a milled/punched ESD plastic See http://www.murtfeldt.de/produkte/kunststoffe/

Power Transfer

An important issue when dealing with passive RFID transponders is power transfer or delivery from the external reader to the RFID chip. A small gap between tracks (spaces between traces) for the planar antenna (PA) may be beneficial, and may best be achieved with laser etching (versus chemical etching). With laser etching, gaps of 25 μm or less (with subsequent plating) may be achieved. Track width may also have an effect on power transfer, a narrower track width may provide for better power transfer. (This may be because with narrower tracks, you can fit more tracks in a given area and with a given spacing.) Again, laser etching may provide an advantage over chemical etching, and track widths of less than 100 μm, including less than 75 μm, less then 50 μm and approximately 25 μm may be achieved with laser etching. (Chemical etching may be limited to track widths greater than 100 μm and spacing greater than 100 μm.)

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), and claims, based on the disclosure(s) set forth herein.

The invention claimed is:

1. A capacitive coupling enhanced (CCE) transponder chip module (TCM) comprising:
a module tape (MT);
an area for mounting an RFID chip (IC) on the module tape (MT); and
a module antenna (MA, PA) disposed on the module tape (MT);
characterized by:
a conductive coupling frame (CF) disposed on the module tape (MT) having an opening (OP) defined by an inner edge (IE), an outer edge (OE) and a discontinuity comprising a slit (S) or a non-conductive stripe (NCS) extending from the opening (OP) to the outer edge (OE);
wherein the opening (OP) is disposed surrounding and closely adjacent to the module antenna (MA);
wherein: the coupling frame (CF) is formed from a conductive layer (CL) on the module tape (MT) which is one of the (i) conductive layer used to form contact pads (CP) on the face-up side of the module tape (MT) and (ii) the conductive layer used to form the module antenna on the face-down side of the module tape (MT).

2. The capacitive coupling enhanced (CCE) transponder chip module (TCM) of claim 1, wherein:
the coupling frame (CF) is disposed on the same side of the module tape (MT) as the module antenna (MA, PA).

3. The capacitive coupling enhanced (CCE) transponder chip module (TCM) of claim 1, wherein:
the coupling frame (CF) is disposed on an opposite side of the module tape (MT) from the module antenna (MA, PA).

4. The capacitive coupling enhanced (CCE) transponder chip module (TCM) of claim 1, wherein:
the coupling frame (CF) comprises wire (EW) embedded in the module tape (MT).

5. The capacitive coupling enhanced (CCE) transponder chip module (TCM) of claim 1, wherein:
the module antenna (MA) comprises an etched planar antenna (PA) having a number of tracks (traces) separated by spaces;
wherein:
a track width is less than 100 μm; and
a spacing between adjacent tracks is less than 75 μm.

6. The capacitive coupling enhanced (CCE) transponder chip module (TCM) of claim 1, wherein:
the module antenna (MA) comprises two antenna structures (PA-1, PA-2).

7. The capacitive coupling enhanced (CCE) transponder chip module (TCM) of claim 1, further comprising:
a capacitor (CAP) connected with the module antenna (MA).

8. The capacitive coupling enhanced (CCE) transponder chip module (TCM) of claim 1, wherein:
there are two coupling frames (CF-1, CF-2), one disposed on a face-up side of the module tape (MT) the other disposed on a face-down side of the module tape (MT).

9. The capacitive coupling enhanced (CCE) transponder chip module (TCM) of claim 1, wherein:
the coupling frame (CF) is disposed around the module antenna (MA) with its opening (OP) surrounding the module antenna (MA) and closely adjacent thereto.

10. The capacitive coupling enhanced (CCE) transponder chip module (TCM) of claim 1, wherein:
the coupling frame (CF) overlaps at least a portion of the module antenna (MA).

11. The capacitive coupling enhanced (CCE) transponder chip module (TCM) of claim 1, wherein:
the coupling frame (CF) extends a few millimeters beyond the module antenna (MA) on one side thereof, and extends a few centimeters beyond the module antenna (MA) on an opposite side thereof.

12. The capacitive coupling enhanced (CCE) transponder chip module (TCM) of claim 1, wherein:

the coupling frame (CF) has a geometry defined by a shape of its outer edge (OE) which is different than a geometry of the transponder chip module (TCM).

13. The capacitive coupling enhanced (CCE) transponder chip module (TCM) of claim 1, further comprising:
a plating line (PL) extending from outside of the coupling frame (CF), through the slit (S) in the coupling frame (CF) to the module antenna (MA).

14. The capacitive coupling enhanced (CCE) transponder chip module (TCM) of claim 1, further comprising:
conductive traces (CT) extending between at least some contact pads (CP) and connection bridges (CBR) of the contact pad array (CPA).

15. A capacitive coupling enhanced transponder chip module (CCE-TCM, 400) comprising:
a module tape (MT);
an RFID chip (IC) disposed on the module tape (MT);
an etched module antenna (MA) disposed on the module tape (MT); and
a coupling frame (CF) disposed on the module tape (MT), closely adjacent to the module antenna (MA), having an opening (OP) aligned with the module antenna (MA) and a slit (S) extending from the opening (OP) to an outer edge (OE) of the coupling frame (CF) so that the coupling frame (CF) is an open loop;
wherein: the coupling frame (CF) is formed from a conductive layer (CL) on the module tape (MT) which is one of the (i) conductive layer used to form contact pads (CP) on the face-up side of the module tape (MT) and (ii) the conductive layer used to form the module antenna on the face-down side of the module tape (MT).

16. The capacitive coupling enhanced transponder chip module (CCE-TCM) of claim 15, further comprising:
contact pads (CP) so that the capacitive coupling enhanced transponder chip module (CCE-TCM) can function with dual interfaces (contactless and contact).

* * * * *